(12) United States Patent
Yamazaki et al.

(10) Patent No.: US 11,404,107 B2
(45) Date of Patent: Aug. 2, 2022

(54) MEMORY DEVICE AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Kiyoshi Kato, Kanagawa (JP); Takahiko Ishizu, Kanagawa (JP); Tatsuya Onuki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 77 days.

(21) Appl. No.: 17/041,037

(22) PCT Filed: Mar. 20, 2019

(86) PCT No.: PCT/IB2019/052244
§ 371 (c)(1),
(2) Date: Sep. 24, 2020

(87) PCT Pub. No.: WO2019/186323
PCT Pub. Date: Oct. 3, 2019

(65) Prior Publication Data
US 2021/0027828 A1  Jan. 28, 2021

(30) Foreign Application Priority Data

Mar. 29, 2018 (JP) .............................. JP2018-065571
Sep. 10, 2018 (JP) .............................. JP2018-169247

(51) Int. Cl.
*G11C 5/06* (2006.01)
*G11C 11/408* (2006.01)
(Continued)

(52) U.S. Cl.
CPC ...... *G11C 11/4085* (2013.01); *H01L 27/1052* (2013.01); *H01L 27/124* (2013.01);
(Continued)

(58) Field of Classification Search
CPC ............. G11C 11/4085; H01L 27/1052; H01L 27/1207; H01L 27/1225; H01L 27/124;
(Continued)

(56) References Cited

U.S. PATENT DOCUMENTS

| 6,335,893 B1 | 1/2002 | Tanaka et al. |
| 6,535,435 B2 | 3/2003 | Tanaka et al. |

(Continued)

FOREIGN PATENT DOCUMENTS

| CN | 1989539 A | * | 6/2007 | ............. G09G 3/325 |
| CN | 101388243 A | | 3/2009 | |

(Continued)

OTHER PUBLICATIONS

International Search Report (Application No. PCT/IB2019/052244) dated Jun. 25, 2019.
(Continued)

*Primary Examiner* — Viet Q Nguyen
(74) *Attorney, Agent, or Firm* — Fish & Richardson P.C.

(57) ABSTRACT

A memory device having long data retention time and high reliability is provided. The memory device includes a driver circuit and a plurality of memory cells, the memory cell includes a transistor and a capacitor, and the transistor includes a metal oxide in a channel formation region. The transistor includes a first gate and a second gate, and in a period during which the memory cell retains data, negative potentials are applied to the first gate and the second gate of the transistor.

13 Claims, 37 Drawing Sheets

(51) Int. Cl.
*H01L 27/105* (2006.01)
*H01L 27/12* (2006.01)
*H01L 29/24* (2006.01)
*H01L 29/786* (2006.01)

(52) U.S. Cl.
CPC ...... *H01L 27/1207* (2013.01); *H01L 27/1225* (2013.01); *H01L 27/1255* (2013.01); *H01L 29/24* (2013.01); *H01L 29/7869* (2013.01); *H01L 29/78648* (2013.01)

(58) Field of Classification Search
CPC ............... H01L 27/1255; H01L 29/24; H01L 29/78648; H01L 29/7869
USPC ........................................................ 365/149
See application file for complete search history.

(56) References Cited

U.S. PATENT DOCUMENTS

| | | | |
|---|---|---|---|
| 7,313,044 B2* | 12/2007 | Fuhrmann | G11C 11/4074 365/226 |
| 7,852,704 B2 | 12/2010 | Takahashi et al. | |
| 8,508,967 B2 | 8/2013 | Yamazaki et al. | |
| 9,054,696 B2* | 6/2015 | Kuo | H03K 17/063 |
| 9,589,611 B2* | 3/2017 | Ishizu | H01L 29/78696 |
| 9,601,429 B2* | 3/2017 | Matsuzaki | H01L 29/7869 |
| 10,032,492 B2 | 7/2018 | Onuki | |
| 10,657,899 B2* | 5/2020 | Zeng | G09G 3/3258 |
| 11,152,366 B2* | 10/2021 | Yamazaki | H01L 27/1255 |
| 11,211,500 B2* | 12/2021 | Yamazaki | H01L 29/66969 |
| 2002/0041531 A1 | 4/2002 | Tanaka et al. | |
| 2009/0073744 A1 | 3/2009 | Takahashi et al. | |
| 2017/0270977 A1 | 9/2017 | Onuki | |
| 2020/0343245 A1* | 10/2020 | Yamazaki | H01L 27/1052 |
| 2021/0125988 A1* | 4/2021 | Yamazaki | H01L 27/1255 |

FOREIGN PATENT DOCUMENTS

| | | | |
|---|---|---|---|
| JP | 2006301250 A | * | 11/2006 |
| JP | 2006-351173 A | | 12/2006 |
| JP | 2009-070480 A | | 4/2009 |
| JP | 2012-256820 A | | 12/2012 |
| JP | 2017-182867 A | | 10/2017 |
| KR | 10-0565941 | | 3/2006 |
| WO | WO-1998/058382 | | 12/1998 |

OTHER PUBLICATIONS

Written Opinion (Application No. PCT/IB2019/052244) dated Jun. 25, 2019.

Onuki.T et al., "DRAM with Storage Capacitance of 3.9 fF using CAAC-OS Transistor with L of 60 nm and having More Than 1-h Retention Characteristics", SSDM 2014 (Extended Abstracts of the 2014 International Conference on Solid State Devices and Materials), Sep. 8, 2014, pp. 430-431.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, July 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

54

55

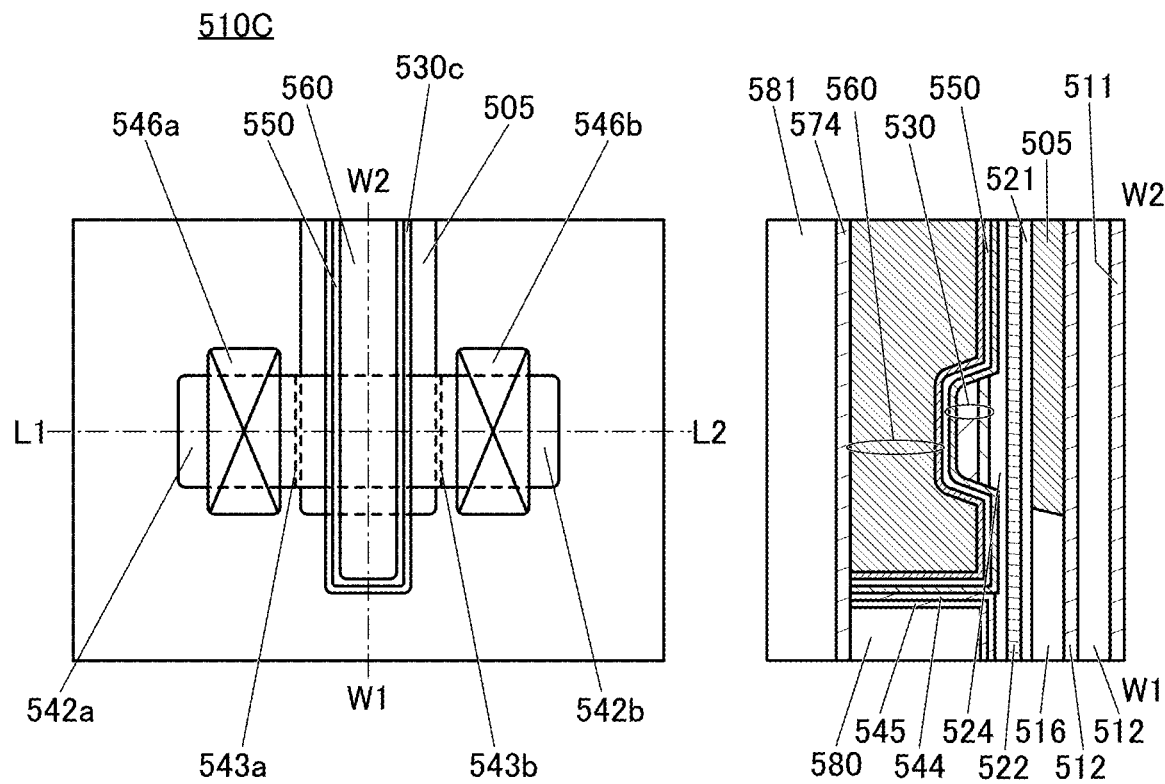
FIG. 16A
FIG. 16C
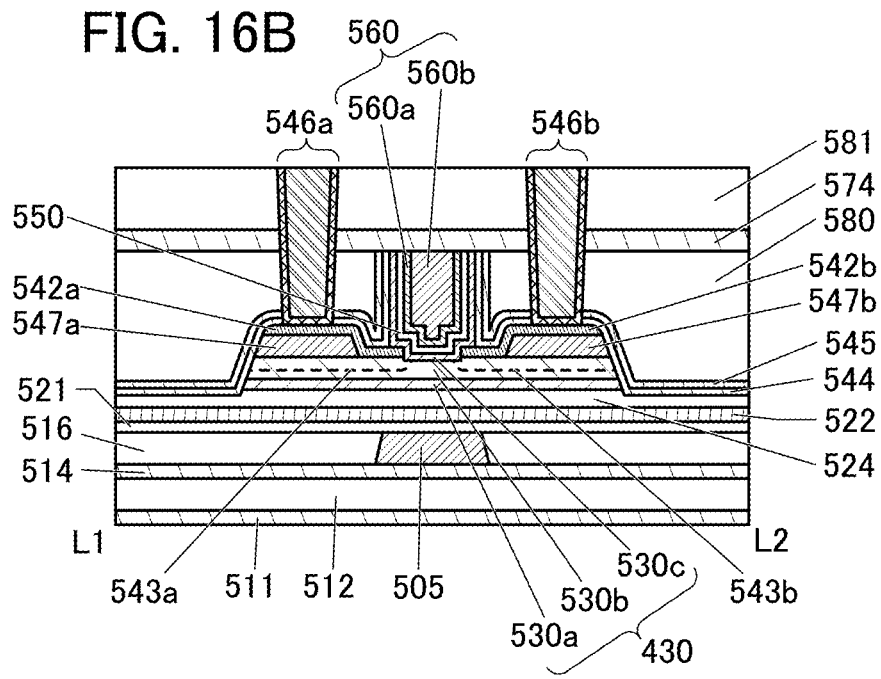
FIG. 16B

FIG. 23A
5500
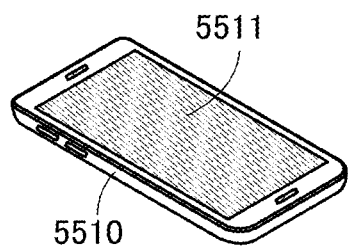
FIG. 23B
5300
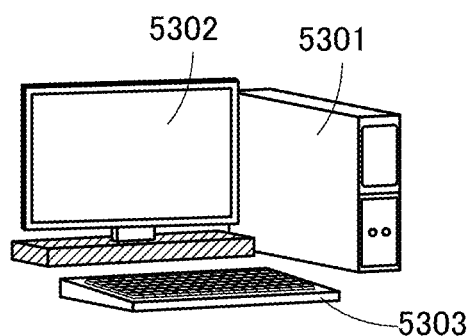
FIG. 23C
5800
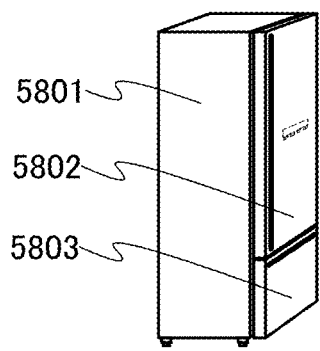
FIG. 23D
5200
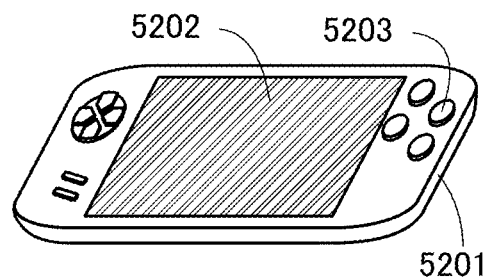
FIG. 23E1
5700
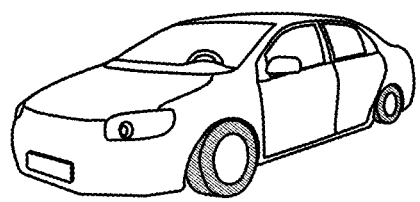
FIG. 23E2
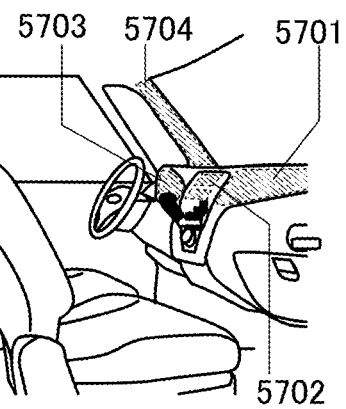

FIG. 30A
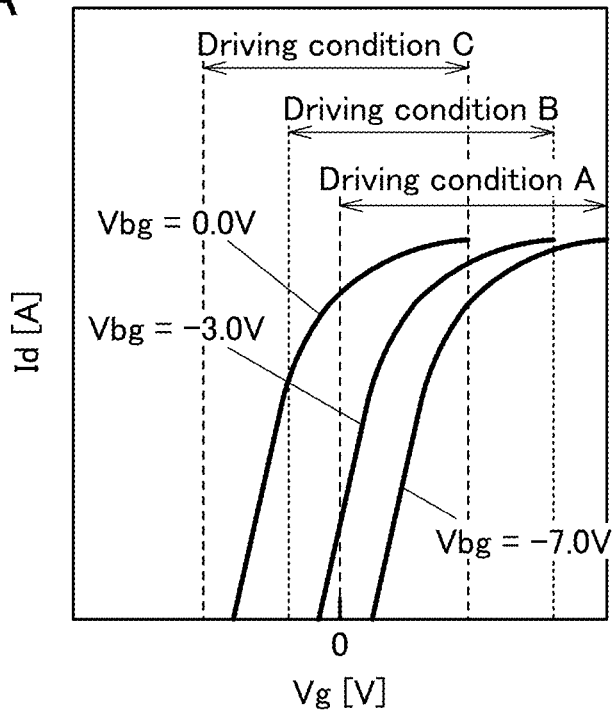
FIG. 30B
| | VDDH (WL_H) | VSSL (WL_L) | BG |
|---|---|---|---|
| Driving condition A | 3.3V | 0.0V | −7.0V |
| Driving condition B | 2.5V | −0.8V | −3.0V |
| Driving condition C | 1.8V | −1.5V | 0.0V |
FIG. 30C
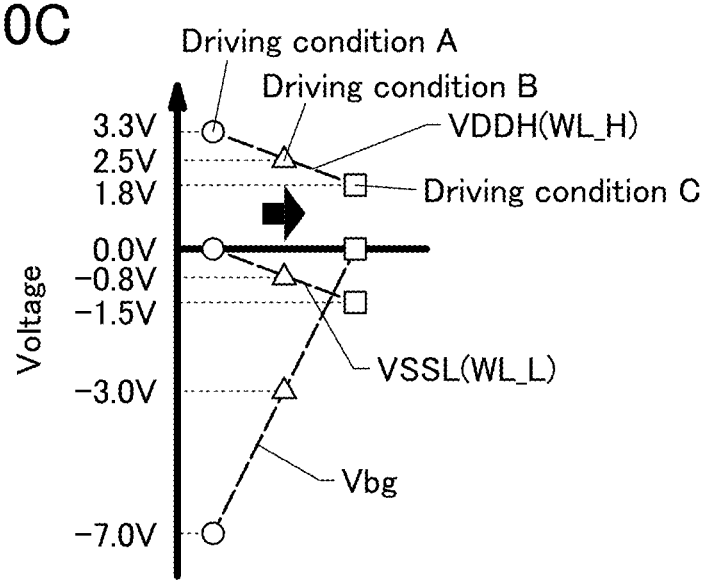

| Retention time [s] | Yield [%] | | |
|---|---|---|---|
| | Driving condition A | Driving condition B | Driving condition C |
| 1 | 100 | 100 | 100 |
| 10 | 99.82 | 99.88 | 99.90 |
| 100 | 99.59 | 99.78 | 99.81 |
| 1000 | 98.91 | 99.67 | 99.49 |
| 3600 | 97.88 | 99.57 | 99.02 | data retention at 85 °C
VDDH/VSSL=1.8V/-1.5V, Vbg=0V
write → hold → read

FIG. 34A

Operation verification conditions for ring oscillators

|  | Negative potential generation circuit 811 | Negative potential generation circuit 821 |
|---|---|---|
| VDD | 1.2V | 1.2V |
| # of INV.s | 5 | 5 |
| Operation frequency | 59.6MHz | 59.6MHz |

FIG. 34B

Operation verification conditions for charge pumps

|  | Negative potential generation circuit 811 | Negative potential generation circuit 821 |
|---|---|---|
| VDD | 1.2V | 1.2V |
| # of stages | 6 | 6 |
| minimum output vol. | approx. −5V | approx. −5V |
| load current | 8μA (Ave.) | less than 1pA |

Vref=1.18V,VDD=1.2V,VSS=0.0V

FIG. 36A

| | VDDH | VSSL | Vbg | Active Power | Standby Power |
|---|---|---|---|---|---|
| Driving condition B | 2.5V | −0.8V | −3.0V | 4.83 mW (Memory)<br>31.2 μW (Neg. bias)<br>4.86 mW (Total) | 120 pW (Memory)<br>240.1 nW (Neg. bias)<br>240.2 nW (Total) |
| Driving condition C | 1.8V | −1.5V | 0.0V | 4.83 mW (Memory)<br>132 μW (Neg. bias)<br>4.96 mW (Total) | 120 pW (Memory)<br>120.08 nW (Neg. bias)<br>120.2 nW (Total) |

FIG. 36B

| Negative potential generation circuit 811 | | Active power | Sleep power | Active time | Sleep time | Average Power |
|---|---|---|---|---|---|---|
| Driving condition B | Ring oscillator | 14.4 μW | 36.8 pW | 2.48 μs | 28.4 s | 84.0 pW |
| | Charge pump | 526 μW | | | | |
| | Comparator | 120 nW | 120 nW | operated all the time | | 120 nW |

FIG. 36C

| Density | Memory cells per WL | Area A (Memory) | Area B (Neg. Bias) | ratio A/(A+B) |
|---|---|---|---|---|
| 1Mbit | 128 | 697350 μm² | 1464 μm² | 0.209 % |

MEMORY DEVICE AND ELECTRONIC DEVICE

CROSS REFERENCE TO RELATED APPLICATIONS

This application is a U.S. National Phase Application under 35 U.S.C. § 371 of International Application PCT/IB2019/052244, filed on Mar. 20, 2019, which is incorporated by reference and claims the benefit of foreign priority applications filed in Japan on Mar. 29, 2018, as Application No. 2018-065571 and on Sep. 10, 2018, as Application No. 2018-169247.

TECHNICAL FIELD

One embodiment of the present invention relates to a memory device. In particular, one embodiment of the present invention relates to a memory device that can function by utilizing semiconductor characteristics.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter.

BACKGROUND ART

A DRAM (Dynamic Random Access Memory) is widely used as a memory device (also referred to as a memory) incorporated in various kinds of electronic devices. Some examples have been proposed in which a transistor using an oxide semiconductor (also referred to as an oxide semiconductor transistor or an OS transistor) is used in a memory cell of a DRAM (e.g., Patent Document 1 and Non-Patent Document 1).

Since the leakage current of an oxide semiconductor transistor in an off state (off-state current) is extremely low, the use of an oxide semiconductor transistor in a memory cell of a DRAM enables manufacture of a memory with low refresh frequency and low power consumption.

In this specification and the like, a DRAM in which an oxide semiconductor transistor is used for a memory cell is referred to as an "oxide semiconductor DRAM" or a "DOSRAM (registered trademark, Dynamic Oxide Semiconductor Random Access Memory)".

An oxide semiconductor has attracted attention in recent years also as a semiconductor which can be applied to a transistor. Not only single-component metal oxides, such as indium oxide and zinc oxide, but also multi-component metal oxides are known as oxide semiconductors, for example. Among the multi-component metal oxides, in particular, an In—Ga—Zn oxide (also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Document 2 to Non-Patent Document 4).

In Non-Patent Document 2 and Non-Patent Document 3, a technique for forming a transistor using an oxide semiconductor having a CAAC structure is disclosed. Moreover, Non-Patent Document 5 and Non-Patent Document 6 show that a fine crystal is included even in an oxide semiconductor which has lower crystallinity than the CAAC structure and the nc structure.

Non-Patent Document 7 reports the extremely low off-state current of a transistor using an oxide semiconductor, and Non-Patent Document 8 and Non-Patent Document 9 report an LSI and a display which utilize such a property of extremely low off-state current.

REFERENCE

Patent Document

[Patent Document 1] Japanese Published Patent Application No. 2012-256820

Non-Patent Documents

[Non-Patent Document 1] T. Onuki et al., "DRAM with Storage Capacitance of 3.9 fF using CAAC-OS Transistor with L of 60 nm and having More Than 1-h Retention Characteristics", Ext. Abstr. SSDM, 2014, pp. 430-431.

[Non-Patent Document 2] S. Yamazaki et al., "SID Symposium Digest of Technical Papers", 2012, volume 43, issue 1, pp. 183-186.

[Non-Patent Document 3] S. Yamazaki et al., "Japanese Journal of Applied Physics", 2014, volume 53, Number 4S, pp. 04ED18-1-04ED18-10.

[Non-Patent Document 4] S. Ito et al., "The Proceedings of AM-FPD'13 Digest of Technical Papers", 2013, pp. 151-154.

[Non-Patent Document 5] S. Yamazaki et al., "ECS Journal of Solid State Science and Technology", 2014, volume 3, issue 9, pp. Q3012-Q3022.

[Non-Patent Document 6] S. Yamazaki, "ECS Transactions", 2014, volume 64, issue 10, pp. 155-164.

[Non-Patent Document 7] K. Kato et al., "Japanese Journal of Applied Physics", 2012, volume 51, pp. 021201-1-021201-7.

[Non-Patent Document 8] S. Matsuda et al., "2015 Symposium on VLSI Technology Digest of Technical Papers", 2015, pp. T216-T217.

[Non-Patent Document 9] S. Amano et al., "SID Symposium Digest of Technical Papers", 2010, volume 41, issue 1, pp. 626-629.

SUMMARY OF THE INVENTION

Problems to be Solved by the Invention

In the OS transistor, by application of a negative potential to a back gate, the threshold voltage positively shifts, and current Ids that flows between a source and a drain when a voltage Vgs of a gate with respect to the source is 0 V (also referred to as cutoff current) can be reduced. In other words, data retention time of a DRAM in which an OS transistor is used in a memory cell (DOSRAM) can be made long.

However, in order that a potential applied to a back gate of a transistor has an influence on the electrical characteristics of the transistor, the potential has been needed to be a relatively high in some cases. In addition, when the potential applied to the back gate of the transistor is made higher, the reliability of the transistor has been lowered in some cases.

An object of one embodiment of the present invention is to provide a memory device having long data retention time and high reliability. Another object of one embodiment of the present invention is to provide a novel memory device.

Another object of one embodiment of the present invention is to provide an electronic device including a novel memory device.

Note that one embodiment of the present invention does not necessarily achieve all the above objects and only needs to achieve at least one of the objects. The descriptions of the above objects do not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is a memory device including a driver circuit and a plurality of memory cells. The memory cell includes a transistor and a capacitor, one of a source and a drain of the transistor is electrically connected to one electrode of the capacitor, and the transistor includes a metal oxide in a channel formation region. The transistor includes a first gate and a second gate, and the first gate and the second gate have a region where they overlap each other with the channel formation region therebetween. The driver circuit has a function of driving the first gate, and in a period during which the memory cell retains data, the driver circuit outputs a first potential lower than a potential applied to the source and the drain of the transistor, to the first gate, and a second potential lower than the potential applied to the source and the drain of the transistor is applied to the second gate.

In the above embodiment, the second potential is lower than the first potential.

Another embodiment of the present invention is a memory device including a driver circuit and a plurality of memory cells. The memory cell includes a transistor and a capacitor, one of a source and a drain of the transistor is electrically connected to one electrode of the capacitor, and the transistor includes a metal oxide in a channel formation region. The transistor includes a first gate and a second gate, and the first gate and the second gate have a region where they overlap each other with the channel formation region therebetween. The driver circuit has a function of driving the first gate and the second gate, and in a period during which the memory cell retains data, the driver circuit outputs a first potential lower than a potential applied to the source and the drain of the transistor, to the first gate, and in the period during which the memory cell retains data, the driver circuit outputs a second potential lower than the potential applied to the source and the drain of the transistor, to the second gate.

In the above embodiment, the metal oxide contains at least one or both of In (indium) and Zn (zinc).

In the above embodiment, the metal oxide contains Ga (gallium).

Another embodiment of the present invention is an electronic device including the memory device described in the above embodiment.

Effect of the Invention

One embodiment of the present invention can provide a memory device having long data retention time and high reliability. One embodiment of the present invention can provide a novel memory device. One embodiment of the present invention can provide an electronic device including a novel memory device.

Note that the descriptions of the effects do not disturb the existence of other effects. One embodiment of the present invention does not necessarily have all the effects. Effects other than these will be apparent from and can be derived from the descriptions of the specification, the claims, the drawings, and the like.

BRIEF DESCRIPTION OF THE DRAWINGS

FIG. 16 (A) A top view illustrating a structure example of a transistor, (B), (C) cross-sectional views illustrating the structure example of the transistor.

FIG. 23 (A), (B), (C), (D), (E1), (E2) Diagrams illustrating structure examples of electronic devices.

FIG. 30 (A) A diagram showing Id-Vg characteristics of a CAAC-IGZO FET, and (B), (C) diagrams showing operation voltages.

FIG. 34 (A) A diagram showing operation conditions of ring oscillators, and (B) a diagram showing operation conditions of charge pumps.

FIG. 36(A), (B), (C) Estimation results of the power consumption and the occupation area of a 1 Mb DOSRAM.

MODE FOR CARRYING OUT THE INVENTION

Figure 1:
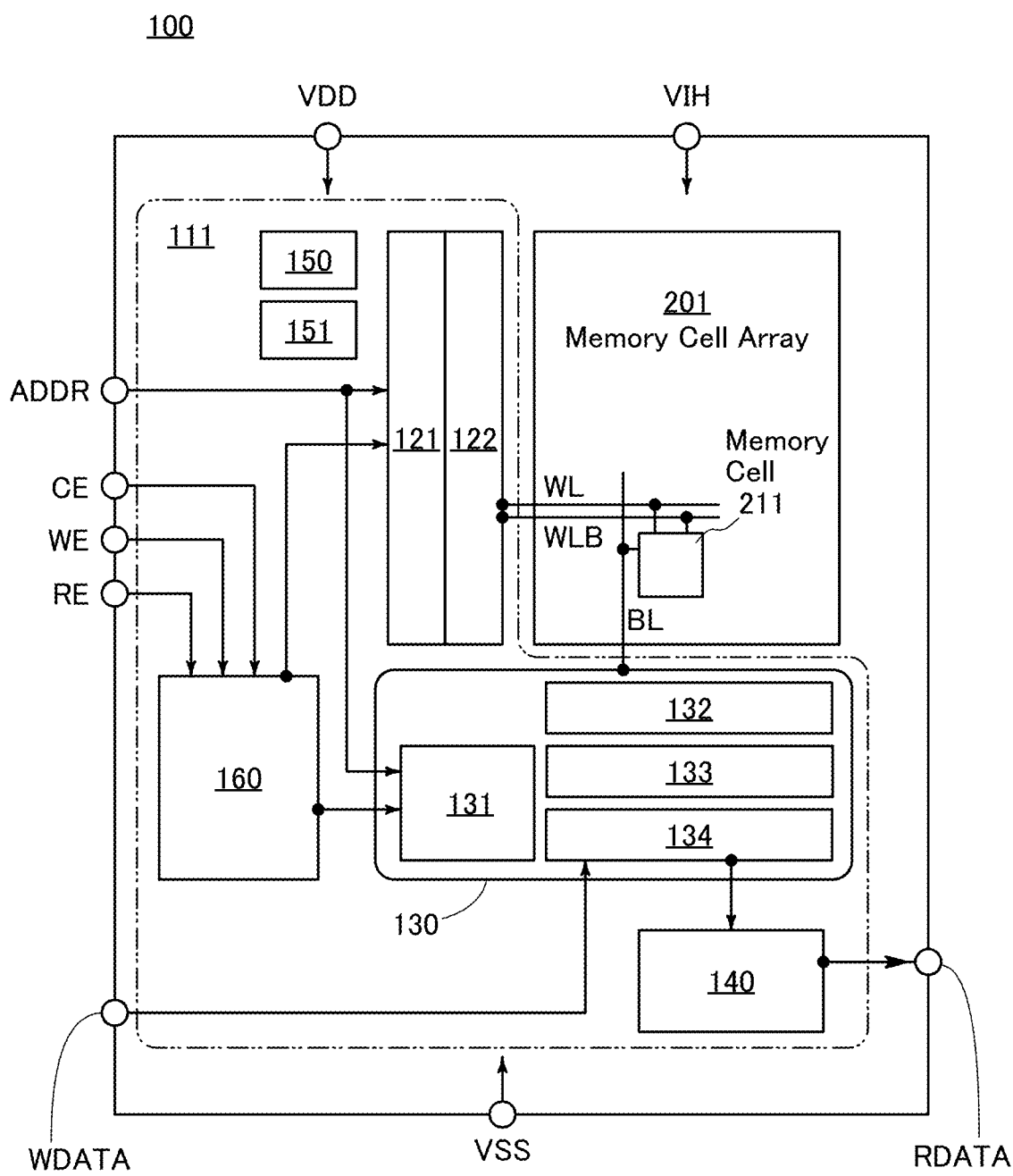
FIG. 1 A block diagram illustrating a structure example of a memory.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be construed as being limited to the description in the embodiments given below.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, the size, the layer thickness, or the region is not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be switched when a transistor of opposite polarity is employed or a direction of current flow is changed in circuit operation, for example. Thus, the terms of source and drain are interchangeable for use in this specification and the like.

Unless otherwise specified, off-state current in this specification and the like refers to a drain current of a transistor in an off state (also referred to as a non-conducting state or a cutoff state). Unless otherwise specified, the off state of an n-channel transistor refers to a state where voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when the transistor is in an off state. In addition, leakage current sometimes expresses the same meaning as off-state current. In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a memory device according to one embodiment of the present invention will be described. The memory device according to one embodiment of the present invention is a memory device that can function by utilizing semiconductor characteristics, and is also called a memory.

<Structure Example of Memory>

FIG. 1 is a block diagram illustrating a structure example of a memory 100 according to one embodiment of the present invention. The memory 100 includes a peripheral circuit 111 and a memory cell array 201 (denoted by "Memory Cell Array" in FIG. 1). The peripheral circuit 111 includes a row decoder 121, a word line driver circuit 122, a bit line driver circuit 130, an output circuit 140, a negative potential generation circuit 150, a negative potential generation circuit 151, and a control logic circuit 160. Note that in the drawings described in this specification and the like, the flow of main signals is indicated by an arrow or a line, and a power supply line and the like are omitted in some cases.

The bit line driver circuit 130 includes a column decoder 131, a precharge circuit 132, a sense amplifier 133, and an input/output circuit 134. The precharge circuit 132 has a function of precharging a wiring BL. The sense amplifier 133 has a function of amplifying a data signal read from the wiring BL, and the input/output circuit 134 has a function of writing a data signal to the wiring BL and outputting a data signal read from the wiring BL to the output circuit 140. Note that the details of the column decoder 131, the precharge circuit 132, the sense amplifier 133, and the like will be described in Embodiment 2.

The wiring BL, a wiring WL, and a wiring WLB are wirings connected to a memory cell 211 (denoted by "Memory Cell" in FIG. 1) included in the memory cell array 201; and the details will be described later. The amplified data signal is output to the outside of the memory 100 as a digital data signal RDATA via the output circuit 140.

As power from the outside, a low power supply potential VSS, a high power supply potential VDD for the peripheral circuit 111, and a high power supply potential VIH for the memory cell array 201 are supplied to the memory 100. Here, the high power supply potential VDD is a potential higher than the low power supply potential VSS. For example, the high power supply potential VIH can be a potential higher than the high power supply potential VDD or the same potential as the high power supply potential VDD.

From the power supplied from the outside, the negative potential generation circuit 150 generates a low power supply potential VLL, and the negative potential generation circuit 151 generates a low power supply potential VBL. The low power supply potential VLL and the low power supply potential VBL are potentials lower than the low power supply potential VSS. Note that the memory 100 may have a structure in which the negative potential generation circuit 150 and the negative potential generation circuit 151 are not included, and the low power supply potential VLL and the low power supply potential VBL may be supplied from the outside of the memory 100.

Control signals (CE, WE, and RE), an address signal ADDR, and a data signal WDATA are input to the memory 100 from the outside. The address signal ADDR is input to the row decoder 121 and the column decoder 131, and WDATA is input to the input/output circuit 134.

The control logic circuit 160 processes the signals (CE, WE, and RE) input from the outside, and generates control signals for the row decoder 121 and the column decoder 131. CE denotes a chip enable signal, WE denotes a write enable signal, and RE denotes a read enable signal. Signals processed by the control logic circuit 160 are not limited to the above, and other control signals may be input as necessary.

In the memory 100, each circuit, each signal, and each potential described above can be appropriately selected as needed. Alternatively, another circuit, another signal, or another potential may be added.

Here, an OS transistor can be used as a transistor included in the memory cell 211. Since the OS transistor has an extremely low off-state current, data written to the memory cell 211 can be retained for a long time. Thus, the refresh frequency of the memory cell 211 can be low, and the memory 100 can be a memory with low power consumption. Note that the details of an OS transistor will be described in Embodiment 3 and Embodiment 4.

Furthermore, the OS transistor is a thin film transistor and can be stacked over a semiconductor substrate to be provided. For example, a Si transistor formed on a single crystal silicon substrate can be used as a transistor included in the peripheral circuit 111. The peripheral circuit 111 using a Si transistor can operate at high speed. The memory cell 211 using the OS transistor can be stacked above the peripheral circuit 111 to be provided.

Figure 2A:
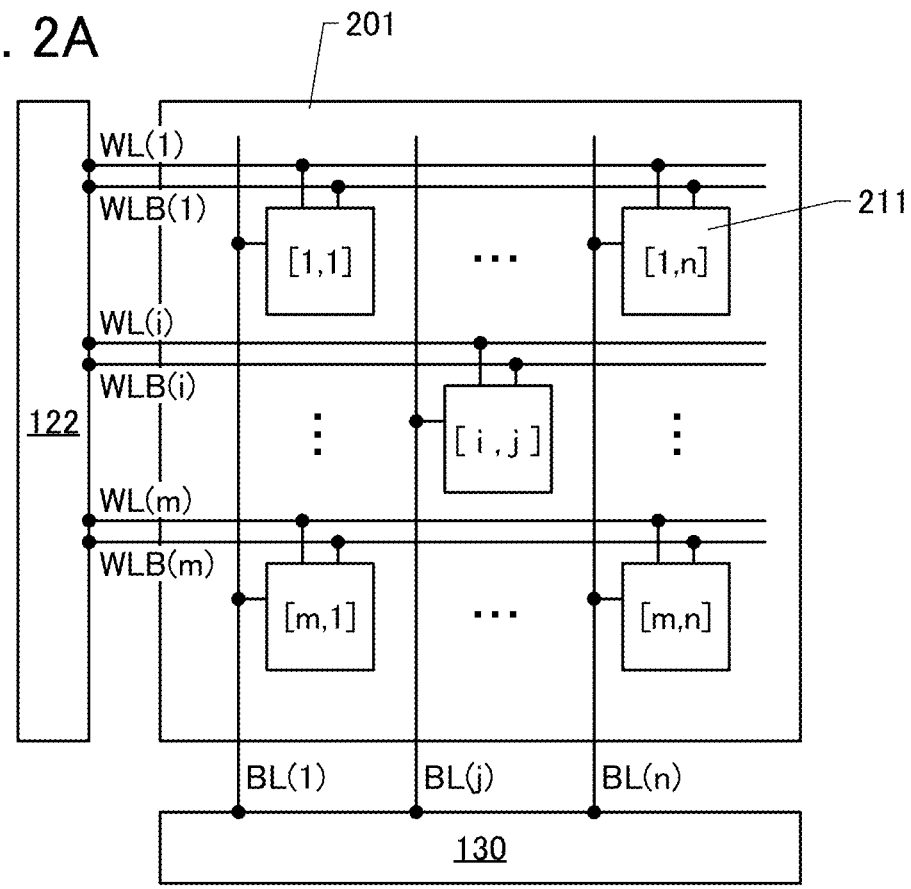
FIG. 2 (A) A diagram illustrating a memory cell array, (B) a circuit diagram illustrating a structure example of a memory cell.

FIG. 2(A) illustrates the details of the memory cell array 201. The memory cell array 201 includes m×n memory cells 211 in total; m memory cells (m is an integer greater than or equal to 1) in a column and n memory cells (n is an integer greater than or equal to 1) in a row, and the memory cells 211 are arranged in a matrix. The addresses of the memory cells 211 are also illustrated in FIG. 2(A), and [1, 1], [m, 1], [i, j], [1, n], and [m, n] (i is an integer greater than or equal to 1 and less than or equal to m, and j is an integer greater than or equal to 1 and less than or equal to n) are the addresses of the memory cells 211.

Each of the memory cells 211 is connected to the wiring BL, the wiring WL, and the wiring WLB. The memory cell array 201 includes n wirings BL (BL(1) to BL(n)), m wirings WL (WL(1) to WL(m)), and m wirings WLB (WLB(1) to WLB(m)). As illustrated in FIG. 2(A), the memory cell 211 whose address is [i,j] is electrically connected to the word line driver circuit 122 through the wiring WL(i) and the wiring WLB(i) and is electrically connected to the bit line driver circuit 130 through the wiring BL(j).

<Structure Example of Memory Cell>

Figure 2B:
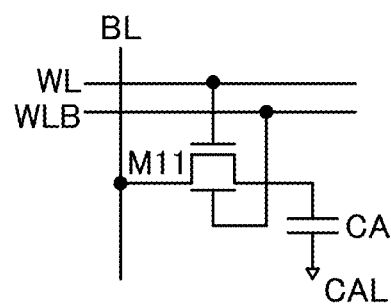

FIG. 2(B) is a circuit diagram illustrating a structure example of the memory cell 211.

The memory cell 211 includes a transistor M11 and a capacitor CA. Note that the transistor M11 includes a front gate (simply referred to as a gate in some cases) and a back gate.

One of a source and a drain of the transistor M11 is electrically connected to a first terminal of the capacitor CA, and the other of the source and the drain of the transistor M11 is connected to the wiring BL. The gate of the transistor M11 is connected to the wiring WL, and the back gate of the transistor M11 is connected to the wiring WLB. A second terminal of the capacitor CA is connected to a wiring CAL.

The wiring BL functions as a bit line, and the wiring WL functions as a word line. The wiring CAL functions as a wiring for applying a predetermined potential to the second terminal of the capacitor CA. The wiring WLB functions as a wiring for applying a potential to the back gate of the transistor M11. The threshold voltage of the transistor M11 can be increased or decreased by application of a given potential to the wiring WLB.

The transistor M11 has a function of a switch for controlling conduction or non-conduction between the first terminal of the capacitor CA and the wiring BL. To perform data writing or reading, a high-level potential is applied to the wiring WL so that the first terminal of the capacitor CA and the wiring BL are brought into a conduction state. In other words, the memory cell 211 is a memory that retains data by accumulating charges in the capacitor CA, and writing or reading of the data retained in the memory cell 211 is performed through the wiring BL and the transistor M11.

Note that a transistor containing a metal oxide in its channel formation region (OS transistor) can be used as the transistor M11. For example, in the channel formation region of the transistor M11, a metal oxide containing any one of an indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, a metal oxide formed of indium, gallium, and zinc is preferable.

Since the OS transistor has an extremely low off-state current, data written to the memory cell 211 can be retained for a long time when the OS transistor is used as the transistor M11. Thus, the refresh frequency of the memory cell 211 can be low, and the memory 100 can be a memory with low power consumption.

When the OS transistor is used as the transistor M11, the refresh operation of the memory cell 211 can be unnecessary. When the OS transistor is used as the transistor M11, the memory cell 211 can retain multilevel data or analog data.

When the OS transistor is used as the transistor M11, the above-described DOSRAM can be formed.

<Structure Example 2 of Memory Cell>

Figure 3A:
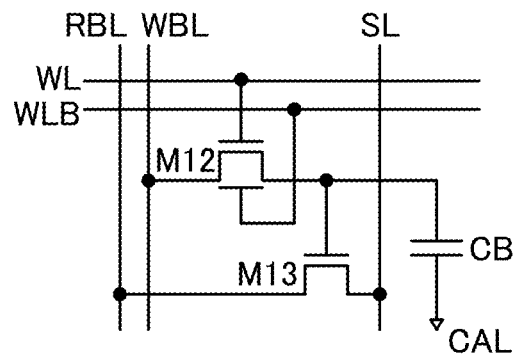
FIG. 3 (A), (B), (C) Circuit diagrams each illustrating a structure example of a memory cell.

Note that the memory cell 211 is not limited to the above structure. A memory cell 212 illustrated in FIG. 3(A) is another structure example of the memory cell 211.

The memory cell 212 includes a transistor M12, a transistor M13, and a capacitor CB. The transistor M12 includes a front gate and a back gate.

One of a source and a drain of the transistor M12 is electrically connected to a first terminal of the capacitor CB and a gate of the transistor M13, and the other of the source and the drain of the transistor M12 is connected to a wiring WBL. The gate of the transistor M12 is connected to the wiring WL, and the back gate of the transistor M12 is connected to the wiring WLB. A second terminal of the capacitor CB is connected to the wiring CAL. One of a source and a drain of the transistor M13 is connected to a wiring SL, and the other of the source and the drain of the transistor M13 is connected to a wiring RBL.

The wiring WBL functions as a write bit line, the wiring RBL functions as a read bit line, and the wiring WL functions as a word line. The wiring CAL functions as a wiring for applying a predetermined potential to the second terminal of the capacitor CB. The wiring WLB functions as a wiring for applying a potential to the back gate of the transistor M12. The threshold voltage of the transistor M12 can be increased or decreased by application of a given potential to the wiring WLB.

The transistor M12 has a function of a switch for controlling conduction or non-conduction between the first terminal of the capacitor CB and the wiring WBL.

To perform data writing, a high-level potential is applied to the wiring WL and the transistor M12 is brought into a conduction state so that the first terminal of the capacitor CB and the wiring WBL are electrically connected to each other. Specifically, a potential corresponding to data to be written is applied to the wiring WBL when the transistor M12 is in a conduction state, whereby the potential is written to the first terminal of the capacitor CB and the gate of the transistor M13. After that, a low-level potential is applied to the wiring WL so that the transistor M12 is brought into a non-conduction state, whereby the potential of the first terminal of the capacitor CB and the potential of the gate of the transistor M13 are retained.

Data reading is performed by application of a predetermined potential to the wiring SL. Current that flows between the source and the drain of the transistor M13 is determined by the potential of the gate of the transistor M13 and the potential of the one of the source and the drain of the transistor M13 (the wiring SL), and the potential of the other of the source and the drain of the transistor M13 is determined by the current. Thus, the potential retained at the first terminal of the capacitor CB (or the gate of the transistor M13) can be read by reading the potential of the wiring RBL connected to the other of the source and the drain of the transistor M13. In other words, data written to the memory cell 212 can be read by using the potential retained at the first terminal of the capacitor CB (or the gate of the transistor M13).

Note that a transistor containing a metal oxide in its channel formation region (OS transistor) can be used as the transistor M12. Since the OS transistor has an extremely low off-state current, data written to the memory cell 212 can be retained for a long time when the OS transistor is used as the transistor M12. There is no particular limitation on the transistor M13. For example, an OS transistor or a Si transistor may be used as the transistor M13.

The memory cell 212 is a gain-cell memory cell with two transistors and one capacitor. A gain-cell memory cell can operate as a memory by amplifying accumulated charges by the closest transistor even when the capacitance of the capacitor is small. When an OS transistor with an extremely low off-state current is used as the transistor M12, the memory cell 212 can retain accumulated charges even in a period during which power supply is stopped and thus can have a property of a non-volatile memory. In this specification and the like, a memory including a gain-cell memory cell using an OS transistor is called a "NOSRAM (Non-volatile Oxide Semiconductor Random Access Memory)". Since data rewriting in a NOSRAM is performed by charging and discharging of a capacitor, there is theoretically no limitation on rewrite cycles.

Figure 3B:
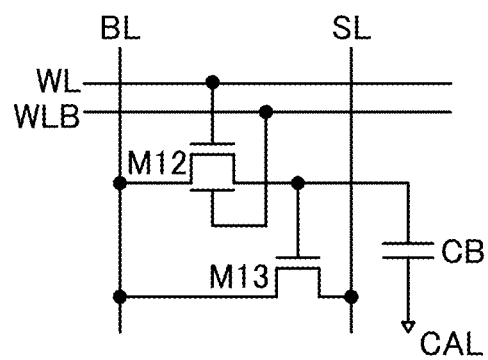

The memory cell 212 may have a structure in which the wiring WBL and the wiring RBL are combined into one wiring BL. FIG. 3(B) illustrates a structure example in which the wiring WBL and the wiring RBL are combined into one wiring BL.

In a memory cell 213 illustrated in FIG. 3(B), the other of the source and the drain of the transistor M12 and the other of the source and the drain of the transistor M13 are connected to the wiring BL. In other words, the memory cell 213 has a structure in which one wiring BL operates as a write bit line and a read bit line. In that case, the wiring SL is preferably brought into an electrically floating state (floating) when data is written.

<Structure Example 3 of Memory Cell>

Figure 3C:
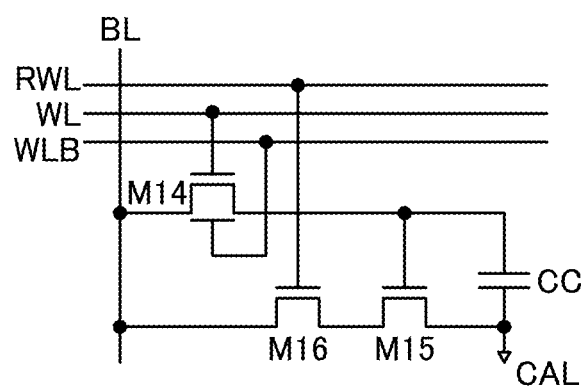

The memory cell 212 may be a gain-cell memory cell with three transistors and one capacitor. FIG. 3(C) illustrates a structure example in the case where the memory cell 212 is a gain-cell memory cell with three transistors and one capacitor.

A memory cell 214 illustrated in FIG. 3(C) includes a transistor M14 to a transistor M16 and a capacitor CC. The transistor M14 includes a front gate and a back gate.

One of a source and a drain of the transistor M14 is electrically connected to a first terminal of the capacitor CC and a gate of the transistor M15, and the other of the source and the drain of the transistor M14 is connected to the wiring BL. The gate of the transistor M14 is connected to the wiring WL, and the back gate of the transistor M14 is connected to the wiring WLB. A second terminal of the capacitor CC is electrically connected to the wiring CAL and one of a source and a drain of the transistor M15, and the other of the source and the drain of the transistor M15 is electrically connected to one of a source and a drain of the transistor M16. The other of the source and the drain of the transistor M16 is connected to the wiring BL, and a gate of the transistor M16 is connected to a wiring RWL.

The wiring BL functions as a bit line, the wiring WL functions as a write word line, and the wiring RWL functions as a read word line. The wiring CAL functions as a wiring for applying a predetermined potential to the second terminal of the capacitor CC (for example, a low-level potential is applied as a predetermined potential). The wiring WLB functions as a wiring for applying a potential to the back gate of the transistor M14. The threshold voltage of the transistor M14 can be increased or decreased by application of a given potential to the wiring WLB.

The transistor M14 has a function of a switch for controlling conduction or non-conduction between the first terminal of the capacitor CC and the wiring BL, and the transistor M16 has a function of a switch for controlling conduction or non-conduction between the other of the source and the drain of the transistor M15 and the wiring BL.

To perform data writing, a high-level potential is applied to the wiring WL and the transistor M14 is brought into a conduction state so that the first terminal of the capacitor CC and the wiring BL are electrically connected to each other. Specifically, a potential corresponding to data to be written is applied to the wiring BL when the transistor M14 is in a conduction state, whereby the potential is written to the first terminal of the capacitor CC and the gate of the transistor M15. After that, a low-level potential is applied to the wiring WL so that the transistor M14 is brought into a non-conduction state, whereby the potential of the first terminal of the capacitor CC and the potential of the gate of the transistor M15 are retained.

To perform data reading, a predetermined potential is applied (precharged) to the wiring BL, and then the wiring BL is brought into an electrically floating state (floating) and a high-level potential is applied to the wiring RWL. When a high-level potential is applied to the wiring RWL, the transistor M16 is brought into a conduction state and the other of the source and the drain of the transistor M15 and the wiring BL are in an electrical connection state. In that case, a voltage corresponding to a potential difference between the wiring BL and the wiring CAL is applied between the source and the drain of the transistor M15, and current that flows between the source and the drain of the transistor M15 is determined by the gate potential of the transistor M15 and the voltage applied between the source and the drain.

Here, the potential of the wiring BL changes depending on the current that flows between the source and the drain of the transistor M15; thus, a potential retained at the first terminal of the capacitor CC (or the gate of the transistor M15) can be read by reading the potential of the wiring BL. In other words, data written to the memory cell 214 can be read by using the potential retained at the first terminal of the capacitor CC (or the gate of the transistor M15).

Note that a transistor containing a metal oxide in its channel formation region (OS transistor) can be used as the transistor M14. Since the OS transistor has an extremely low off-state current, data written to the memory cell 214 can be retained for a long time when the OS transistor is used as the transistor M14. There is no particular limitation on the transistor M15 and the transistor M16. For example, OS transistors or Si transistors may be used as the transistor M15 and the transistor M16.

Although other structure examples of the memory cell 211 are described using FIG. 3(A) to FIG. 3(C), the structure example of the memory cell 211 is not limited thereto and the structure of the circuit can be changed as appropriate.

<Structure Example of Word Line Driver Circuit>

Figure 4A:
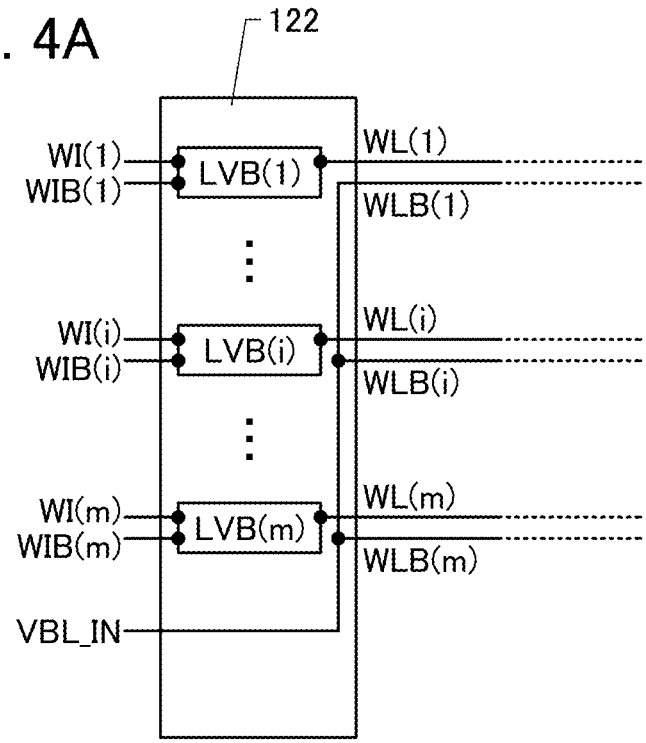
FIG. 4 (A) A block diagram illustrating a structure example of a word line driver circuit, (B) a circuit diagram illustrating a structure example of a circuit LVB.

FIG. 4(A) is a block diagram illustrating a structure example of the word line driver circuit 122.

The word line driver circuit 122 has a function of driving the wiring WL functioning as a word line. A signal WI and a signal WIB for driving the wiring WL and the wiring WLB are input to the word line driver circuit 122 from the row decoder 121. Here, the signal WI and the signal WIB are digital signals represented by a high level or a low level, and the signal WIB is an inverted signal whose logic is inverted from that of the signal WI.

Note that since the number of each of the wirings WL and the wirings WLB is m, the number of each of the signals WI and the signals WIB is also m. They are represented by WI(1) to WI(m) and WIB(1) to WIB(m) in FIG. 4(A).

Because the low power supply potential VSS and the high power supply potential VDD are supplied to the row decoder 121, a potential corresponding to a high level of each of the signal WI and the signal WIB is the high power supply potential VDD and a potential corresponding to a low level of each of the signal WI and the signal WIB is the low power supply potential VSS.

Meanwhile, in the memory cell array 201, the high power supply potential VIH is used as a potential corresponding to a high level of the wiring WL, and the low power supply potential VLL is used as a potential corresponding to a low level of the wiring WL. The low power supply potential VBL is supplied to the wiring WLB.

Thus, the word line driver circuit 122 has a function of adjusting a high level or a low level or a high level and a low level of an input signal (also referred to as level adjustment) and a function of adding the ability to drive the wiring WL (denoted by WL(1) to WL(m) in FIG. 4(A)) to an input signal (also referred to as buffering). The word line driver circuit 122 includes m circuits LVB, which are denoted by LVB(1) to LVB(m) in FIG. 4(A).

Furthermore, the low power supply potential VBL is input to the word line driver circuit 122 and output to the wiring WLB (denoted by WLB(1) to WLB(m) in FIG. 4(A)).

<Structure Example of Circuit LVB>

Figure 4B:
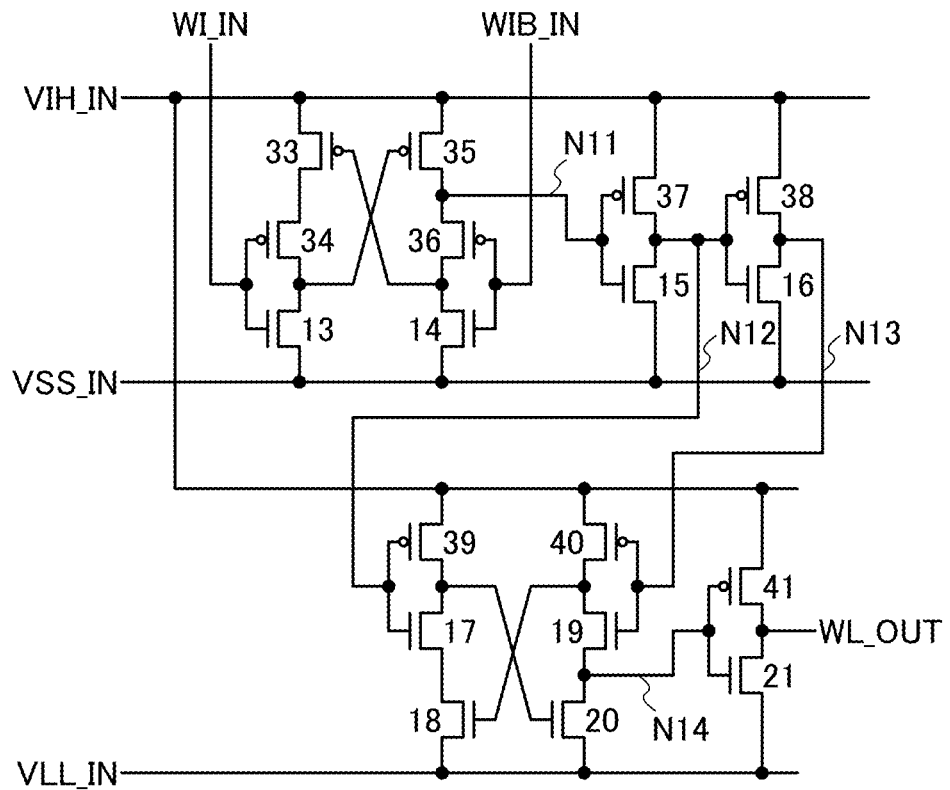

FIG. 4(B) is a circuit diagram illustrating a structure example of the circuit LVB.

The circuit LVB includes n-channel transistors 13 to 21 and p-channel transistors 33 to 41. Furthermore, the circuit LVB includes an input terminal WI_IN, an input terminal WIB_IN, a wiring VIH_IN, a wiring VSS_IN, a wiring VLL_IN, and an output terminal WL_OUT.

In the circuit LVB, the signal WI is input to the input terminal WI_IN, the signal WIB is input to the input terminal WIB_IN, the high power supply potential VIH is input to the wiring VIH_IN, the low power supply potential VSS is input to the wiring VSS_IN, and the low power supply potential VLL is input to the wiring VLL_IN. Then, the circuit LVB outputs a signal for driving the wiring WL from the output terminal WL_OUT.

In the circuit LVB, one of a source and a drain of the transistor 13 is electrically connected to the wiring VSS_IN, the other of the source and the drain of the transistor 13 is electrically connected to one of a source and a drain of the transistor 34 and a gate of the transistor 35, and a gate of the transistor 13 is electrically connected to the input terminal WI_IN and a gate of the transistor 34. The other of the source and the drain of the transistor 34 is electrically connected to one of a source and a drain of the transistor 33, and the other of the source and the drain of the transistor 33 is electrically connected to the wiring VIH_IN.

One of a source and a drain of the transistor 14 is electrically connected to the wiring VSS_IN, the other of the source and the drain of the transistor 14 is electrically connected to one of a source and a drain of the transistor 36 and a gate of the transistor 33, and a gate of the transistor 14 is electrically connected to the input terminal WIB_IN and a gate of the transistor 36. The other of the source and the drain of the transistor 36 is electrically connected to one of a source and a drain of the transistor 35, and the other of the source and the drain of the transistor 35 is electrically connected to the wiring VIH_IN. Here, a connection portion of the other of the source and the drain of the transistor 36 and the one of the source and the drain of the transistor 35 is referred to as a node N11, and other elements and the like electrically connected to the node N11 will be described later.

The transistor 13, the transistor 14, and the transistor 33 to the transistor 36 have a level adjustment function for converting a potential corresponding to a high level of the input signal WI and signal WIB from the high power supply potential VDD to the high power supply potential VIH.

In the circuit LVB, one of a source and a drain of the transistor 15 is electrically connected to the wiring VSS_IN; the other of the source and the drain of the transistor 15 is electrically connected to one of a source and a drain of the transistor 37, a gate of the transistor 16, and a gate of the transistor 38; and a gate of the transistor 15 is electrically connected to the node N11 and a gate of the transistor 37. The other of the source and the drain of the transistor 37 is electrically connected to the wiring VIH_IN. Here, a connection portion of the other of the source and the drain of the transistor 15, the one of the source and the drain of the transistor 37, the gate of the transistor 16, and the gate of the transistor 38 is referred to as a node N12, and other elements and the like electrically connected to the node N12 will be described later.

One of a source and a drain of the transistor 16 is electrically connected to the wiring VSS_IN, the other of the source and the drain of the transistor 16 is electrically connected to one of a source and a drain of the transistor 38, and the other of the source and the drain of the transistor 38 is electrically connected to the wiring VIH_IN. Here, a connection portion of the other of the source and the drain of the transistor 16 and the one of the source and the drain of the transistor 38 is referred to as a node N13, and other elements and the like electrically connected to the node N13 will be described later.

The transistor 15 and the transistor 37 have a function of generating an inverted signal of a signal of the node N11.

In the circuit LVB, one of a source and a drain of the transistor 18 is electrically connected to the wiring VLL_IN, the other of the source and the drain of the transistor 18 is electrically connected to one of a source and a drain of the transistor 17, the other of the source and the drain of the transistor 17 is electrically connected to one of a source and a drain of the transistor 39 and a gate of the transistor 20, and the other of the source and the drain of the transistor 39 is electrically connected to the wiring VIH_IN. A gate of the transistor 17 is electrically connected to the node N12 and a gate of the transistor 39.

One of a source and a drain of the transistor 20 is electrically connected to the wiring VLL_IN, the other of the source and the drain of the transistor 20 is electrically connected to one of a source and a drain of the transistor 19, the other of the source and the drain of the transistor 19 is electrically connected to one of a source and a drain of the transistor 40 and a gate of the transistor 18, and the other of the source and the drain of the transistor 40 is electrically connected to the wiring VIH_IN. A gate of the transistor 19 is electrically connected to the node N13 and a gate of the transistor 40. Here, a connection portion of the other of the source and the drain of the transistor 20 and the one of the source and the drain of the transistor 19 is referred to as a node N14, and other elements and the like electrically connected to the node N14 will be described later.

The transistor 17 to the transistor 20, the transistor 39, and the transistor 40 have a level adjustment function for converting potentials corresponding to low levels of signals of the node N12 and the node N13 from the low power supply potentials VSS to the low power supply potentials VLL.

In the circuit LVB, one of a source and a drain of the transistor 21 is electrically connected to the wiring VLL_IN, the other of the source and the drain of the transistor 21 is electrically connected to one of a source and a drain of the transistor 41 and the output terminal WL_OUT, and a gate of the transistor 21 is electrically connected to the node N14 and a gate of the transistor 41. The other of the source and the drain of the transistor 41 is electrically connected to the wiring VIH_IN.

The transistor 21 and the transistor 41 have a function of buffering for outputting a signal of the node N14 from the output terminal WL_OUT.

<Input/Output Example of Word Line Driver Circuit>

Figure 5A:
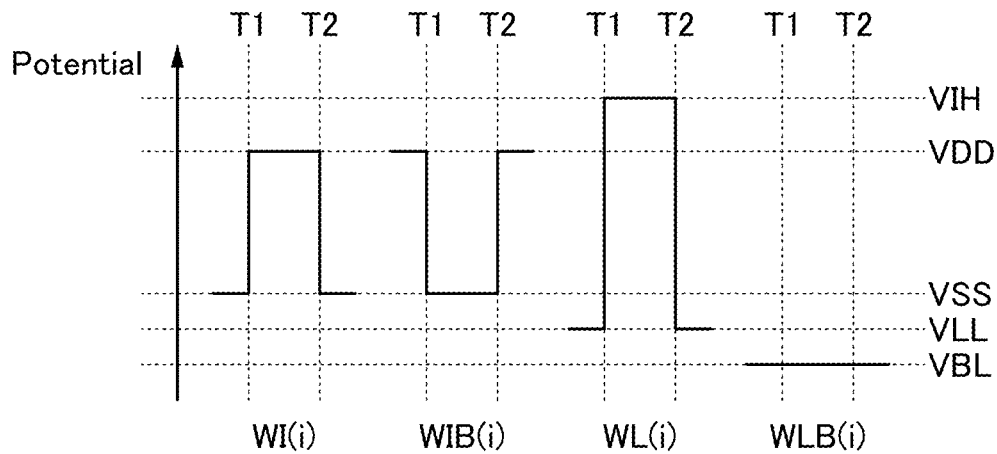
FIG. 5 (A), (B) Diagrams each showing an input/output example of a word line driver circuit.

FIG. 5(A) is a diagram showing an input/output example of the word line driver circuit 122.

The relation between the signal WI and the signal WIB which are input to the word line driver circuit 122 and the potentials of the wiring WL and the wiring WLB at which the word line driver circuit 122 is driven is described with reference to FIG. 5(A). Since there are m signals WI, m signals WIB, m wirings WL, and m wirings WLB, ones of them (WI(i), WIB(i), the wiring WL(i), and WLB(i)) are described as an example (i is an integer greater than or equal to 1 and less than or equal to m).

The vertical axis in FIG. 5(A) represents potentials, and the case where the potentials in order from the highest are the high power supply potential VIH, the high power supply potential VDD, the low power supply potential VSS, the low power supply potential VLL, and the low power supply potential VBL is shown.

In FIG. 5(A), T1 and T2 represent time, and the situation where the wiring WL(i) is driven at almost the same time as the signal WI(i) and the signal WIB(i) is shown. In practice, delay time is caused between driving of the signal WI(i) and the signal WIB(i) to be input and driving of the wiring WL(i) and a signal includes corruption, a noise, or the like, in some cases. FIG. 5(A) shows waveforms in the ideal case.

As shown in FIG. 5(A), the signal WI(i) and the signal WIB(i) are digital signals which express a high level or a low level by the high power supply potential VDD or the low power supply potential VSS. The signal WI(i) becomes a high level in the case where data writing or reading is performed on the memory cell 211 electrically connected to the wiring WL(i) and the wiring WLB(i) (the signal WIB becomes a low level because it is an inverted signal of the signal WI).

The word line driver circuit 122 outputs the low power supply potential VLL to the wiring WL(i) in the case where the signal WI(i) is at a low level and outputs the high power supply potential VIH to the wiring WL(i) in the case where the signal WI(i) is at a high level. The word line driver circuit 122 outputs the low power supply potential VBL to the wiring WLB(i).

Alternatively, the word line driver circuit 122 may drive the wiring WLB in addition to the wiring WL. In the case where the word line driver circuit 122 drives the wiring WLB, for example, the word line driver circuit 122 is additionally provided with the circuit LVB.

Figure 5B:
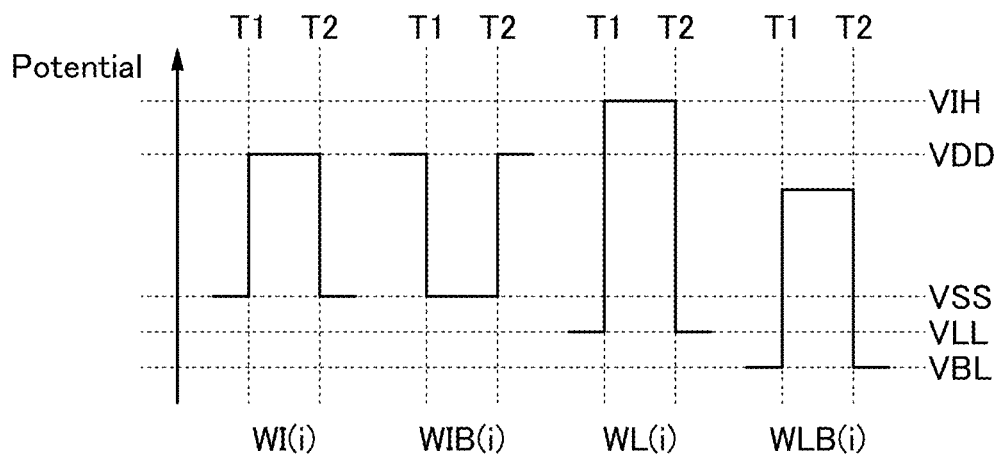

FIG. 5(B) is a diagram showing an input/output example of the word line driver circuit 122, like FIG. 5(A). As shown in FIG. 5(B), for example, the word line driver circuit 122 can output the low power supply potential VBL to the wiring WLB(i) in the case where the signal WI(i) is at a low level and output a potential between the high power supply potential VDD and the low power supply potential VSS to the wiring WLB(i) in the case where the signal WI(i) is at a high level.

In this manner, the word line driver circuit 122 drives the wiring WL(i) or the wiring WL(i) and the wiring WLB(i) by changing the high levels or low levels or the high levels and low levels of the signal WI(i) and the signal WIB(i).

<Negative Potential Generation Circuit>

Figure 6A:
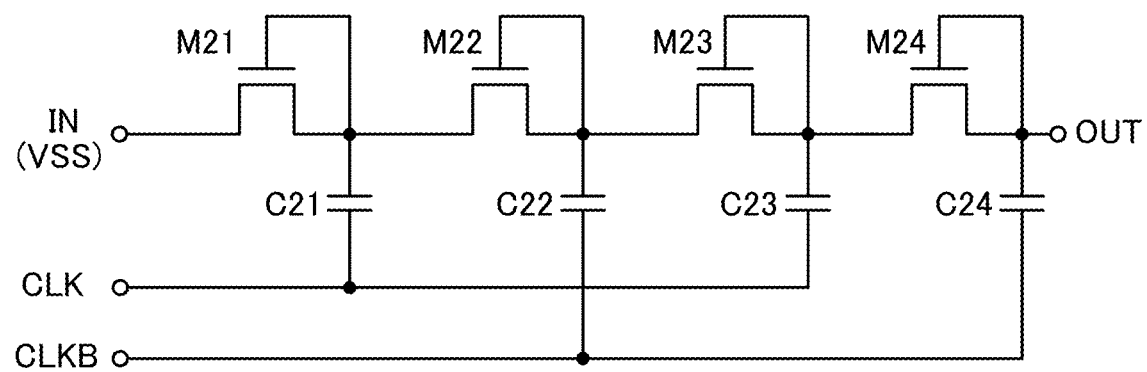
FIG. 6 (A), (B) Circuit diagrams each illustrating a structure example of a potential generation circuit.
Figure 6B:
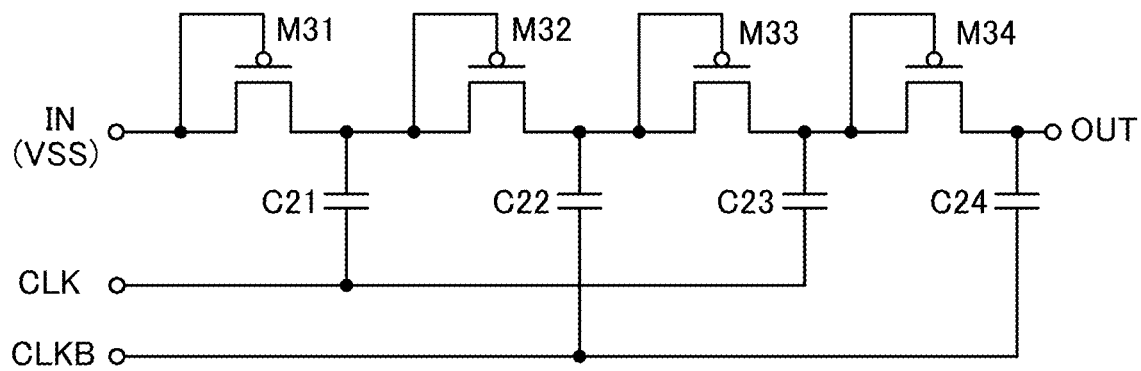

Next, structure examples of a circuit 54 and a circuit 55 that are applicable to the negative potential generation circuit 150 and the negative potential generation circuit 151 will be illustrated in FIG. 6(A) and FIG. 6(B).

The circuit 54 and the circuit 55 are step-down charge pumps, and the low power supply potential VSS is input to an input terminal IN and the low power supply potential VLL or the low power supply potential VBL is output from an output terminal OUT. Here, as an example, the number of stages of fundamental circuits in the charge pump circuit is four; however, it is not limited thereto, and the charge pump circuit may be configured with a given number of stages.

The circuit 54 illustrated in FIG. 6(A) includes a transistor M21 to a transistor M24 and a capacitor C21 to a capacitor C24. Note that the transistor M21 to the transistor M24 are re-channel transistors.

The transistor M21 to the transistor M24 are connected in series between the input terminal IN and the output terminal OUT. In each of the transistor M21 to the transistor M24, a gate and one of a source and a drain are electrically connected to each other, and the transistor M21 to the transistor M24 function as diodes. Furthermore, the capacitor C21 to the capacitor C24 are electrically connected to the gates of the transistor M21 to the transistor M24, respectively.

A clock signal CLK is input to one electrodes of the capacitors C21 and C23 at odd-numbered stages, and a clock signal CLKB is input to one electrodes of the capacitors C22 and C24 at even-numbered stages. The clock signal CLKB is an inverted clock signal obtained by phase inversion of the clock signal CLK.

The circuit 54 has a function of stepping down the low power supply potential VSS input to the input terminal IN to generate the low power supply potential VLL or the low power supply potential VBL. The circuit 54 can generate the low power supply potential VLL or the low power supply potential VBL, which is obtained by stepping down the low power supply potential VSS, only by the supply of the clock signal CLK and the clock signal CLKB.

The circuit 55 illustrated in FIG. 6(B) includes a transistor M31 to a transistor M34 that are p-channel transistors. The description of the circuit 54 is referred to for the other components.

<Transistor M11>

As described above, an OS transistor with a back gate can be used as each of the transistor M11, the transistor M12, and the transistor M14. The threshold voltage of the OS transistor can be increased or decreased when a potential is applied to the back gate. Specifically, the threshold voltage negatively shifts when a high potential is applied to the back gate of the OS transistor, and the threshold voltage positively shifts when a low potential is applied to the back gate.

In other words, a potential applied to the back gate (the low power supply potential VBL in this specification and the like) is made low, whereby current Ids that flows between the source and the drain when the voltage Vgs of the gate with respect to the source is 0 V (also referred to as cutoff current) can be reduced. Reducing the cutoff current can increase the retention time of data written to the memory cell 211.

Furthermore, a potential applied to the front gate when the transistor is in a non-conduction state (an off state) is made to be a potential lower than the low power supply potential VSS (the low power supply potential VLL in this specification and the like), whereby current that flows between the source and the drain can be reduced. In other words, by application of the low power supply potential VLL to the front gate when the transistor is in a non-conduction state, current that flows between the source and the drain of the transistor can be reduced even when a potential difference between the low power supply potential VBL and the low power supply potential VSS is made small.

When the potential difference between the low power supply potential VBL and the low power supply potential VSS is made small, the intensity of an electric field applied to the insulating film (also referred to as a gate insulating film or a gate insulating layer) between the back gate and a channel formation region of the transistor can be made small, leading to improved reliability of the transistor. That is, electric field stress applied to the transistor can be reduced, and thus the reliability of the transistor can be increased. The memory 100 can be a memory device having long data retention time and a high reliability.

Note that this embodiment can be implemented in combination with the other embodiments described in this specification as appropriate.

Embodiment 2

In this embodiment, a structure example of the memory cell array 201 included in the memory 100 and an operation example thereof will be described.

Figure 7:
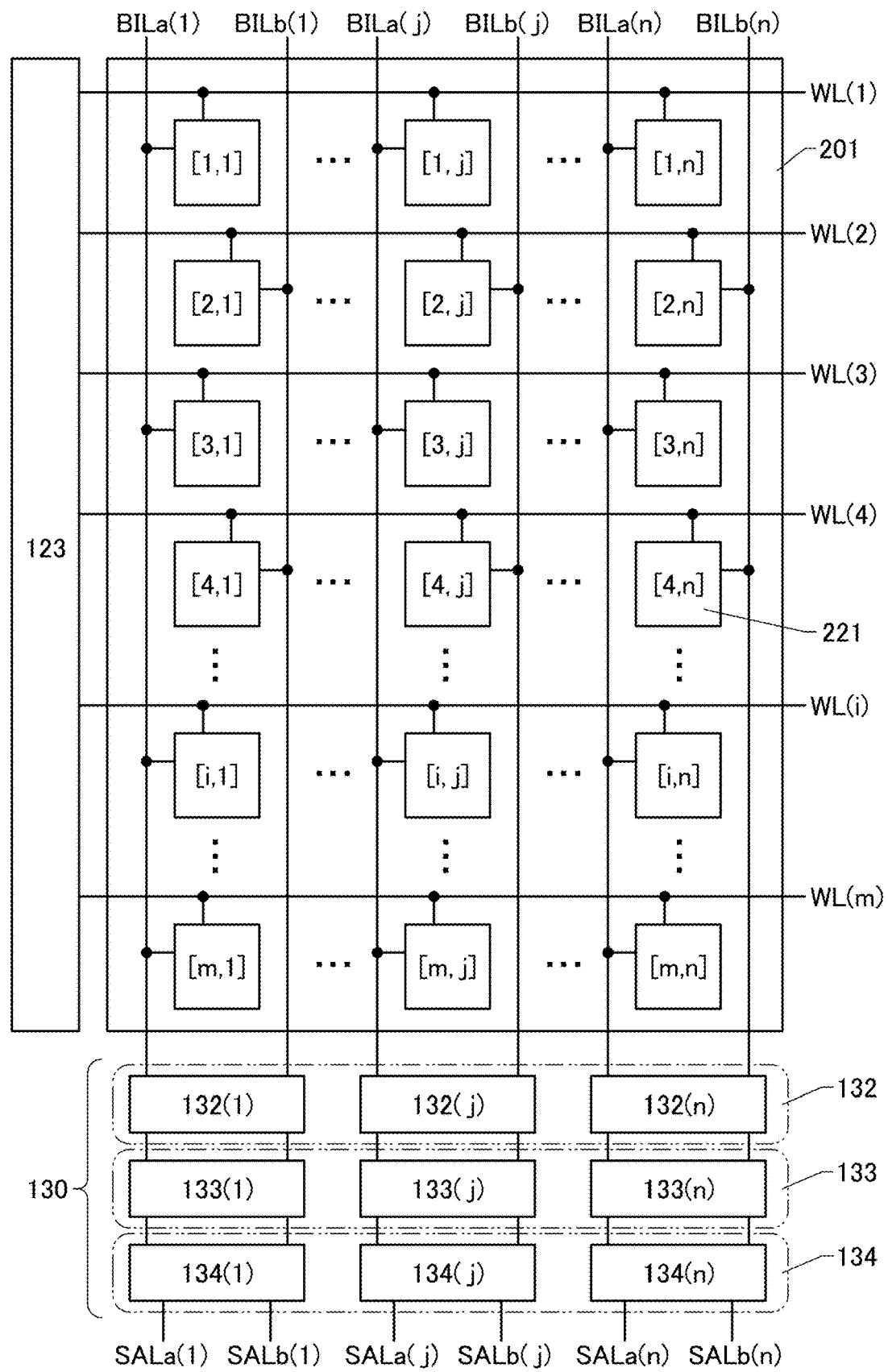
FIG. 7 A diagram illustrating a structure example of a memory cell array and a bit line driver circuit.

FIG. 7 illustrates an example of the memory cell array 201 different from that in FIG. 2(A). FIG. 7 illustrates a memory cell array having a folded bit-line architecture. Note that a memory cell 221 can also be used for a memory cell array having an open bit-line architecture. The wiring WLB is omitted in FIG. 7.

The memory cell array 201 illustrated in FIG. 7 includes a total of m×n memory cells 221 of m memory cells 221 in one column and n memory cells 221 in one row, and the memory cells 221 are arranged in a matrix. FIG. 7 also illustrates addresses of the memory cells 221. For example, [i,j] represents a memory cell 221 positioned at an address of the i-th row and the j-th column.

The memory cell array 201 illustrated in FIG. 7 includes m wirings WL electrically connected to the word line driver circuit 122. The wiring WL(1) is electrically connected to the memory cells 221 in the first row. Similarly, the wiring WL(i) is electrically connected to the memory cells 221 in the i-th row.

In addition, the memory cell array 201 illustrated in FIG. 7 includes two wirings BIL (a wiring BILa and a wiring BILb) in one column. In FIG. 7 and the like, the wiring BILa in the first column is referred to as a wiring BILa(1), and the wiring BILb in the j-th column is referred to as a wiring BILb(j).

The memory cell 221 placed in an odd-numbered row is electrically connected to one of the wiring BILa and the wiring BILb, and the memory cell 221 placed in an even-numbered row is electrically connected to the other of the wiring BILa and the wiring BILb.

Moreover, the wiring BILa and the wiring BILb are electrically connected to the precharge circuit 132, the sense amplifier 133, and the input/output circuit 134, which are provided in every column. The input/output circuit 134 is electrically connected to a wiring SALa and a wiring SALb in every column. In FIG. 7 and the like, the precharge circuit 132 in the first column is referred to as a precharge circuit 132(1), and the precharge circuit 132 in the j-th column is referred to as a precharge circuit 132(j). The same applies to the sense amplifier 133 and the input/output circuit 134. Note that the bit line driver circuit 130 includes the column decoder 131 (see FIG. 1).

<Circuit Structure Example>

Figure 8:
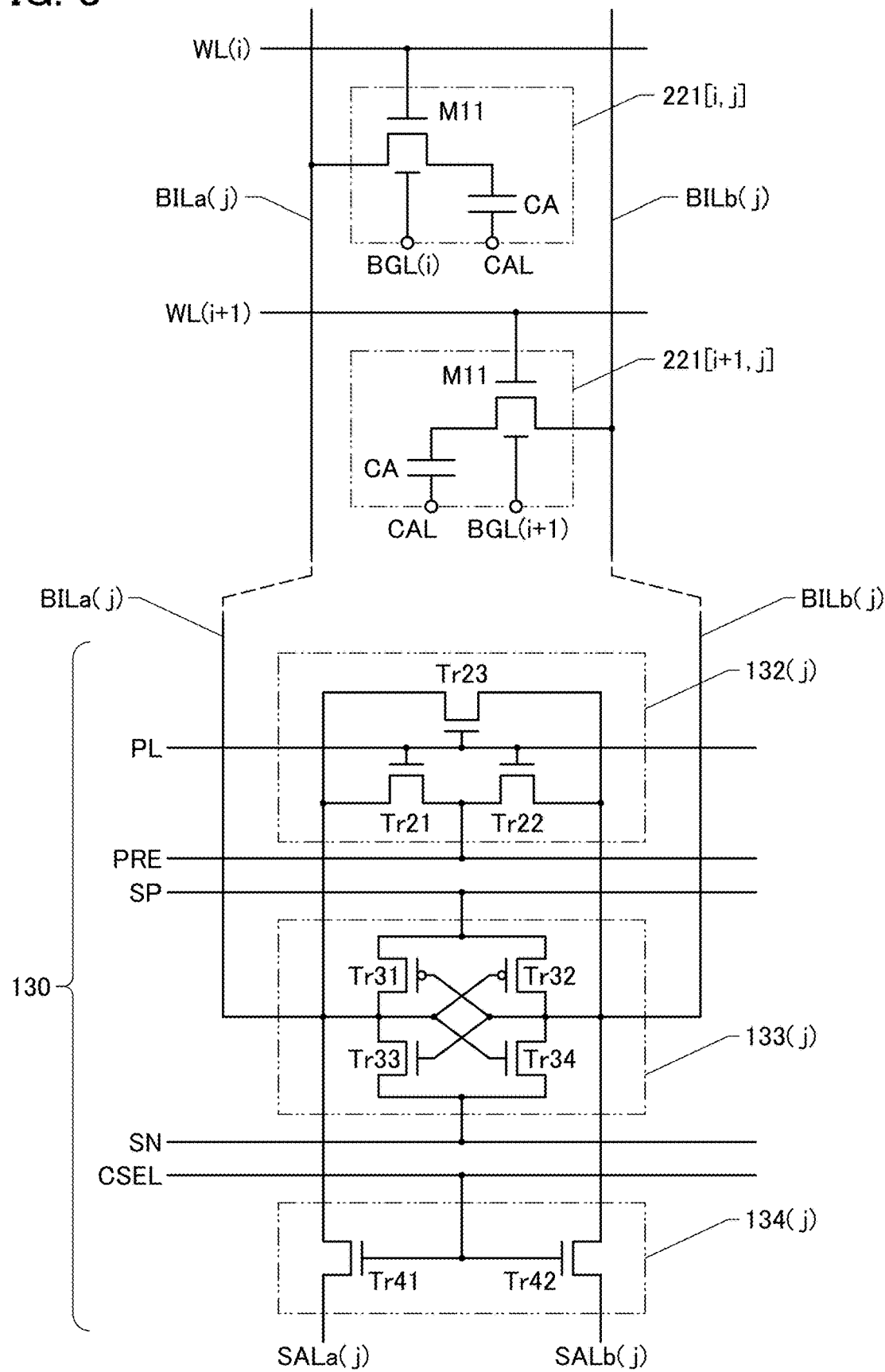
FIG. 8 A diagram illustrating a circuit structure example.

FIG. 8 illustrates a circuit structure example of the memory cells 221, the precharge circuit 132, the sense amplifier 133, and the input/output circuit 134 that are in the J-th column.

<Precharge Circuit 132>

The precharge circuit 132(j) includes an n-channel transistor Tr21 to an n-channel transistor Tr23. Note that the transistor Tr21 to the transistor Tr23 may be p-channel transistors. One of a source and a drain of the transistor Tr21 is connected to a wiring BILa(j), and the other of the source and the drain is connected to a wiring PRE. One of a source and a drain of the transistor Tr22 is connected to the wiring BILb(j), and the other of the source and the drain is connected to the wiring PRE. One of a source and a drain of the transistor Tr23 is connected to the wiring BILa(j), and the other of the source and the drain is connected to the wiring BILb(j). A gate of the transistor Tr21, a gate of the transistor Tr22, and a gate of the transistor Tr23 are connected to a wiring PL. A precharge circuit PRC has a function of initializing the potentials of the wiring BILa(j) and the wiring BILb(j).

<Sense Amplifier 133>

An amplifier circuit 133(j) includes a p-channel transistor Tr31, a p-channel transistor Tr32, an n-channel transistor Tr33, and an n-channel transistor Tr34. One of a source and a drain of the transistor Tr31 is connected to a wiring SP, and the other of the source and the drain is connected to a gate of the transistor Tr32, a gate of the transistor Tr34, and the wiring BILa(j). One of a source and a drain of the transistor Tr33 is connected to the gate of the transistor Tr32, the gate of the transistor Tr34, and a wiring BLa(j) and the other of the source and the drain is connected to a wiring SN. One of a source and a drain of the transistor Tr32 is connected to the wiring SP, and the other of the source and the drain is connected to a gate of the transistor Tr31, a gate of the transistor Tr33, and a wiring BLb(j). One of a source and a drain of the transistor Tr34 is connected to the gate of the transistor Tr31, the gate of the transistor Tr33, and the wiring BLb(j), and the other of the source and the drain is connected to the wiring SN. The sense amplifier 133(i) has a function of amplifying potentials of the wirings BLa(j) and BILb(j) Note that the sense amplifier 133(j) functions as a latch sense amplifier.

<Input/Output Circuit 134>

An input/output circuit 134(j) includes an n-channel transistor Tr41 and an n-channel transistor Tr42. Note that the transistor Tr41 and the transistor Tr42 may be p-channel transistors. One of a source and a drain of the transistor Tr41 is connected to the wiring BILa(j), and the other of the source and the drain is connected to a wiring SALa(j). One of a source and a drain of the transistor Tr42 is connected to the wiring BILb(j), and the other of the source and the drain is connected to a wiring SALb(j). A gate of the transistor Tr41 and a gate of the transistor Tr42 are connected to a wiring CSEL.

The input/output circuit 134(j) has a function of controlling the electrical continuity between the wiring BILa(j) and the wiring SALa(j) and the electrical continuity between the wiring BILb(j) and the wiring SALb(j) on the basis of a potential supplied to the wiring CSEL. That is, whether a potential is output to the wiring SALa(j) and the wiring SALb(j) can be selected by the input/output circuit 134(j).

The wiring SP, the wiring SN, the wiring CSEL, the wiring PRE, and the wiring PL have a function of transmitting a signal for controlling the operation of the precharge circuit 132, the sense amplifier 133, and the input/output circuit 134. The wiring SP, the wiring SN, the wiring CSEL, the wiring PRE, and the wiring PL are connected to the control logic circuit 160 illustrated in FIG. 1. The control logic circuit 160 has a function of supplying a control signal to the wiring SP, the wiring SN, the wiring CSEL, the wiring PRE, and the wiring PL.

<Operation Example>

Operation modes of the memory 100 will be described using the memory cell 221M, the precharge circuit 132(j), the sense amplifier 133(j), and the input/output circuit 134(j) illustrated in FIG. 8. Furthermore, −3 V is supplied to a wiring BGL(i).

<Reading Mode>

First, an operation example of the sense amplifier 133(j) when data is read from the memory cell 221[i,j] will be described with reference to a timing chart shown in FIG. 9.

[Period T11]

In Period T11, the precharge circuit 132(j) is operated, and the potentials of the wiring BILa(j) and the wiring BILb(j) are initialized. Specifically, the potential of the wiring PL is set to a high level (VH_PL) to bring the transistor Tr21 to the transistor Tr23 into an on state. Thus, a potential Vpre of the wiring PRE is supplied to the wiring BILa(j) and the wiring BILb(j). Note that the potential Vpre can be set to (VH_SP+VL_SN)/2, for example. VH_SP is a high-level potential supplied to the wiring SP, and VL_SN is a low-level potential supplied to the wiring SN.

Note that in Period T11, the potential of the wiring CSEL is at a low level (VL_CSEL), and the transistor Tr41 and the transistor Tr42 in the input/output circuit 134(j) are in an off state. In addition, the potential of the wiring WL(i) is at a low level (VLWL), and the transistor M11 included in the memory cell 221[i,j] is in an off state. Similarly, although not illustrated in FIG. 8, the potential of a wiring WL[i+1] is at a low level (VL_WL), and the transistor M11 included in a memory cell 221[i+1,j] is in an off state. In addition, the potentials of the wiring SP and the wiring SN are the potential Vpre, and the sense amplifier 133(j) is in a halting state.

Note that VL_WL is preferably a potential lower than VL_SN. Moreover, VL_WL is preferably a potential lower than a potential obtained by subtracting Vth of the transistor M11 from VL_SN. In other words, in the case where VL_SN is a reference potential (0 V), VL_WL is a negative potential (also referred to as a "minus potential" or a "negative bias").

A negative bias is supplied to the wiring WL(i), whereby the transistor M11 can be brought into an off state more surely. A memory device whose data retention time is long even when operated at high temperatures, in particular, can be provided.

The transistor M11 can also be brought into an off state by supply of a negative bias to the wiring BGL(i). In particular, in the case where both of the wiring WL(i) and the wiring BGL(i) are supplied with a negative bias, the same effect can be obtained with a smaller bias than in the case where only one of them is supplied with a negative bias. Moreover, electric field stress applied to the transistor M11 can be reduced, so that the transistor M11 can have higher reliability. Furthermore, the power consumption of the transistor M11 can be reduced. That is, the reliability of the memory 100 can be increased, and the power consumption can be reduced.

[Period T12]

In Period T12, the potential of the wiring PL is set to a low level (VL_PL) to bring the transistor Tr21 to the transistor Tr23 into an off state. The wiring WL(i) is selected. Specifically, the potential of the wiring WL(i) is set to a high level (VH_WL) to bring the transistor M11 included in the memory cell 221[i,j] into an on state. This establishes electrical continuity between the wiring BILa(j) and the capacitor CA through the transistor M11 in the memory cell 221[i,j], and the potential of the wiring BILa(j) changes in accordance with the amount of charge retained in the capacitor CA.

Here, VH_WL is preferably a potential higher than VH_SP. Specifically, VH_WL is preferably a potential higher than a potential obtained by adding Vth of the transistor M11 to VH_SP.

Figure 9:
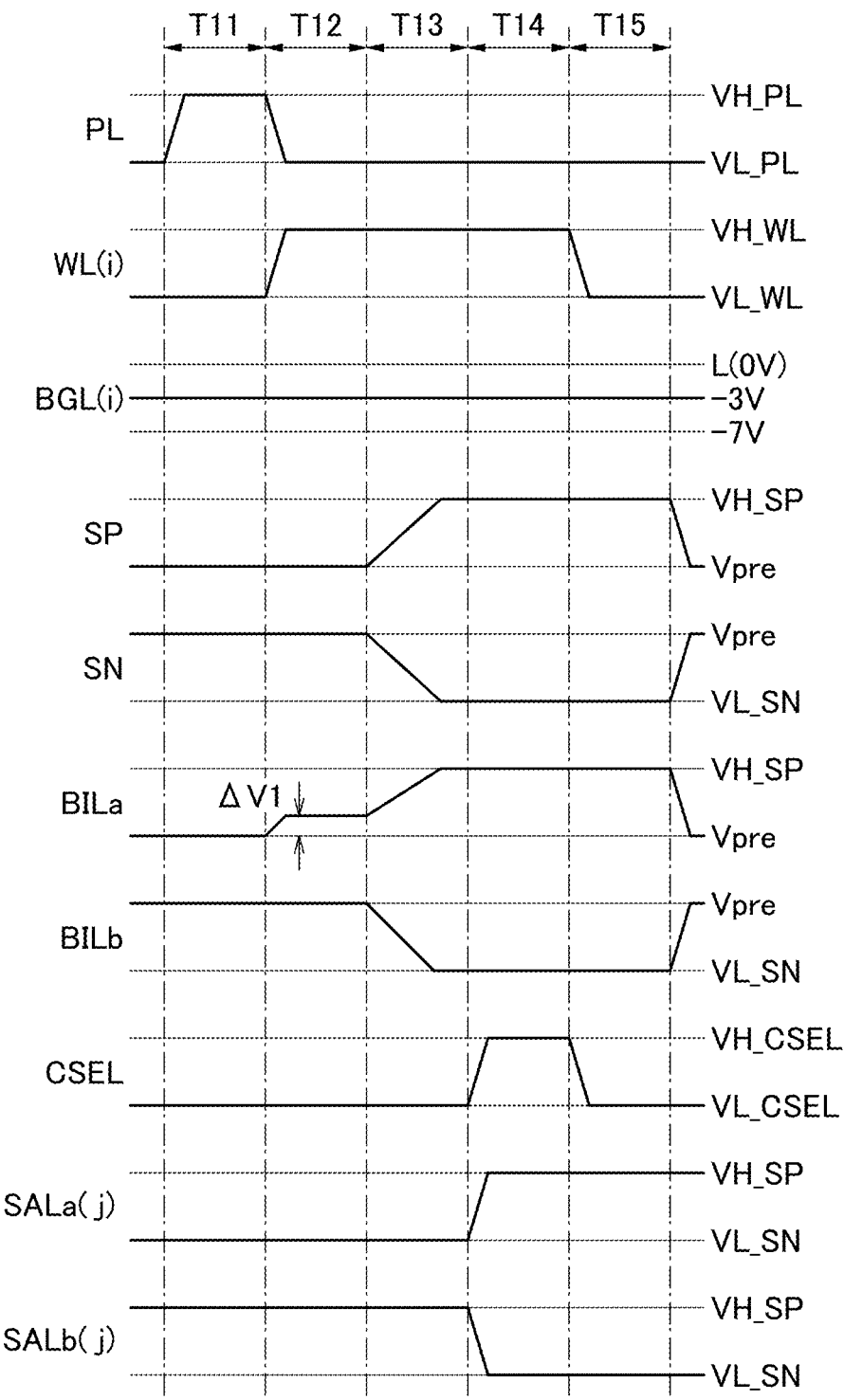
FIG. 9 A timing chart showing an operation example of a memory device.

FIG. 9 shows the case where data "1" is stored in the memory cell 221[i,j] and the amount of charge accumulated in the capacitor CA is large, as an example. Specifically, in the case where the amount of charge accumulated in the capacitor CA is large, the release of charge from the capacitor CA to the wiring BILa(j) increases the potential of the wiring BILa(j) from the potential Vpre by ΔV1. On the other hand, in the case where data "0" is stored in the memory cell 221[i,j] and the amount of charge accumulated in the capacitor CA is small, charge flows from the wiring BILa(j) to the capacitor CA, decreasing the potential of the wiring BILa(j) by ΔV2 (not illustrated).

Note that in Period T12, the potential of the wiring CSEL is at a low level (VL_CSEL), and the transistor Tr41 and the transistor Tr42 in the input/output circuit 134(j) are in an off state. In addition, the potentials of the wiring SP and the wiring SN are the potential Vpre, and the sense amplifier 133(j) remains in a halting state.

[Period T13]

In Period T13, the potential of the wiring SP is changed to a high level (VH_SP) and the potential of the wiring SN is changed to a low level (VL_SN). Thus, the sense amplifier 133(j) is in an operation state. The sense amplifier 133(j) has a function of amplifying a potential difference between the wiring BILa(j) and the wiring BILb(j) (ΔV1 in FIG. 9). Bringing the sense amplifier 133(j) into an operation state makes the potential of the wiring BILa(j) closer to the potential of the wiring SP (VH_SP) from Vpre+ΔV1. In addition, the potential of the wiring BILb(j) is made closer to the potential of the wiring SN (VL_SN) from Vpre.

Note that in the case where the potential of the wiring BILa(j) is Vpre−ΔV2 in the initial stage of Period T13, bringing the sense amplifier 133(j) into an operating state makes the potential of the wiring BILa(j) closer to the potential of the wiring SN (VL_SN) from Vpre−ΔV2. In addition, the potential of the wiring BILb(j) is made closer to the potential of the wiring SP (VH_SP) from the potential Vpre.

In Period T13, the potential of the wiring PL is at a low level (VL_PL), and the transistor Tr21 to the transistor Tr23 in the precharge circuit 132(j) are in an off state. In addition, the potential of the wiring CSEL is at a low level (VL_CSEL), and the transistor Tr41 and the transistor Tr42 in the input/output circuit 134(j) are in an off state. Furthermore, the potential of the wiring WL(i) is at a high level (VH_WL), and the transistor M11 included in the memory cell 221[i,j] is in an on state. Consequently, the amount of charge corresponding to the potential of the wiring BILa(j) (VH_SP) is accumulated in the capacitor CA in the memory cell 221[i,j].

[Period T14]

In Period T14, the potential of the wiring CSEL is controlled to bring the input/output circuit 134(j) into an on state. Specifically, the potential of the wiring CSEL is set to a high level (VH_CSEL) to bring the transistor Tr41 and the transistor Tr42 into an on state. Accordingly, the potential of the wiring BILa(j) is supplied to the wiring SALa(j), and the potential of the wiring BILb(j) is supplied to the wiring SALb(j).

Note that in Period T14, the potential of the wiring PL is at a low level (VLPL), and the transistor Tr21 to the transistor Tr23 in the precharge circuit 132(j) are in an off state. In addition, the potential of the wiring WL(i) is at a high level (VH_WL), and the transistor M11 included in the memory cell 221[i,j] is in an on state. The potential of the wiring SP is at a high level (VH_SP), the potential of the wiring SN is at a low level (VL_SN), and the sense amplifier 133(j) is in an operation state. Consequently, charge corresponding to the potential of the wiring BILa(j) (VH_SP) is accumulated in the capacitor CA in the memory cell 221[i,j].
[Period T15]

In Period T15, the potential of the wiring CSEL is controlled to bring the input/output circuit 134(j) into an off state. Specifically, the potential of the wiring CSEL is set to a low level (VL_CSEL) to bring the transistor Tr41 and the transistor Tr42 into an off state.

In addition, in Period T15, VL_WL is supplied to the wiring WL(i) to bring the wiring WL(i) into a non-selection state. Specifically, the potential of the wiring WL(i) is set to a low level (VL_WL). Consequently, the transistor included in the memory cell 221[i,j] is brought into an off state. Thus, the amount of charge corresponding to the potential of the wiring BLa (VH_SP) is retained in the capacitor CA included in the memory cell 221[i,j]. Accordingly, data is retained in the memory cell 221[i,j] even after the data is read.

When VL_WL supplied to the wiring WL(i) is set to a negative potential, the transistor M11 can be brought into an off state more surely. A memory device whose data retention time is long even when operated at high temperatures, in particular, can be provided.

Note that in Period T15, even when the input/output circuit 134(j) is brought into an off state, in the case where the sense amplifier 133(j) is in an operation state, the potentials of the wiring BILa(j) and the wiring BILb(j) are retained by the sense amplifier 133(j). Therefore, the sense amplifier 133(j) has a function of temporarily retaining data that has been read from the memory cell 221[i,j].

Through the operations described above, data can be read from the memory cell 221[i,j]. The read data is supplied to the output circuit 140 (see FIG. 1) through the wiring SALa(j) and/or the wiring SALb(j). Note that reading of data from the memory cell 221[i+1,j] can be performed in a manner similar to that of the memory cell 221[i,j].

<Writing Mode>

Figure 10:
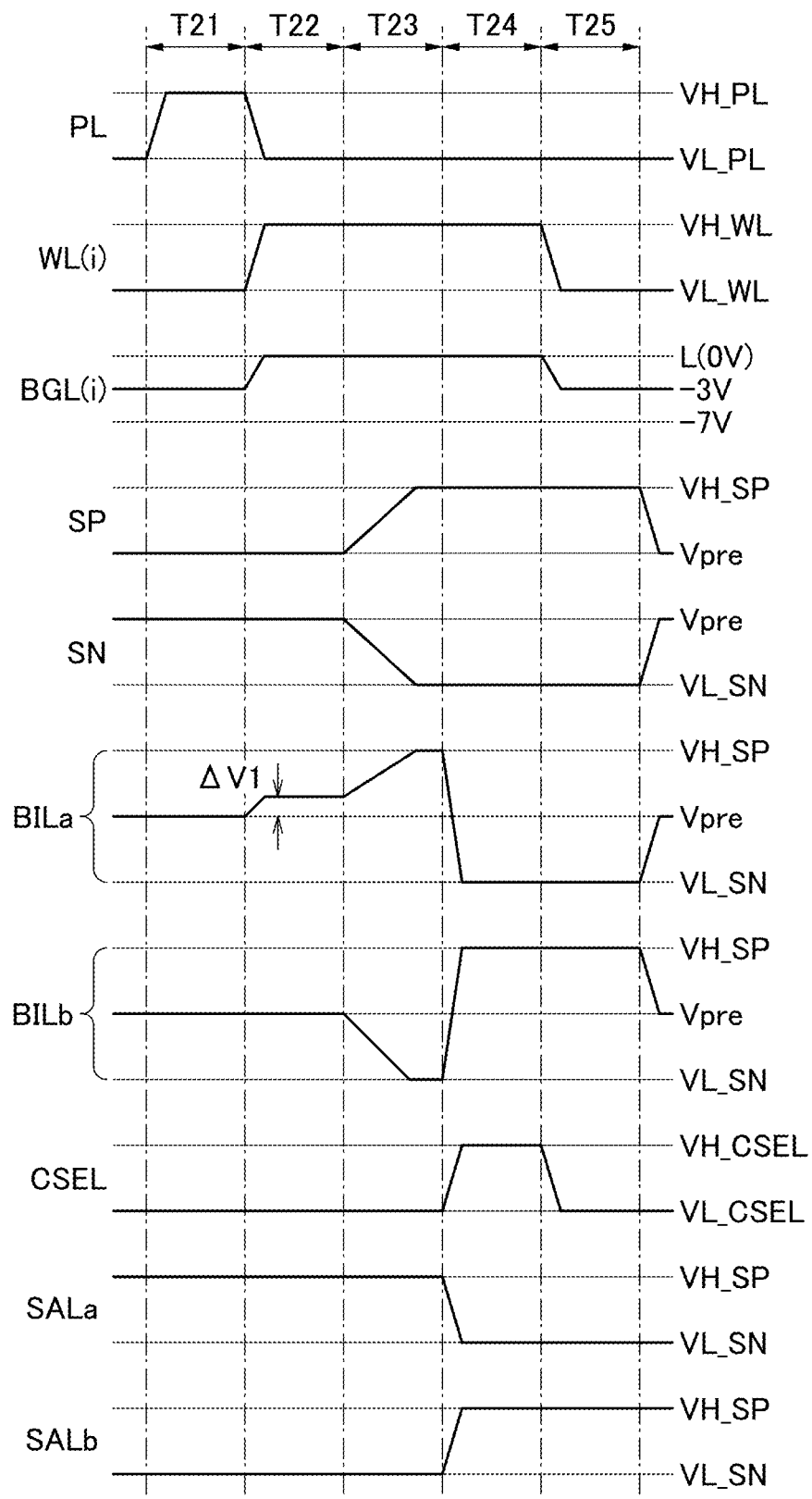
FIG. 10 A timing chart showing an operation example of a memory device.

Next, an operation example of the sense amplifier 133(j) when data is written to the memory cell 221[i,j] will be described with reference to a timing chart shown in FIG. 10. Data can be written to the memory cell 221[i+1,j] on the principle similar to that described above.
[Period T21]

In Period T21, the transistor Tr21 to the transistor Tr23 included in the precharge circuit 132(i) are brought into an on state, and the potentials of the wiring BILa(j) and the wiring BILb(j) are initialized. Specifically, the potential of the wiring PL is set to a high level (VH_PL) to bring the transistor Tr21 to the transistor Tr23 into an on state. Thus, the potential Vpre of the wiring PRE is supplied to the wiring BILa(j) and the wiring BILb(j). Note that the potential Vpre can be set to (VH_SP+VL_SN)/2, for example.
[Period T22]

After that, in Period T22, the potential of the wiring PL is set to a low level (VL_PL) to bring the transistor Tr21 to the transistor Tr23 into an off state. The wiring WL(i) connected to the memory cell 221[i,j] to which data is written is selected. Specifically, the potential of the wiring WL(i) is set to a high level (VH_WL) to bring the transistor M11 included in the memory cell 221[i,j] into an on state. This establishes electrical continuity between the wiring BILa(j) and the capacitor CA through the transistor M11 in the memory cell 221[i,j].

Note that although a negative bias may be continuously supplied to the wiring BGL(i) while operation is performed in a writing mode, the potential of the wiring BGL(i) may be increased in accordance with the change of the potential of the wiring WL(i) into VH_WL. In FIG. 10, the potential of the wiring BGL(i) is set to an L potential (e.g., 0 V) in Period T22.

By increasing the potential of the wiring BGL(i) in accordance with the increase in the potential of the wiring WL(i), the threshold voltage Vth of the transistor M11 becomes small, so that the operating speed can be increased. Accordingly, the time needed for the writing operation can be reduced. Consequently, the operating speed of the memory 100 can be increased.

In the case where both of the potentials of the wiring WL(i) and the wiring BGL(i) are increased, the same writing speed can be achieved with a smaller potential increase than in the case where only one of the potentials is increased. Consequently, electric field stress applied to the transistor M11 can be reduced, so that the transistor M11 can have higher reliability. Furthermore, the power consumption of the transistor M11 can be reduced. That is, the reliability of the memory 100 can be increased, and the power consumption can be reduced.

At this time, in the case where data "1" is already stored in the memory cell 221[i,j], the release of charge from the capacitor CA to the wiring BILa(j) increases the potential of the wiring BILa(j) from the potential Vpre by ΔV1.
[Period T23]

In Period T23, the potential of the wiring SP is set to a high level (VH_SP) and the potential of the wiring SN is set to a low level (VL_SN) to bring the sense amplifier 133(j) into an operation state.
[Period T24]

In Period T24, the potential of the wiring CSEL is controlled to bring the input/output circuit 134(j) into an on state. This establishes electrical continuity between the wiring BILa(j) and the wiring SALa(j) and electrical continuity between the wiring BILb(j) and the wiring SALb(j).

The data signal WDATA is supplied to the input/output circuit 134(j) through the wiring SALa(j) and the wiring SALb(j). By supplying a writing potential corresponding to the data signal WDATA to the wiring SALa(j) and the wiring SALb(j), the writing potential is supplied to the wiring BILa(j) and the wiring BILb(j) through the input/output circuit 134(j). When data "0" is stored in the memory cell 221[i,j], a low level (VL_SN) is supplied to the wiring SALa(j) and a high level (VH_SP) is supplied to the wiring SALb(j).

Thus, the on/off state of the transistor Tr31 to the transistor Tr34 included in the sense amplifier 133(j) is inverted, the potential of the wiring SN (VL_SN) is supplied to the wiring BILa(j), and the potential of the wiring SP (VL_SP) is supplied to the wiring BILb(j). Accordingly, the amount of charge corresponding to the potential representing the data "0" (VL_SN) is accumulated in the capacitor CA. Through the operations described above, data can be written to the memory cell 221[i,j].
[Period T25]

In Period T25, VL_WL is supplied to the wiring WL(i) to bring the wiring WL(i) into a non-selection state. Accordingly, charge written to the memory cell 221[i,j] is retained. In the case where the potential of the wiring BGL(i) is increased in accordance with the increase in potential of the wiring WL(i), the potential of the wiring BGL(i) is decreased in accordance with the change of the potential of the wiring WL(i) into VL_WL. For example, −3 V is supplied to the wiring BGL(i).

In addition, the potential of the wiring CSEL is set to a low level (VL_CSEL) to bring the transistor Tr41 and the transistor Tr42 into an off state.

Note that after the potential of the wiring SALa(j) is supplied to the wiring BILa(j), the potentials of the wiring BILa(j) and the wiring BILb(j) are retained by the sense amplifier 133(j) as long as the sense amplifier 133(j) is in an operation state even when the transistor Tr41 and the transistor Tr42 are brought into an off state in the input/output circuit 134(j). Thus, the timing of switching the transistor Tr41 and the transistor Tr42 from an on state to an off state can be either before or after the wiring WL(i) is selected.

Through the operations described above, data can be written to the memory cell 221[i,j]. Note that writing of data to the memory cell 221[i+1,j] can be performed in a manner similar to that of the memory cell 221[i,j].

When VL_WL supplied to the wiring WL(i) is set to a negative potential, the transistor M11 can be brought into an off state more surely. A memory device whose data retention time is long even when operated at high temperatures, in particular, can be provided.

<Refresh Mode>

In order to maintain data written to the memory cell 221[i,j], refresh operation (rewriting operation) is performed at regular intervals. An operation example of the sense amplifier 133(j) at refresh operation will be described with reference to a timing chart shown in FIG. 11. Note that the refresh operation can be performed in the same principle as the above.

[Period T31]

In Period T31, the transistor Tr21 to the transistor Tr23 included in the precharge circuit 132(i) are brought into an on state, and the potentials of the wiring BILa(j) and the wiring BILb(j) are initialized. Specifically, the potential of the wiring PL is set to a high level (VH_PL) to bring the transistor Tr21 to the transistor Tr23 into an on state. Thus, a potential Vpre of the wiring PRE is supplied to the wiring BILa(j) and the wiring BILb(j).

[Period T32]

In Period T32, the potential of the wiring PL is set to a low level (VL_PL) to bring the transistor Tr21 to the transistor Tr23 into an off state. The wiring WL(i) connected to the memory cell 221[i,j] to which data is written is selected. Specifically, the potential of the wiring WL(i) is set to a high level (VH_WL) to bring the transistor M11 included in the memory cell 221[i,j] into an on state. This establishes electrical continuity between the wiring BILa(j) and the capacitor CA through the transistor M11 in the memory cell 221[i,j].

Figure 11:
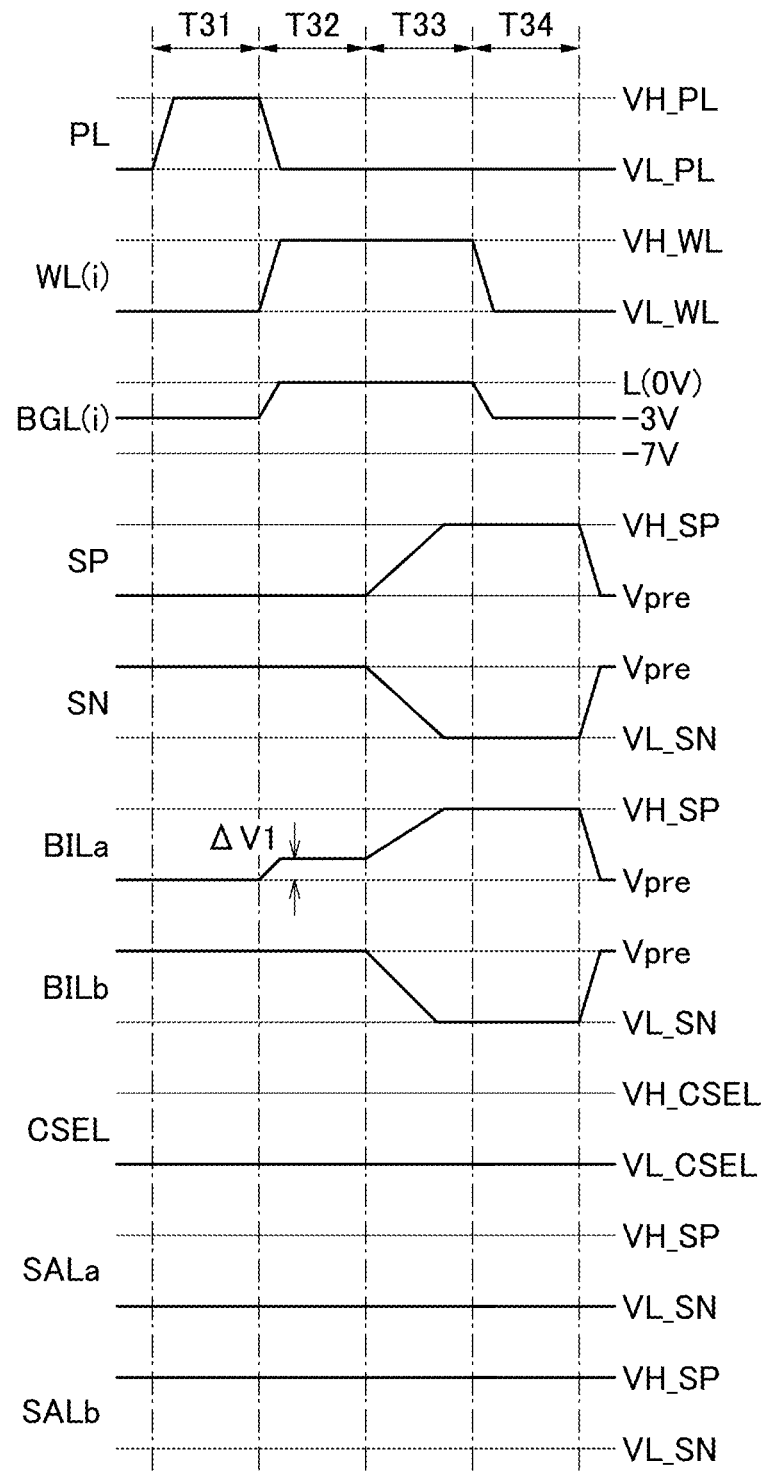
FIG. 11 A timing chart showing an operation example of a memory device.

Note that although a negative bias may be continuously supplied to the wiring BGL(i) while operation is performed in a refresh mode, the potential of the wiring BGL(i) may be increased in accordance with the change of the potential of the wiring WL(i) into VH_WL. In FIG. 11, the potential of the wiring BGL(i) is set to an L potential (e.g., 0 V) in Period T32.

By increasing the potential of the wiring BGL(i) in accordance with the increase in the potential of the wiring WL(i), the operating speed of the transistor M11 can be increased. Accordingly, the time needed for the refresh operation can be reduced. Consequently, the operating speed of the memory 100 can be increased.

In the case where both of the potentials of the wiring WL(i) and the wiring BGL(i) are increased, the same writing speed can be achieved with a smaller potential increase than in the case where only one of the potentials is increased. Consequently, electric field stress applied to the transistor M11 can be reduced, so that the transistor M11 can have higher reliability. Furthermore, the power consumption of the transistor M11 can be reduced.

At this time, in the case where data "1" is already stored in the memory cell 221[i,j], the release of charge from the capacitor CA to the wiring BILa(j) increases the potential of the wiring BILa(j) from the potential Vpre by ΔV1.

[Period T33]

In Period T33, the potential of the wiring SP is set to a high level (VH_SP) and the potential of the wiring SN is set to a low level (VL_SN) to bring the sense amplifier 133(j) into an operation state. Bringing the sense amplifier circuit 133(j) into an operation state makes the potential of the wiring BILa(j) closer to the potential of the wiring SP (VH_SP) from Vpre+ΔV1. In addition, the potential of the wiring BILb(j) is made closer to the potential of the wiring SN (VL_SN) from Vpre. Note that the time required for Period T33 is referred to as "writing time" in this specification and the like.

[Period T34]

In Period T34, VL_WL is supplied to the wiring WL(i) to bring the wiring WL(i) into a non-selection state. Specifically, the potential of the wiring WL(i) is set to a low level (VL_WL) to bring the transistor included in the memory cell 221[i,j] into an off state. Thus, the amount of charge corresponding to the potential of the wiring BLa (VH_SP) is retained in the capacitor CA included in the memory cell 221[i,j].

When VL_WL is a negative potential, the transistor M11 can be brought into an off state more surely. A memory device whose data retention time is long even when operated at high temperatures, in particular, can be provided.

Furthermore, the potential of the wiring BGL(i) is decreased in accordance with the change of the potential of the wiring WL(i) into VL_WL. For example, −3 V is supplied to the wiring BGL(i).

Since data reading or writing is not performed in the refresh mode, the input/output circuit 134(i) remains in an off state. Thus, the refresh mode can be performed in a shorter period than the reading mode and the writing mode. Note that the refresh mode of the memory cell 221[i+1,j] can be performed in a manner similar to that of the memory cell 221[i,j].

Note that this embodiment can be implemented in combination with the other embodiments described in this specification as appropriate.

Embodiment 3

Structure examples of the Si transistor that is applicable to the peripheral circuit 111 and the OS transistor that is applicable to the memory cell 211 described in the above embodiment will be described in this embodiment. Note that the Si transistor and the OS transistor are collectively referred to as a semiconductor device in this embodiment.

<Structure Example of Semiconductor Device>

Figure 12:
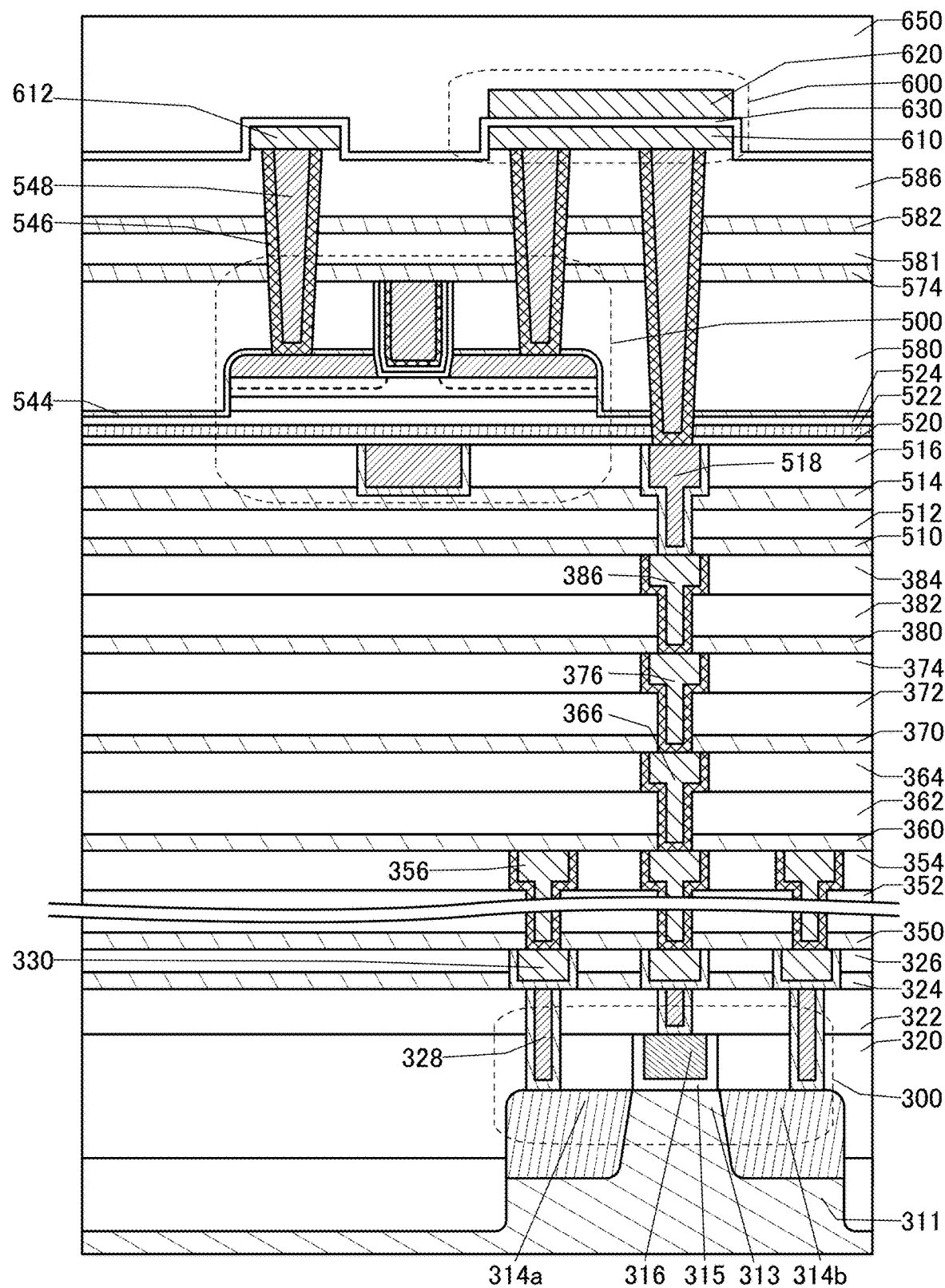
FIG. 12 A cross-sectional view illustrating a structure example of a semiconductor device.
Figure 13A:
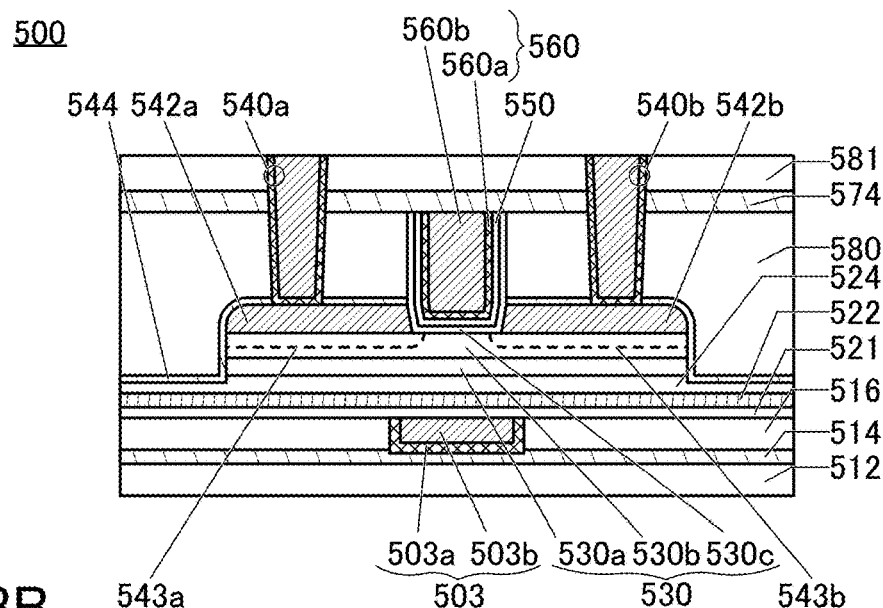
FIG. 13 (A), (B), (C) Cross-sectional views illustrating structure examples of transistors.
Figure 13B:
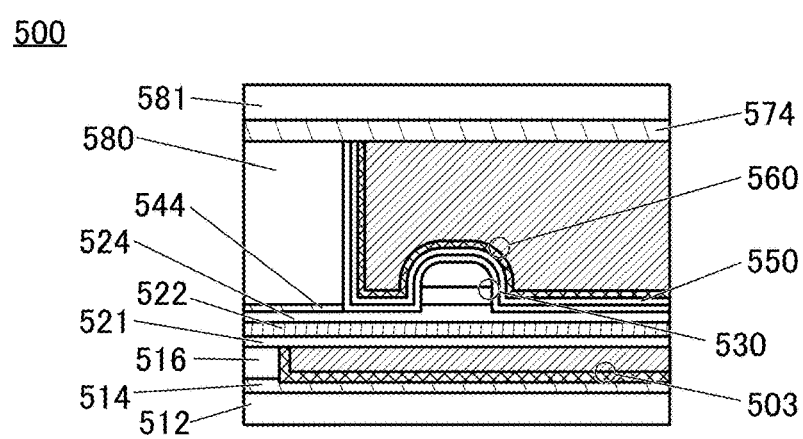
Figure 13C:
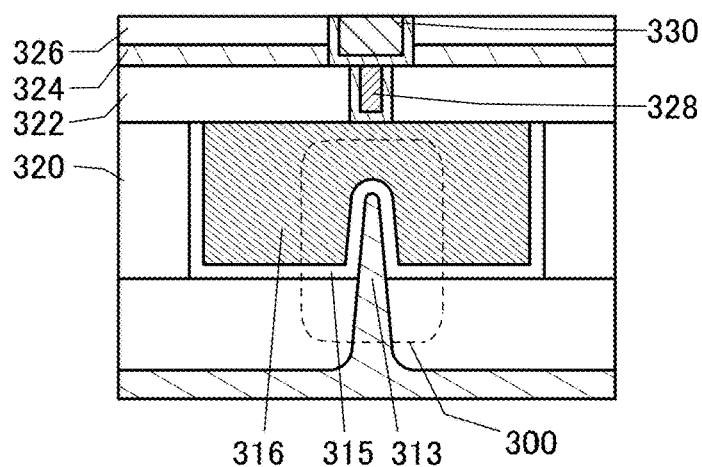

A semiconductor device illustrated in FIG. 12 includes a transistor 300, a transistor 500, and a capacitor 600. FIG. 13(A) is a cross-sectional view of the transistor 500 in the channel length direction, FIG. 13(B) is a cross-sectional view of the transistor 500 in the channel width direction, and FIG. 13(C) is a cross-sectional view of the transistor 300 in the channel width direction.

The transistor 500 is a transistor containing a metal oxide in its channel formation region (OS transistor). Since the off-state current of the transistor 500 is low, a semiconductor device using such a transistor can retain stored data for a long time. In other words, the frequency of refresh operation is extremely low or refresh operation is not required; thus, the power consumption of the semiconductor device can be reduced.

The semiconductor device described in this embodiment includes the transistor 300, the transistor 500, and the capacitor 600 as illustrated in FIG. 12. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 13(C), in the transistor 300, the top surface and a side surface in the channel width direction of the semiconductor region 313 are covered with the conductor 316 with the insulator 315 therebetween. The effective channel width is increased in the Fin-type transistor 300, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 12 is just an example and the structure is not limited thereto; an appropriate transistor can be used in accordance with a circuit configuration or a driving method. For example, as in the transistor 500, a structure in which the transistor 300 is formed using an oxide semiconductor may be employed.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 function as a plug or a wiring. A plurality of conductors functioning as plugs or wirings are collectively denoted by the same reference numeral in some cases. Furthermore, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 12, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that as the conductor having a barrier property against hydrogen, tantalum nitride can be used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 12, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 12, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 12, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for at least one of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 functions as a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIGS. 13(A) and 13(B), the transistor 500 includes the conductor 503 positioned to be embedded in the insulator 512 and the insulator 516; an insulator 521 positioned over the insulator 516 and the conductor 503; an insulator 522 positioned over the insulator 521; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIGS. 13(A) and 13(B), an insulator 544 is preferably positioned between the insulator 580 and the oxide 530a, the oxide 530b, the conductor 542a, and the conductor 542b. In addition, as illustrated in FIGS. 13(A) and 13(B), the conductor 560 preferably includes a conductor 560a provided inside the insulator 550 and a conductor 560b embedded inside the conductor 560a. Moreover, as illustrated in FIGS. 13(A) and 13(B), an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 12 and FIGS. 13(A) and 13(B) is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 sometimes functions as a first gate (also referred to as top gate) electrode. The conductor 503 sometimes functions as a second gate (also referred to as bottom gate or back gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure. Furthermore, in this specification and the like, the surrounded channel (S-channel) structure has a feature in that the side surface and the vicinity of the oxide 530 in contact with the conductor 542a and the conductor 542b functioning as a source electrode and a drain electrode are of I-type like the channel formation region. The side surface and the vicinity of the oxide 530 in contact with the conductor 542a and the conductor 542b are in contact with the insulator 580 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 521, the insulator 522, the insulator 524, and the insulator 550 have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 521 side, which is preferable. Furthermore, the conductor 503 can be prevented from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$ (BST). With miniaturization and high integration of transistors, a problem such as leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 521 be thermally stable. For example, silicon oxide and silicon oxynitride, which have thermal stability, are preferable. Furthermore, when an insulator which is a high-k material is combined with silicon oxide or silicon oxynitride, the insulator 521 having a stacked-layer structure that has thermal stability and a high dielectric constant can be obtained.

Note that the insulator 521, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 13(A), a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. The channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. An oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy analysis (TDS analysis) is used, for example. Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the first gate electrode has a two-layer structure in FIGS. 13(A) and 13(B), a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to prevent a reduction in conductivity of the conductor 560b due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560b is preferably formed using a conductive material containing tungsten, copper, or aluminum as its main component. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably lowered.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used for the insulator 586.

The conductor 546, the conductor 548, and the like are embedded in the insulator 521, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 12, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

Transistor Structure Examples

Note that the structure of the transistor 500 in the semiconductor device described in this embodiment is not limited to the above. Examples of structures that can be used for the transistor 500 will be described below.

Transistor Structure Example 1

Figure 14A:
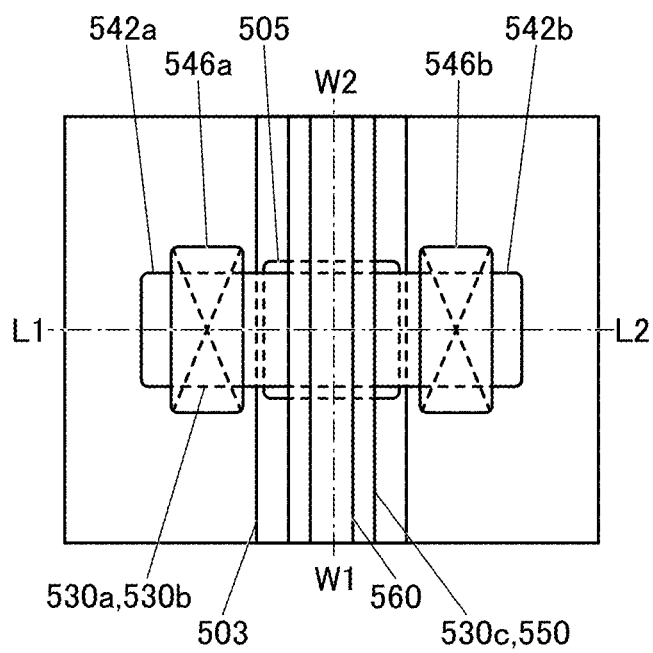
FIG. 14 (A) A top view illustrating a structure example of a transistor, and (B), (C) cross-sectional views illustrating the structure example of the transistor.
Figure 14C:
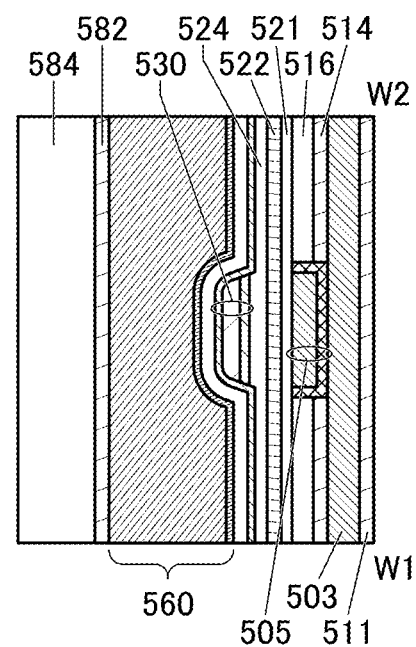
Figure 14B:
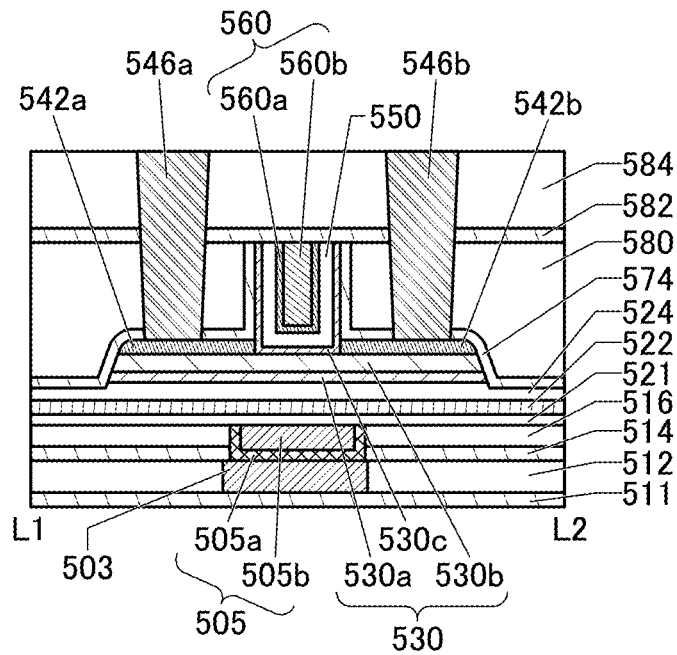

A structure example of a transistor 510A is described with reference to FIGS. 14(A), 14(B), and 14(C). FIG. 14(A) is a top view of the transistor 510A. FIG. 14(B) is a cross-sectional view of a portion indicated by a dashed-dotted line L1-L2 in FIG. 14(A). FIG. 14(C) is a cross-sectional view of a portion indicated by a dashed-dotted line W1-W2 in FIG. 14(A). Note that for clarification of the drawing, some components are not illustrated in the top view of FIG. 14(A).

FIGS. 14(A), 14(B), and 14(C) illustrate a transistor 510A and the insulator 511, the insulator 512, the insulator 514, the insulator 516, the insulator 580, the insulator 582, and an insulator 584 that function as interlayer films. In addition, conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIGS. 14(A), 14(B), and 14(C), the oxide 530c, the insulator 550, and the conductor 560 are positioned in an opening provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side of the insulator 511.

For example, the dielectric constant of the insulator 512 is preferably lower than that of the insulator 511. When a material with a low dielectric constant is used for the interlayer film, the parasitic capacitance generated between wirings can be reduced.

The conductor 503 is formed to be embedded in the insulator 512. Here, the level of the top surface of the conductor 503 and the level of the top surface of the insulator 512 can be substantially the same. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, the threshold voltage of the transistor 510A can be higher than 0 V and the off-state current can be reduced by applying a negative potential to the conductor 505. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 overlap with each other, in the case where a potential is applied to the conductor 560 and the conductor 505, an electric field generated from the conductor 560 and an electric field generated from the conductor 505 are connected and can cover a channel formation region formed in the oxide 530.

That is, the channel formation region can be electrically surrounded by the electric field of the conductor 560 having a function of the first gate electrode and the electric field of the conductor 505 having a function of the second gate electrode. In this specification, a transistor structure in which a channel formation region is electrically surrounded by electric fields of a first gate electrode and a second gate electrode is referred to as a surrounded channel (S-channel) structure.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side of the insulator 514. Moreover, for example, the insulator 516 preferably has a lower dielectric constant than the insulator 514. When a material with a low dielectric constant is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (the above oxygen is less likely to pass). Note that in this specification, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 function as a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

For example, it is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a three-layer stacked structure in FIGS. 14(B) and 14(C), but may have a single-layer structure or a stacked-layer structure of two or four or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide

530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 574 positioned therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 14(B), a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 542. The barrier layer is preferably formed using a material having a barrier property against oxygen or hydrogen. This structure can inhibit oxidation of the conductor 542 at the time of deposition of the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening in the insulator 580 with the oxide 530c and the insulator 574 positioned therebetween.

As miniaturization and high integration of transistors progress, a problem such as leakage current may arise because of thinner gate insulating film. In that case, the insulator 550 may have a stacked-layer structure like the second gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower dielectric constant than the insulator 582. When a material with a low dielectric constant is used for the interlayer films, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers, as in the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and uses a high on-state current can be provided. Alternatively, a semiconductor device using a transistor that contains an oxide semiconductor and has a low off-state current can be provided. Alternatively, a semiconductor device that has small variations in electrical characteristics, stable electrical characteristics, and high reliability can be provided.

Transistor Structure Example 2

Figure 15A:
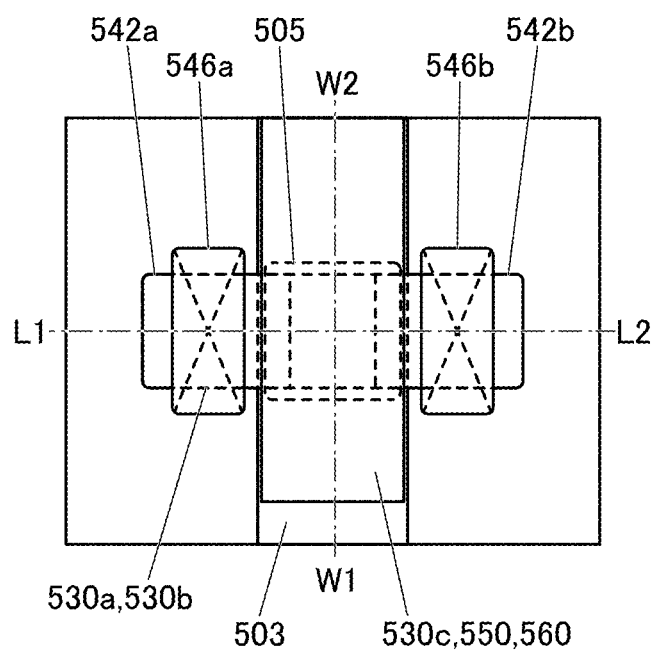
FIG. 15 (A) A top view illustrating a structure example of a transistor, and (B), (C) cross-sectional views illustrating the structure example of the transistor.
Figure 15C:
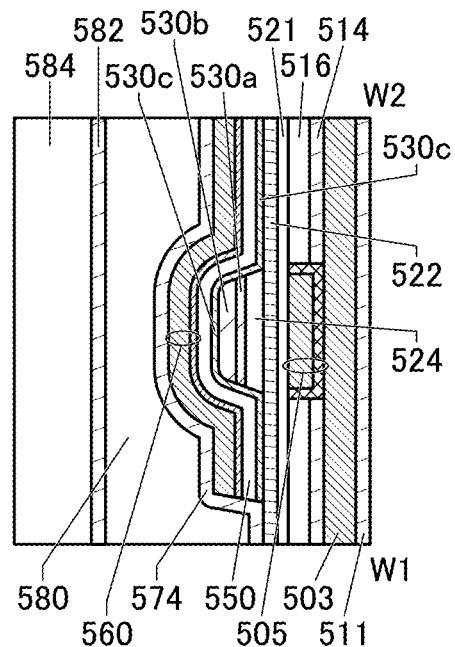
Figure 15B:
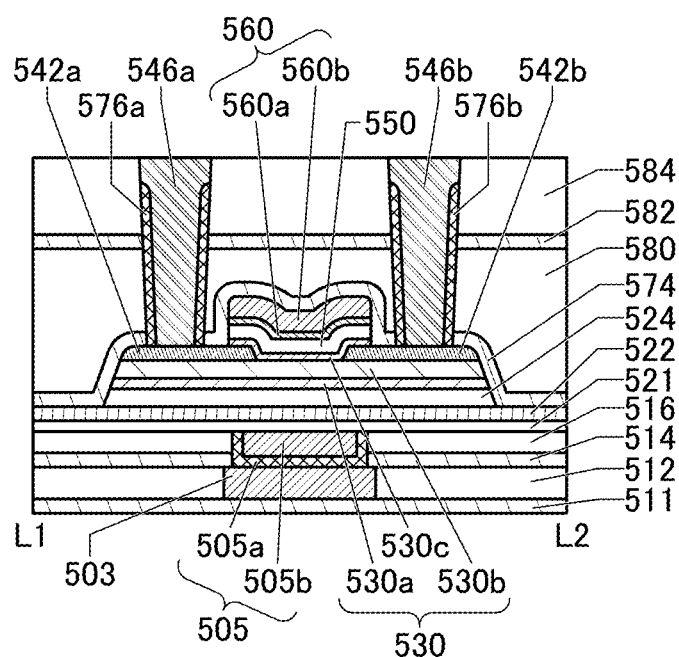

A structure example of a transistor 510B is described with reference to FIGS. 15(A), 15(B), and 15(C). FIG. 15(A) is a top view of the transistor 510B. FIG. 15(B) is a cross-sectional view of a portion indicated by a dashed-dotted line L1-L2 in FIG. 15(A). FIG. 15(C) is a cross-sectional view of a portion indicated by a dashed-dotted line W1-W2 in FIG. 15(A). Note that for clarification of the drawing, some components are not illustrated in the top view of FIG. 15(A).

The transistor 510B is a variation example of the transistor 510A. Therefore, differences from the transistor 510A will be mainly described to avoid repeated description.

The transistor 510B includes a region where the conductor 542 (the conductor 542a and the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and the side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

Transistor Structure Example 3

A structure example of a transistor 510C is described with reference to FIGS. 16(A), 16(B), and 16(C). FIG. 16(A) is a top view of the transistor 510C. FIG. 16(B) is a cross-sectional view of a portion indicated by a dashed-dotted line L1-L2 in FIG. 16(A). FIG. 16(C) is a cross-sectional view of a portion indicated by a dashed-dotted line W1-W2 in FIG. 16(A). Note that for clarification of the drawing, some components are not illustrated in the top view of FIG. 16(A).

The transistor 510C is a variation example of the transistor 510A. Therefore, differences from the transistor 510A will be mainly described to avoid repeated description.

In the transistor 510C illustrated in FIGS. 16(A), 16(B), and 16(C), a conductor 547a is positioned between the conductor 542a and the oxide 530b and a conductor 547b is positioned between the conductor 542b and the oxide 530b. Here, the conductor 542a (the conductor 542b) has a region that extends beyond the top surface and a side surface on the conductor 560 side of the conductor 547a (the conductor 547b) and is in contact with the top surface of the oxide 530b. For the conductor 547, a conductor that can be used for the conductor 542 is used. It is preferred that the thickness of the conductor 547 be at least greater than that of the conductor 542.

In the transistor 510C illustrated in FIGS. 16(A), 16(B), and 16(C), because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIGS. 16(A), 16(B), and 16(C) may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIGS. 14(A), 14(B), and 14(C), in the transistor 510C illustrated in FIGS. 16(A), 16(B), and 16(C), the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

Transistor Structure Example 4

Figure 17A:
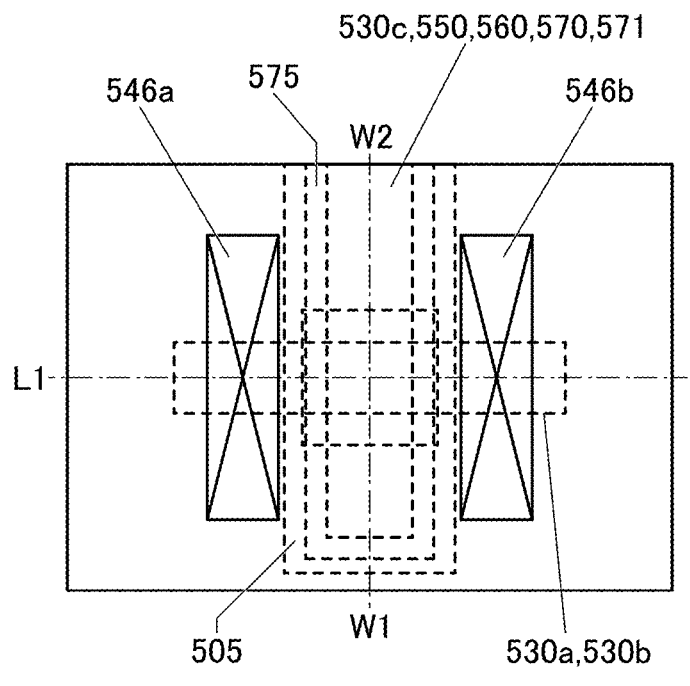
FIG. 17 (A) A top view illustrating a structure example of a transistor, and (B), (C) cross-sectional views illustrating the structure example of the transistor.
Figure 17C:
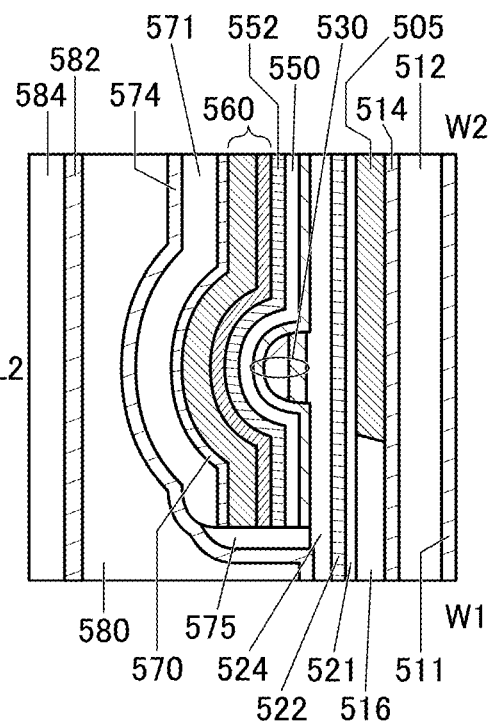
Figure 17B:
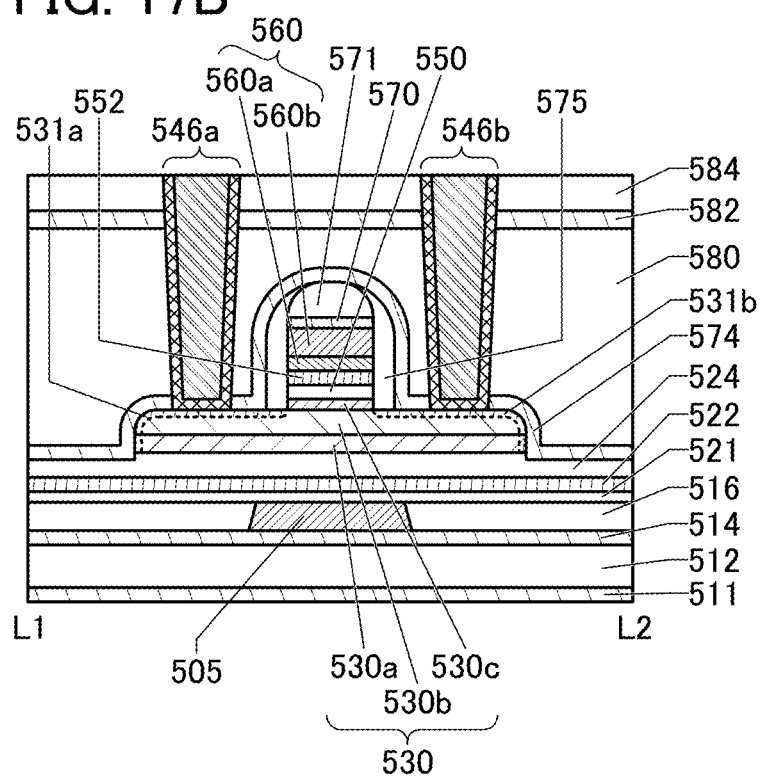

A structure example of a transistor 510D is described with reference to FIGS. 17(A), 17(B), and 17(C). FIG. 17(A) is a top view of the transistor 510D. FIG. 17(B) is a cross-sectional view of a portion indicated by a dashed-dotted line L1-L2 in FIG. 17(A). FIG. 17(C) is a cross-sectional view of a portion indicated by a dashed-dotted line W1-W2 in FIG. 17(A). Note that for clarification of the drawing, some components are not illustrated in the top view of FIG. 17(A).

The transistor 510D is a variation example of the above transistors. Therefore, differences from the above transistors will be mainly described to avoid repeated description.

In FIGS. 17(A) to 17(C), the conductor 503 is not provided and the conductor 505 that has a function of a second gate is made to function also as a wiring. Furthermore, the insulator 550 is provided over the oxide 530c and a metal oxide 552 is provided over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of a first gate. For example, an oxide semiconductor that can be used for the oxide 530 can be used for the metal oxide 552. In this case, when the conductor 560 is deposited by a sputtering method, the metal oxide 552 can have a reduced electric resistance to be a conductive layer. This can be called an OC (Oxide Conductor) electrode.

Note that the metal oxide 552 functions as part of a gate insulating film in some cases. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of the insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water and hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical to a surface of the substrate; specifically, an angle formed by the side surface of the conductor 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water and hydrogen can be deposited. For example, aluminum oxide is preferably used for the insulator 574.

Note that an oxide film obtained by a sputtering method may extract hydrogen from the structure body over which the oxide film is deposited. Thus, the hydrogen concentration in the oxide 530 and the insulator 575 can be reduced when the insulator 574 absorbs hydrogen and water from the oxide 530 and the insulator 575.

Transistor Structure Example 5

Figure 18A:
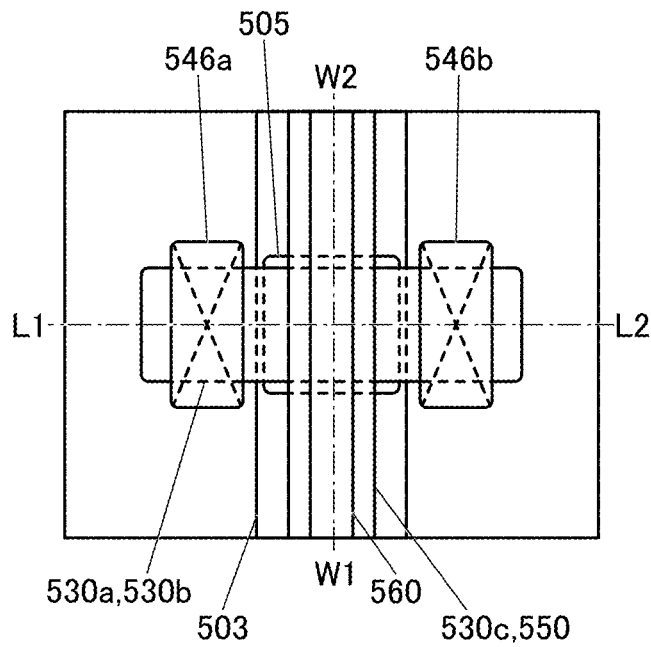
FIG. 18 (A) A top view illustrating a structure example of a transistor, (B), (C) cross-sectional views illustrating the structure example of the transistor.
Figure 18C:
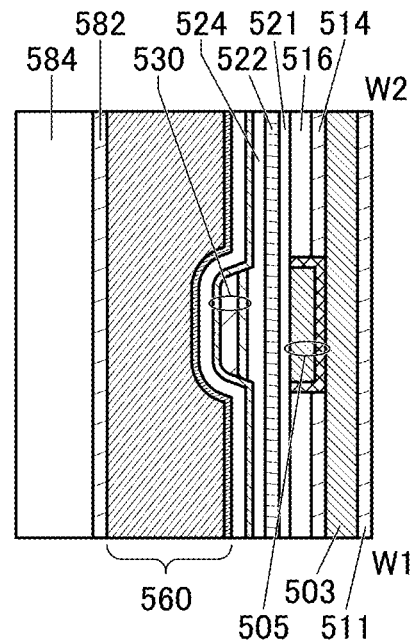
Figure 18B:
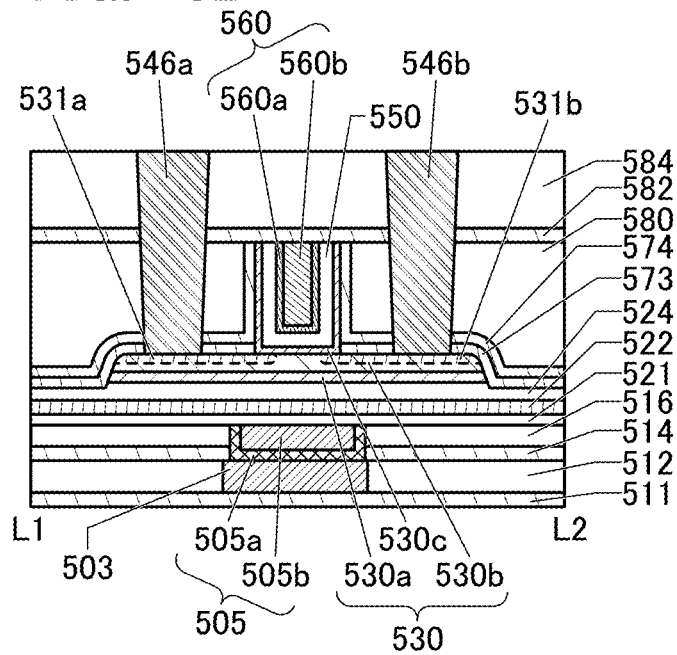

A structure example of a transistor 510E is described with reference to FIG. 18(A) to FIG. 18(C). FIG. 18(A) is a top view of the transistor 510E. FIG. 18(B) is a cross-sectional view of a portion indicated by a dashed-dotted line L1-L2 in FIG. 18(A). FIG. 18(C) is a cross-sectional view of a portion indicated by a dashed-dotted line W1-W2 in FIG. 18(A). Note that for clarification of the drawing, some components are not illustrated in the top view of FIG. 18(A).

The transistor 510E is a variation example of the above transistors. Therefore, differences from the above transistors will be mainly described to avoid repeated description.

In FIGS. 18(A) to 18(C), the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 18(B) are regions where an element to be described later is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas element, or the like may be used. Typical examples of the rare gas element include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the region 531, the oxide 530c, and the insulator 550 overlap with each other.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening provided in the insulator 580, and the region 531 provided in the oxide 530b is partly exposed at the bottom surface of the opening. Next, an oxide film to be the oxide 530c, an insulating film to be the insulator 550, and a conductive film to be the conductor 560 are formed in this order in the opening, and then an oxide film to be the oxide 530c, an insulating film to be the insulator 550, and a conductive film to be the conductor 560 are partly removed by CMP treatment or the like until the insulator 580 is exposed; thus, the transistor illustrated in FIGS. 18(A) to 18(C) can be formed.

Note that the insulator 573 and the insulator 574 are not essential components. Design is appropriately set in consideration of required transistor characteristics.

The cost of the transistor illustrated in FIGS. 18(A) to 18(C) can be reduced because an existing apparatus can be used and the conductor 542 is not provided.

Transistor Structure Example 6

Although FIG. 12 and FIGS. 13(A) and 13(B) illustrate a structure example in which the conductor 560 that functions as a gate is formed in an opening of the insulator 580, a structure in which the insulator is provided above the conductor can be employed, for example. A structure example of such a transistor is illustrated in FIGS. 19(A) and 19(B) and FIGS. 20(A) and 20(B).

Figure 19A:
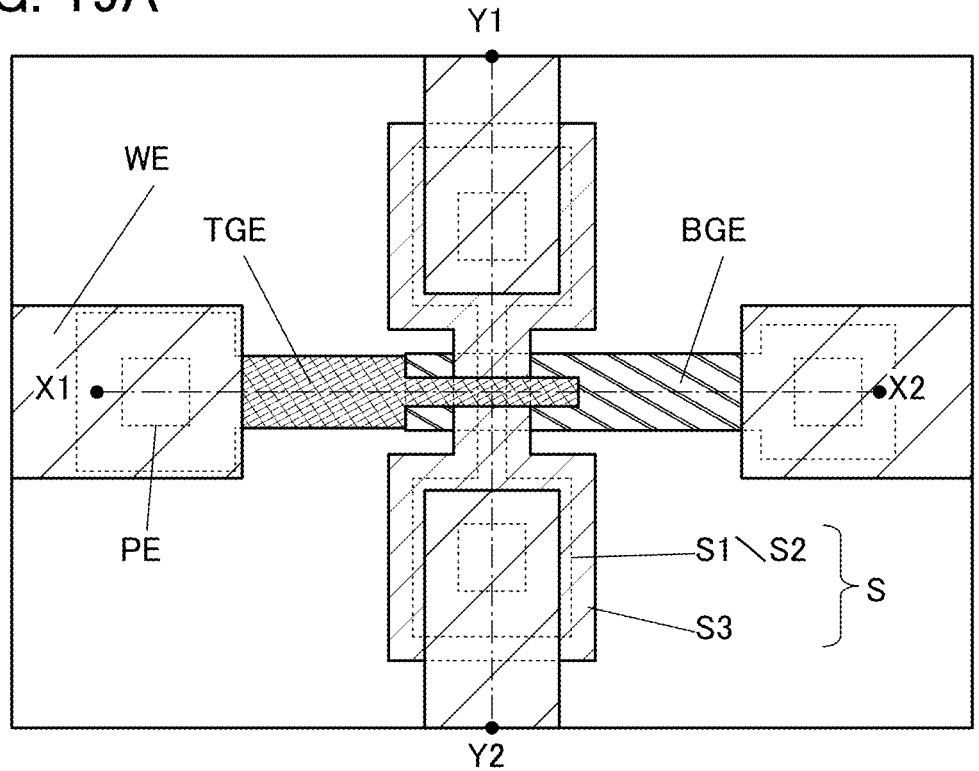
FIG. 19 (A) A top view illustrating a structure example of a transistor, (B) a perspective view illustrating the structure example of the transistor.
Figure 19B:
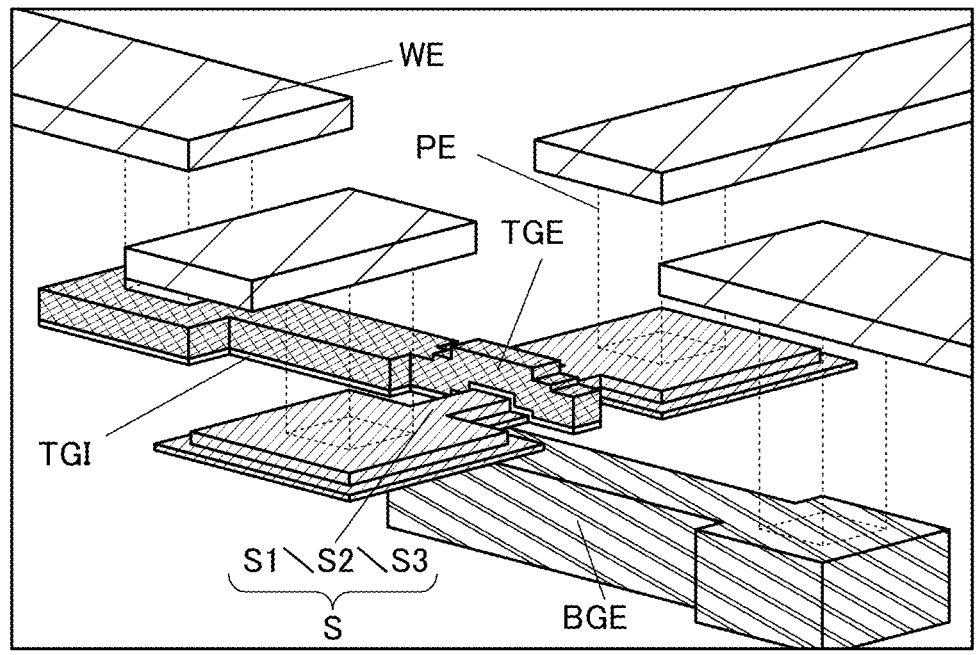
Figure 20A:
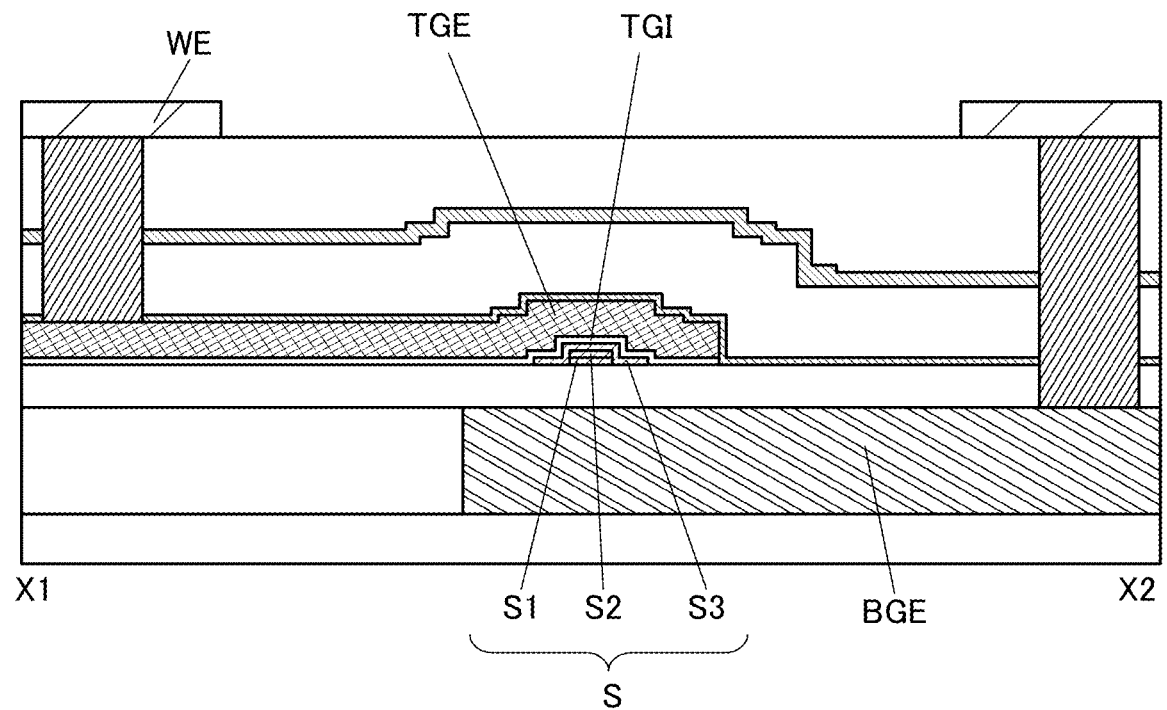
FIG. 20 (A), (B) Cross-sectional views illustrating a structure example of a transistor.
Figure 20B:
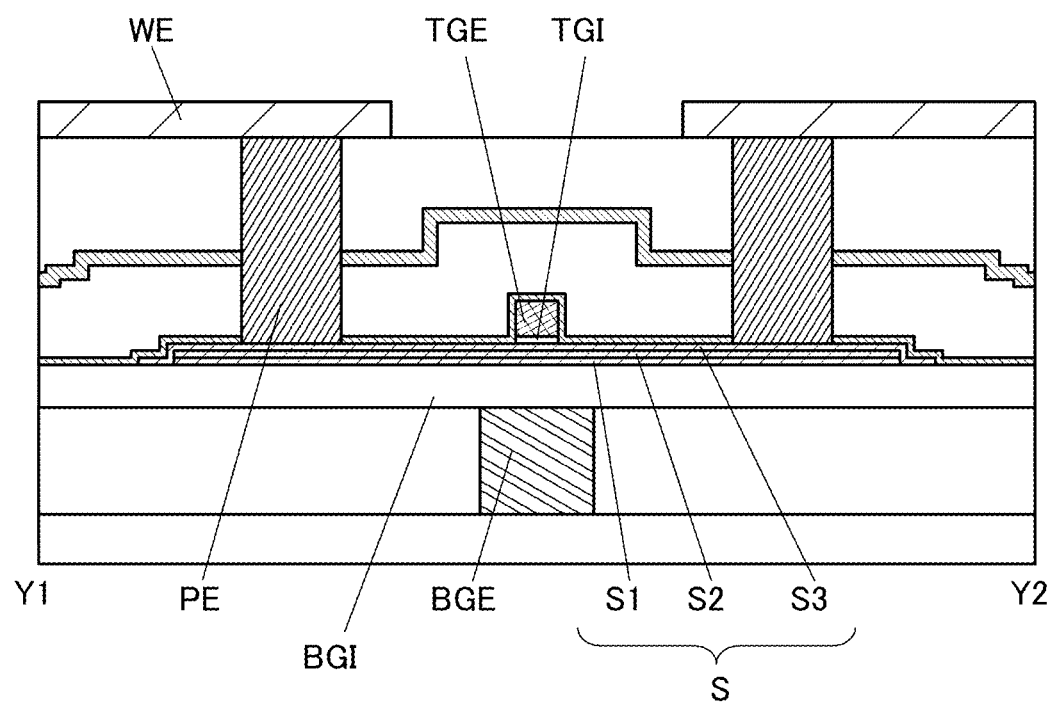

FIG. 19(A) is a top view of a transistor and FIG. 19(B) is a perspective view of the transistor. FIG. 20(A) is a cross-sectional view taken along X1-X2 in FIG. 19(A), and FIG. 20(B) is a cross-sectional view taken along Y1-Y2 in FIG. 19(A).

The transistor illustrated in FIGS. 19(A) and 19(B) and FIGS. 20(A) and 20(B) includes a conductor BGE having a function of a back gate, an insulator BGI having a function of a gate insulating film, an oxide semiconductor S, an insulator TGI having a function of a gate insulating film, a conductor TGE having a function of a front gate, and a conductor WE having a function of a wiring. A conductor PE has a function of a plug for connecting the conductor WE to the oxide S, the conductor BGE, or the conductor TGE. Note that an example in which the oxide semiconductor S includes three layers of oxides 51, S2, and S3 is shown here.

<Electrical Characteristics of Transistors>

Next, electrical characteristics of an OS transistor will be described below. A transistor including a first gate and a second gate is described below as an example. In the transistor including the first gate and the second gate, the threshold voltage can be controlled by applying different potentials to the first gate and the second gate. For example, by applying a negative potential to the second gate, the threshold voltage of the transistor can be higher than 0 V and the off-state current can be reduced. That is, when a negative potential is applied to the second gate electrode, a drain current when the potential applied to the first electrode is 0 V can be reduced.

When impurity such as hydrogen is added to an oxide semiconductor, the carrier density is increased in some cases. For example, hydrogen added to an oxide semiconductor reacts with oxygen bonded to a metal atom to be water, so that an oxygen vacancy is formed in some cases. Entry of hydrogen into the oxygen vacancy increases carrier density. Furthermore, in some cases, bonding of part of hydrogen to oxygen bonded to a metal atom causes generation of an electron serving as a carrier. That is, the oxide semiconductor to which an impurity such as hydrogen is added becomes n-type and has a reduced resistance.

Therefore, the resistance of the oxide semiconductor can be selectively reduced. That is, a region which has a low carrier density and functions as a semiconductor functioning as a channel formation region and a low-resistance region which has a high carrier density and functions as a source region or a drain region can be provided in the oxide semiconductor.

Here, evaluated is the influence of the structure of a low-resistance region and a high-resistance region provided in the oxide semiconductor on electrical characteristics of the transistor in the case where different potentials are applied to the first gate and the second gate.

[Structure of Transistor]

Figure 21A:
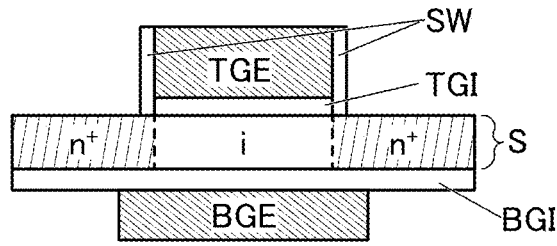
FIG. 21 (A), (C) Cross-sectional views of transistors, (B), (D) diagrams showing the electrical characteristics of the transistors.
Figure 21B:
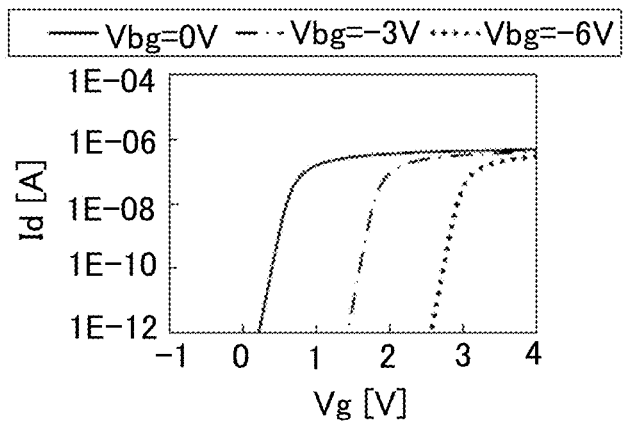
Figure 21C:
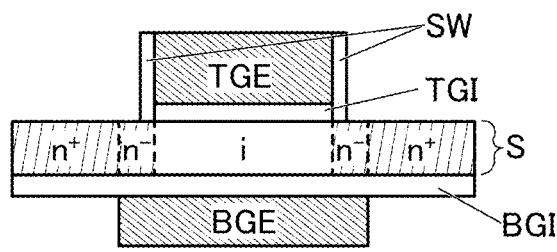

FIGS. 21(A) and 21(C) are each a cross-sectional view of a transistor used for the electrical characteristics evaluation. Note that for clarification of the drawings, some components are not illustrated in FIGS. 21(A) and 21(C).

The transistor illustrated in FIGS. 21(A) and 21(C) includes a conductor TGE that functions as a first gate, an insulator TGI that functions as a first gate insulating film, an insulator SW that functions as a sidewall provided on a side surface of the first gate, an oxide semiconductor S, a conductor BGE that functions as a second gate, and an insulator BGI that functions as a second gate insulating film. The insulator BGI has a three-layer structure formed of a first layer in contact with the conductor BGE, a second layer over the first layer, and a third layer over the second layer. Note that the third layer is in contact with the oxide semiconductor S.

Here, the oxide semiconductor S included in the transistor illustrated in FIG. 21(A) has an $n^+$ region and an i region overlapping with the conductor TGE. On the other hand, the oxide semiconductor S included in the transistor illustrated in FIG. 21(C) has the $n^+$ region, the i region overlapping with the conductor TGE, and an $n^-$ region between the $n^+$ region and the i region.

Note that the $n^+$ region functions as a source region or a drain region and has a high carrier density and reduced resistance. The i region functions as a channel formation region and is a high-resistance region whose carrier density is lower than the $n^+$ region. The $n^-$ region has a lower carrier density than the $n^+$ region and a higher carrier density than the i region.

Although not illustrated, the $n^+$ region of the oxide semiconductor S is in contact with an S/D electrode functioning as a source or a drain.

[Results of Electrical Characteristics Evaluation]

The Id-Vg characteristics of the transistor illustrated in FIG. 21(A) and the transistor illustrated in FIG. 21(C) are calculated to evaluate electrical characteristics of the transistors.

Here, as an index of the electrical characteristics of a transistor, the amount of change (hereinafter also referred to as ΔVsh) in the threshold voltage (hereinafter also referred to as Vsh) of the transistor is used. Note that in the Id-Vg characteristics, Vsh is defined as the value of Vg when Id=1.0×10$^{-12}$ [A] is satisfied.

Note that the Id-Vg characteristics are fluctuation characteristics of current between the source and the drain (hereinafter also referred to as a drain current (Id)) when a potential applied to the conductor TGE functioning as a first gate of the transistor (hereinafter also referred to as a gate potential (Vg)) is changed from a first value to a second value.

Here, evaluated are changes in a drain current (Id) when a potential between a source and a drain (hereinafter also referred to as a drain potential Vd) is set to +0.1 V and a potential between the source and the conductor TGE functioning as a first gate is changed from −1 V to +4 V.

A device simulator "ATLAS" developed by Silvaco Inc. is used for the calculation. The following table lists parameters used for the calculation. Note that Eg represents an energy gap, Nc represents the effective density of states in the conduction band, and Nv represents the effective density of states in the valence band.

TABLE 1

| | Software | Atlas 2D, Silvaco, Inc. | |
|---|---|---|---|
| | Structure | Channel length (L) | 350 nm |
| | | Channel width (W) | 350 nm |
| | BGE | Work function | 5.0 eV |
| | | Thickness (wiring) | 20 nm |
| | | Length in L-direction | 510 nm |
| BGI | 3rd layer | Relative permittivity | 4.1 |
| | | Thickness | 10 nm |
| | 2$^{nd}$ layer | Relative permittivity | 16.4 |
| | | Thickness | 10 nm |
| | 1$^{st}$ layer | Relative permittivity | 4.1 |
| | | Thickness | 10 nm |
| | OS | Electron affinity | 4.5 eV |
| | | Eg | 2.9 eV |
| | | Relative permittivity | 15 |
| | | Electron mobility | 20 cm$^2$/Vs |
| | | Hole mobility | 0.01 cm$^2$/Vs |
| | | Nc | 5E+18 cm$^{-3}$ |
| | | Nv | 5E+18 cm$^{-3}$ |
| | | Thickness | 15 nm |
| | n+ region | Length in L-direction | 655 or 700 nm |
| | | Carrier concentration | 5E+18 cm$^{-3}$ |
| | n− region | Length in L-direction | 45 or 0 nm |
| | | Carrier concentration | 1E+17 cm$^{-3}$ |
| | TGI | Relative permittivity | 4.1 |
| | | Thickness | 10 nm |
| | SW | Relative permittivity | 4.1 |
| | | Width | 15 nm |
| | TGE | Work function | 5.0 eV |
| | | Thickness | 20 nm |
| | | Length in L-direction | 350 nm |
| | S/D electrode | Work function | 4.5 eV |

In the transistor illustrated in FIG. 21(A), one of the n$^+$ regions is set to 700 nm, and one of the n$^-$ regions is set to 0 nm. In the transistor illustrated in FIG. 21(C), one of the n$^+$ regions is set to 655 nm and one of the n$^-$ regions is set to 45 nm. Each of the transistor illustrated in FIG. 21(A) and the transistor illustrated in FIG. 21(C) has a structure in which the second gate is larger than the i region. Note that in this evaluation, a potential of the conductor BGE functioning as a second gate (hereinafter also referred to as a backgate potential (Vbg)) is set to 0.00 V, −3.00 V, or −6.00 V.

FIG. 21(B) shows the results of the Id-Vg characteristics obtained by the calculation of the transistor illustrated in FIG. 21(A). The amount of change in the threshold voltage (ΔVsh) of the transistor when the backgate potential is set to −3.00 V is +1.2 V as compared with that when the backgate potential is set to 0.00 V. The amount of change in the threshold voltage (ΔVsh) of the transistor when the backgate potential is set to −6.00 V is +2.3 V as compared with that when the backgate potential is set to 0.00 V. That is, the amount of change in the threshold voltage (ΔVsh) of the transistor when the backgate potential is set to −6.00 V is +1.1 V as compared with that when the backgate potential is set to −3.00 V. Therefore, even when the potential of the conductor BGE functioning as a second gate is made higher, the amount of change in the threshold voltage of the transistor is hardly changed. In addition, even when the backgate potential is increased, the rising characteristics are not changed.

Figure 21D:
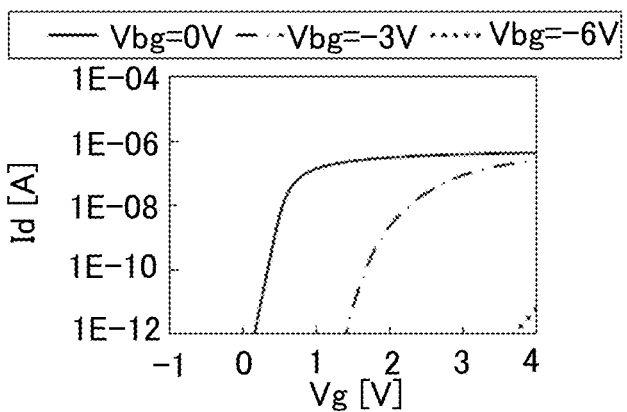

FIG. 21(D) shows the results of the Id-Vg characteristics obtained by the calculation of the transistor illustrated in FIG. 21(C). The amount of change in the threshold voltage (ΔVsh) of the transistor when the backgate potential is set to −3.00 V is +1.2 V as compared with that when the backgate potential is set to 0.00 V. The amount of change in the threshold voltage (ΔVsh) of the transistor when the backgate potential is set to −6.00 V is +3.5 V as compared with that when the backgate potential is set to 0.00 V. That is, the amount of change in the threshold voltage (ΔVsh) of the transistor when the backgate potential is set to −6.00 V is +2.3 V as compared with that when the backgate potential is set to −3.00 V. Therefore, the higher the potential of the conductor BGE functioning as a second gate is made, the larger the amount of change in the threshold voltage of the transistor becomes. As the backgate potential is increased, the rising characteristics become worse.

As described above, it is found that in the transistor illustrated in FIG. 21(C), the higher the potential of the conductor BGE functioning as a second gate is made, the larger the amount of change in the threshold voltage of the transistor becomes. By contrast, in the transistor illustrated in FIG. 21(A), the amount of change in the threshold voltage of the transistor is not changed even when the potential of the conductor BGE functioning as a second gate is increased.

Note that this embodiment can be implemented in combination with the other embodiments described in this specification as appropriate.

Embodiment 4

In this embodiment, the composition of a metal oxide that can be used in the OS transistor described in the above embodiment will be described.

<Composition of Metal Oxide>

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

<Structure of Metal Oxide>

Oxide semiconductors are classified into a single-crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

As an oxide semiconductor used for a semiconductor of the transistor, a thin film having high crystallinity is preferably used. With the use of the thin film, the stability or the reliability of the transistor can be improved. Examples of the thin film include a thin film of a single-crystal oxide semiconductor and a thin film of a polycrystalline oxide semiconductor. However, for forming the thin film of a single-crystal oxide semiconductor or the thin film of a polycrystalline oxide semiconductor over a substrate, a high-temperature process or a laser heating process is needed. Thus, the manufacturing cost is increased, and in addition, the throughput is decreased.

Non-Patent Document 2 and Non-Patent Document 3 have reported that an In—Ga—Zn oxide having a CAAC structure (referred to as CAAC-IGZO) was found in 2009. It has been reported that CAAC-IGZO has c-axis alignment, a crystal grain boundary is not clearly observed, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 4). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 5 and Non-Patent Document 6 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, the transistor having high field-effect mobility can be achieved. In addition, the transistor having high reliability can be achieved.

Non-Patent Document 7 shows that the transistor using an oxide semiconductor has an extremely low leakage current in a non-conduction state; specifically, the off-state current per micrometer in the channel width of the transistor is of the order of yA/μm ($10^{-24}$ A/μm). For example, a low-power-consumption CPU utilizing a characteristic of a low leakage current of the transistor using an oxide semiconductor is disclosed (see Non-Patent Document 8).

Furthermore, application of a transistor using an oxide semiconductor to a display device that utilizes the characteristic of a low leakage current of the transistor has been reported (see Non-Patent Document 9). In the display device, a displayed image is changed several tens of times per second. The number of times an image is changed per second is called a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

Furthermore, an oxide semiconductor with a low carrier density is preferably used for the transistor. In the case where the carrier density of an oxide semiconductor film is reduced, the impurity concentration in the oxide semiconductor film is reduced to reduce the density of defect states. In this specification and the like, a state with a low impurity concentration and a low density of defect states is referred to as a highly purified intrinsic or substantially highly purified intrinsic state. For example, an oxide semiconductor has a carrier density lower than $8\times10^{11}$/cm$^3$, preferably lower than $1\times10^{11}$/cm$^3$, and further preferably lower than $1\times10^{10}$/cm$^3$, and higher than or equal to $1\times10^{-9}$/cm$^3$.

Moreover, a highly purified intrinsic or substantially highly purified intrinsic oxide semiconductor film has a low density of defect states and accordingly may have a low density of trap states.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon that is a Group 14 element is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are set to lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is set to lower than or equal to $1\times10^{18}$ atoms/cm$^3$, preferably lower than or equal to $2\times10^{16}$ atoms/cm$^3$.

Furthermore, when containing nitrogen, the oxide semiconductor easily becomes n-type by generation of electrons serving as carriers and an increase in carrier density. As a result, a transistor using an oxide semiconductor containing nitrogen as a semiconductor is likely to have normally-on characteristics. Thus, nitrogen in the oxide semiconductor is preferably reduced as much as possible; for example, the nitrogen concentration in the oxide semiconductor is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of a low leakage current of the transistor have been studied.

Note that this embodiment can be implemented in combination with the other embodiments described in this specification as appropriate.

Embodiment 5

In this embodiment, a product image and examples of electronic devices in which the memory device described in the above embodiment can be used will be described.
<Product Image>

Figure 22:
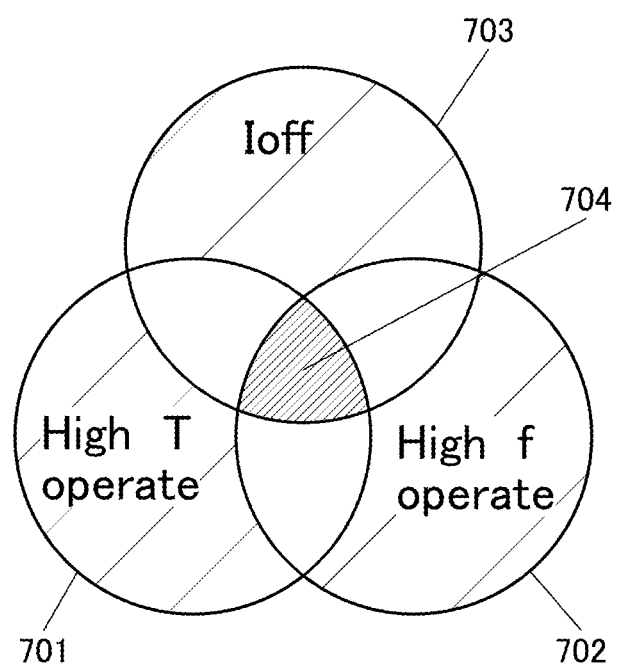
FIG. 22 A diagram illustrating a product image.

First, FIG. 22 illustrates a product image applicable to the memory device according to one embodiment of the present invention. A region 701 illustrated in FIG. 22 represents high temperature characteristics (High T operate), a region 702 represents high frequency characteristics (High f operate), a region 703 represents low off characteristics (Ioff), and a region 704 represents a region where the region 701, the region 702, and the region 703 overlap one another.

Note that when the region 701 is intended to be satisfied, it can be roughly satisfied by using a carbide or a nitride such as silicon carbide or gallium nitride for a channel formation region of a transistor. When intended to be satisfied, the region 702 can be roughly satisfied by using a silicide such as single crystal silicon or crystalline silicon for a channel formation region of a transistor. In addition, when intended to be satisfied, the region 703 can be roughly satisfied by using an oxide semiconductor or a metal oxide for a channel formation region of a transistor.

The memory device according to one embodiment of the present invention can be favorably used for a product in the range represented by the region 704, for example.

A conventional product has difficulty in satisfying all of the region 701, the region 702, and the region 703. However, a transistor included in the memory device according to one embodiment of the present invention includes a crystalline OS in a channel formation region. In the case where the crystalline OS is included in the channel formation region, a memory device and an electronic device satisfying high temperature characteristics, high frequency characteristics, and low off characteristics can be provided.

Note that examples of a product in the range represented by the region 704 are an electronic device including a low-power consumption and high-performance CPU, an in-car electronic device required to have high reliability in a high-temperature environment, and the like. Specifically, FIGS. 23(A), 23(B), 23(C), 23(D), 23(E1), and 23(E2) illustrate examples of electronic devices each including a memory device according to one embodiment of the present invention.
<Electronic Device>

The memory device according to one embodiment of the present invention can be provided in a variety of electronic devices. In particular, the memory device according to one embodiment of the present invention can be used as a memory incorporated in an electronic device. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or notebook personal computer, a monitor for a computer and the like, digital signage, and a large game machine like a pachinko machine.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIGS. 23(A), 23(B), 23(C), 23(D), 23(E1), and 23(E2) illustrate examples of electronic devices.

FIG. 23(A) illustrates a mobile phone (smartphone) which is a type of an information terminal. The information terminal 5500 includes a housing 5510 and a display portion 5511. As input interfaces, a touch panel and a button are provided in the display portion 5511 and the housing 5510, respectively.

FIG. 23(B) illustrates a desktop information terminal 5300. The desktop information terminal 5300 includes a main body 5301 of the information terminal, a display 5302, and a keyboard 5303.

Note that although FIGS. 23(A) and 23(B) illustrate a smartphone and a desktop information terminal, respectively, as examples of the electronic device in the above description, an information terminal other than a smartphone and a desktop information terminal can be used. Examples of information terminals other than a smartphone and a desktop information terminal include a PDA (Personal Digital Assistant), a notebook information terminal, and a workstation.

FIG. 23(C) illustrates an electric refrigerator-freezer 5800 which is an example of an electrical appliance. The electric refrigerator-freezer 5800 includes a housing 5801, a refrigerator door 5802, a freezer door 5803, and the like.

Although the electric refrigerator-freezer is described here as an electrical appliance in this example, other examples of electrical appliances include a vacuum cleaner, a microwave oven, an electric oven, a rice cooker, a water heater, an IH cooker, a water server, heating and cooling equipment such as an air conditioner, a washing machine, a drying machine, and an audio visual appliance.

FIG. 23(D) illustrates a portable game machine 5200 as an example of a game machine. The portable game machine includes a housing 5201, a display portion 5202, a button 5203, and the like.

Although the portable game machine is illustrated as an example of a game machine in FIG. 23(D), game machines in which the memory device according to one embodiment of the present invention can be used are not limited thereto. Examples of game machines in which the memory device according to one embodiment of the present invention can be used include a home stationary game console, an arcade game machine installed in an entertainment facility (a game center, an amusement park, or the like), and a throwing machine for batting practice installed in sports facilities.

FIG. 23(E1) illustrates an automobile 5700 as an example of a moving vehicle, and FIG. 23(E2) is a diagram illustrating the periphery of a windshield inside the automobile. FIG. 23(E2) illustrates a display panel 5701, a display panel 5702, and a display panel 5703 that are attached to a dashboard and a display panel 5704 that is attached to a pillar.

The display panel 5701 to the display panel 5703 can provide various kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (blind areas) by projecting an image taken by an imaging device (not illustrated) provided for the automobile 5700. That is, displaying an image taken by the imaging device provided on the outside of the automobile 5700 leads to elimination of blind areas and enhancement of safety. In addition, projecting an image so as to compensate for the area which cannot be seen makes it possible to confirm safety naturally and comfortably. The display panel 5704 can also be used as a lighting device.

Although an automobile is described above as an example of a moving vehicle, moving vehicles are not limited to automobiles. Examples of moving vehicles include a train, a monorail train, a ship, and a flying object (a helicopter, an unmanned aircraft (a drone), an airplane, and a rocket), and these moving vehicles can include the memory device according to one embodiment of the present invention is used for the moving vehicles.

The memory device according to one embodiment of the present invention can retain data for a long time even in a high-temperature environment and can operate at high speed even in a low-temperature environment. The use of the memory device according to one embodiment of the present invention in the above-described various electronic devices can provide highly reliable electronic devices that can surely operate either in a high-temperature environment or in a low-temperature environment. Moreover, power consumption of an electronic device can be reduced.

Note that this embodiment can be implemented in combination with the other embodiments described in this specification as appropriate.

Example 1

In this example, the operation frequency of the memory cell 211 described in Embodiment 1 was estimated. Note that in this example, an OS transistor is used as the transistor M11 included in the memory cell 211, and thus the memory cell 211 forms a DOSRAM.

An "allowable voltage fluctuation", which is one of specifications required for a DOSRAM, is the allowable amount of fluctuation of a voltage applied to the capacitor of a DOSRAM after data writing. A "data retention time" of a DOSRAM is the time it takes for the fluctuation amount of a voltage applied to the capacitor included in the DOSRAM to reach the allowable voltage fluctuation. In this example, the "allowable voltage fluctuation" was 0.2 V, and the "data retention time" was the time taken for a voltage applied to the capacitor (a storage capacitance of 3.5 fF) to decrease by 0.2 V from the state after data writing. For example, in this example, DOSRAM data retention of one hour means that the time it takes for a potential applied to the capacitor included in the DOSRAM to decrease by 0.2 V after data writing is one hour.

The data retention time of a DOSRAM depends on the amount of cutoff current of the transistor included in the DOSRAM. Here, the cutoff current of the transistor can be replaced with a drain current $I_D$ (hereinafter referred to as Icut) at a gate voltage $V_G$ of 0 V. For example, in the case where the data retention characteristic of a DOSRAM depends on only the amount of Icut of a transistor included in the DOSRAM, the data retention time of the DOSRAM is inversely proportional to the amount of Icut of the transistor included in the DOSRAM.

Figure 24:
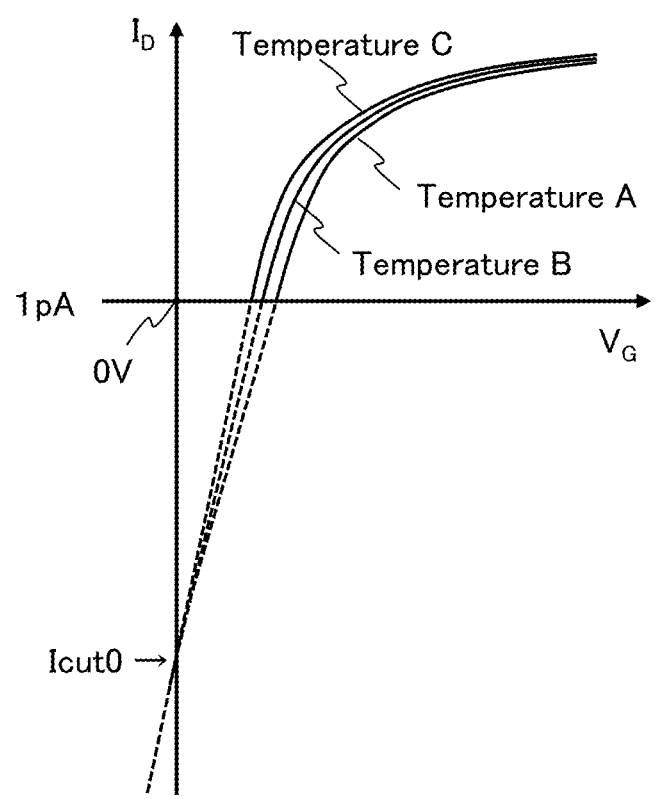
FIG. 24 A diagram showing temperature dependence of $V_G$-$I_D$ characteristics of a transistor.

In the case where Icut of the transistor included in the DOSRAM is known, the data retention time of the DOSRAM can be calculated by dividing the amount of charge lost from the capacitor during data retention (0.7 fC corresponding to the product of the capacitor's storage capacitance (3.5 fF) and the amount of decrease of the voltage applied to the capacitor (0.2 V)) by Icut. Furthermore, when a DOSRAM retention time target is set and the above charge amount 0.7 fC is divided by the retention time, a value of Icut required for the transistor included in the DOSRAM (hereinafter referred to as Icut0) can be estimated. When the retention time target is one hour, Icut required for the transistor was approximately 200 zA (200× $10^{-21}$ A). By adjusting the backgate voltage so that Icut0 shown in FIG. 24 becomes 200 zA, a DOSRAM having high data retention characteristics and a high operation frequency in a wide temperature range can be achieved. In this example, the relation between the backgate voltage and the operation frequency of the DOSRAM was evaluated.

In order to estimate the operation frequency of the DOSRAM, a transistor having a structure similar to that of the transistor 500 illustrated in FIGS. 13(A) and 13(B) (hereinafter referred to as Sample 1) was fabricated, and parameters necessary for the estimation were extracted from the electrical characteristics. In this example, the transistor 500 was assumed as the transistor M11 in FIG. 2(B), and the operation frequency of the DOSRAM was estimated.

First, a structure of Sample 1 will be described. As illustrated in FIGS. 13(A) and 13(B), Sample 1 includes the insulator 524 provided over a substrate (not illustrated); the oxide 530*a* provided over the insulator 524; the oxide 530*b* provided over the oxide 530*a*; the oxide 530*c* provided over the oxide 530*b*; the insulator 550 provided over the oxide 530*c*; and the conductor 560 (the conductor 560*a* and the conductor 560*b*) provided over the insulator 550.

As the insulator 524, 35-nm-thick silicon oxynitride was used.

As the oxide 530*a*, 5-nm-thick In—Ga—Zn oxide deposited by a DC sputtering method was used. In the deposition of the oxide 530a, a target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As the oxide 530b, 20-nm-thick In—Ga—Zn oxide deposited by a DC sputtering method was used. In the deposition of the oxide 530b, a target with In:Ga:Zn=4:2:4.1 [atomic ratio] was used; an argon gas at 30 sccm and an oxygen gas at 15 sccm were used as a deposition gas; the deposition pressure was 0.7 Pa; the deposition power was 500 W; the substrate temperature was 200° C.; and the distance between the target and the substrate was 60 mm.

As the oxide 530c, 5-nm-thick In—Ga—Zn oxide deposited by a DC sputtering method was used. In the deposition of the oxide 530c, a target with In:Ga:Zn=4:2:4.1 [atomic ratio] was used; an oxygen gas at 45 sccm was used as the deposition gas; the deposition pressure was 0.7 Pa; the deposition power was 500 W; the substrate temperature was 130° C.; and the distance between the target and the substrate was 60 mm.

As the insulator 550, 8-nm-thick silicon oxynitride was used. As the conductor 560a, 10-nm-thick titanium nitride was used. As the conductor 560b, tungsten was used.

Sample 1 having the above structure is a transistor having a channel length of 0.37 µm and a channel width of 0.24 µm. Note that like the transistor 500, Sample 1 includes the insulator 514, the insulator 516, the conductor 503, the insulator 522, the conductor 542, an insulator 554, the conductor 540, the insulator 580, the insulator 574, the insulator 581, and the like, in addition to the above components.

Next, $I_D$-$V_G$ measurement was performed on the transistor 500 of Sample 1. The $I_D$-$V_G$ measurement was performed under conditions where a drain potential $V_D$ of the transistor was +1.08 V, a source potential $V_S$ was 0 V, and a gate potential $V_G$ was swept from −1.0 V to +3.3 V. The backgate voltage $V_{BG}$ was −7.1 V. Measurement temperatures were six levels: −37° C., 27° C., 83° C., 121° C., 144° C., and 192° C. Specifically, $I_D$-$V_G$ measurement of the transistor was performed in a state in which a 5-inch-square substrate where the transistor subjected to the measurement was formed was fixed on a thermochuck set at each of the above temperatures. In addition, three elements were measured at each backgate voltage $V_{BG}$ and each measurement temperature.

A shift voltage (Vsh) and a subthreshold swing value (Svalue) of the transistor were calculated from the obtained $I_D$-$V_G$ curve. Furthermore, Svalue refers to the amount of change in a gate voltage which makes the drain current change by one order of magnitude in a subthreshold region at a constant drain voltage.

In the transistor 500, a metal oxide is used in a channel formation region as described in the above embodiment. A transistor using a metal oxide in a channel formation region has an extremely low leakage current in a non-conduction state, compared with a transistor using Si in a channel formation region, for example. For that reason, in the transistor using a metal oxide in the channel formation region, it is sometimes difficult to detect Icut by actual measurement. Since it was difficult to actually measure Icut of the transistor 500, Icut was estimated from Vsh and Svalue, which were obtained from the above $I_D$-$V_G$ curve, by extrapolation using Formula (1). Note that as shown in Formula (1), $I_D$ was assumed to decrease monotonically according to Svalue until the off-state current of the transistor reaches $V_G$=0 V.

[Formula 1]

$$I_{cut} = 1 \times 10^{\left(-12 - \frac{V_{sh}}{S_{value}}\right)} \tag{1}$$

Next, $I_D$-$V_S$ measurement of the transistor 500 was performed.

Here, a method of estimating the DOSRAM operation frequency is described. The DOSRAM operation frequency is the inverse of a data write cycle time of the DOSRAM. The data write cycle time of the DOSRAM is a parameter set by a charging time of the capacitor included in the DOSRAM, for example. In this example, the time corresponding to 40% of the data write cycle time of the DOSRAM (the inverse of the DOSRAM operation frequency) is set as the charging time of the capacitor included in the DOSRAM.

The DOSRAM operation frequency depends on the charging time of the capacitor included in the DOSRAM. Therefore, when estimating the DOSRAM operation frequency, first, it is necessary to know the charging time of the capacitor included in the DOSRAM in advance. In this example, a state where a potential of 0.52 V or higher is applied to the capacitor (a storage capacitance of 3.5 fF) included in the DOSRAM was defined as "a charged state" of the capacitor. Accordingly, in this example, the time from when DOSRAM data write operation starts until when the potential applied to the capacitor reaches 0.52 V corresponds to the charging time of the capacitor included in the DOSRAM.

Figure 25A:
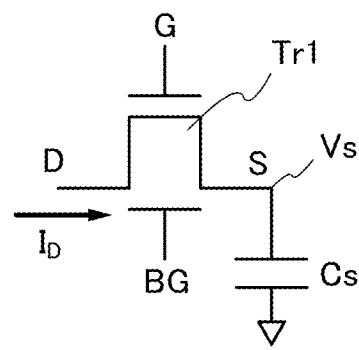
FIG. 25 (A), (B), (C) Diagrams illustrating a method for calculating operation frequency.

The charging time of the capacitor included in the DOSRAM depends on the amount of $I_D$ of the transistor included in the DOSRAM at the time of DOSRAM data writing. Hence, in this example, DOSRAM data write operation was reproduced by actual application of a potential assumed to be applied to the transistor included in the DOSRAM at the time of DOSRAM data writing (see FIG. 25(A)) to the transistor (L/W=0.37/0.24 µm) according to one embodiment of the present invention, and $I_D$ of the transistor at that time was measured. In FIG. 25(A), the case where data is written to the capacitor CA in FIG. 2(B) through the transistor M11 is assumed (a capacitor corresponding to the capacitor CA in FIG. 2(B) is denoted by Cs in FIG. 25(A)). D represents a drain, G represents a gate, and S represents a source. The potential of the source of a transistor Tr1 (a voltage applied to the capacitor Cs) is represented by $V_S$. By turning on the transistor Tr1, the current $I_D$ flows and the capacitor Cs is charged. Specifically, $I_D$ of the transistor was measured under conditions where the gate potential $V_g$ of the transistor was +2.97 V, the drain potential $V_d$ was +1.08 V, and the source potential $V_S$ was swept from 0 V to +1.2 V. The backgate voltage $V_{BG}$ was −7.1 V. Measurement temperatures were six levels: −37° C., 27° C., 83° C., 121° C., 144° C., and 192° C.

Note that the structure of the DOSRAM was assumed to include a transistor having a channel length (L) of 60 nm and a channel width (W) of 60 nm and a capacitor having a storage capacitance of 3.5 fF. Thus, the value of $I_D$ obtained from the transistor 500 (L/W=0.37 µm/0.24 µm) was corrected to correspond to the size of a transistor (L/W=60/60 nm) that was assumed to be included in the DOSRAM.

Figure 25B:
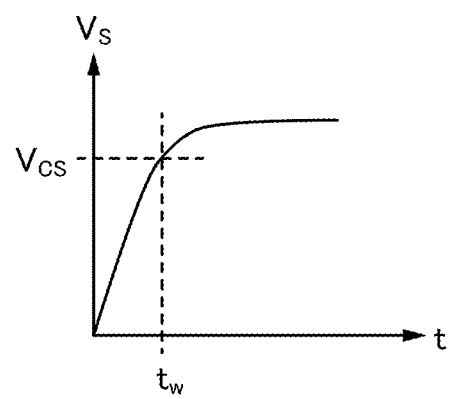

Charging is regarded as being complete when $V_S$ reaches a write judgement voltage $V_{CS}$ after DOSRAM charging is started. The time in that moment is denoted as a charging time $t_W$ (see FIG. 25(B)). When a charge stored in a capacitor that is included in the DOSRAM and has a storage capacitance Cs [F] is Q [C], the charging time is $t_W$ [sec], a potential applied to the capacitor by charging is $V_{CS}$ (=Vs) [V], and the drain current of the transistor included in the DOSRAM is $I_D$ [A], the relation of Formula (2) shown below is established between the parameters.

[Formula 2]

$$Q = \int_0^{t_W} I_D dt = C_S \times V_{CS} \quad (2)$$

Figure 25C:
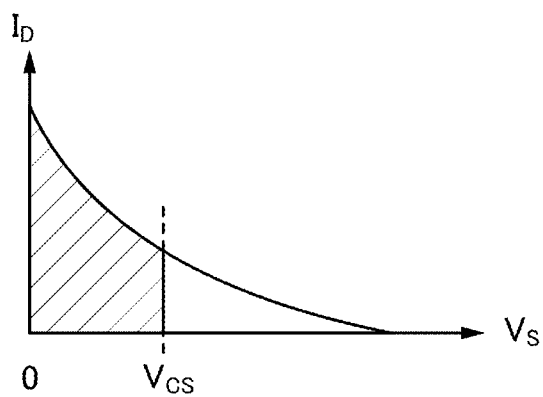

By modification of Formula (2), the charging time $t_W$ of the capacitor included in the DOSRAM can be represented by Formula (3) shown below (see FIG. 25(C)).

[Formula 3]

$$t_W = \int_0^{V_{CS}} \frac{C_S}{I_D} dV_S \quad (3)$$

In this example, 3.5 fF was substituted for Cs in Formula (3), +0.52 V was substituted for $V_{CS}$, and $I_D$ obtained from the above $I_D$-$V_S$ measurement was substituted, whereby the charging time $t_W$ of the capacitor included in the DOSRAM was calculated.

The relation between an operation frequency f of the DOSRAM and the charging time $t_W$ can be represented by Formula (4).

[Formula 4]

$$f = \frac{A}{t_W} \quad (4)$$

In Formula (4), A is a coefficient. In the DOSRAM, the time required for writing within the time of one operation is assumed to be 40%; hence, in this example, the operation frequency f was calculated with a coefficient A of 0.4.

Figure 26:
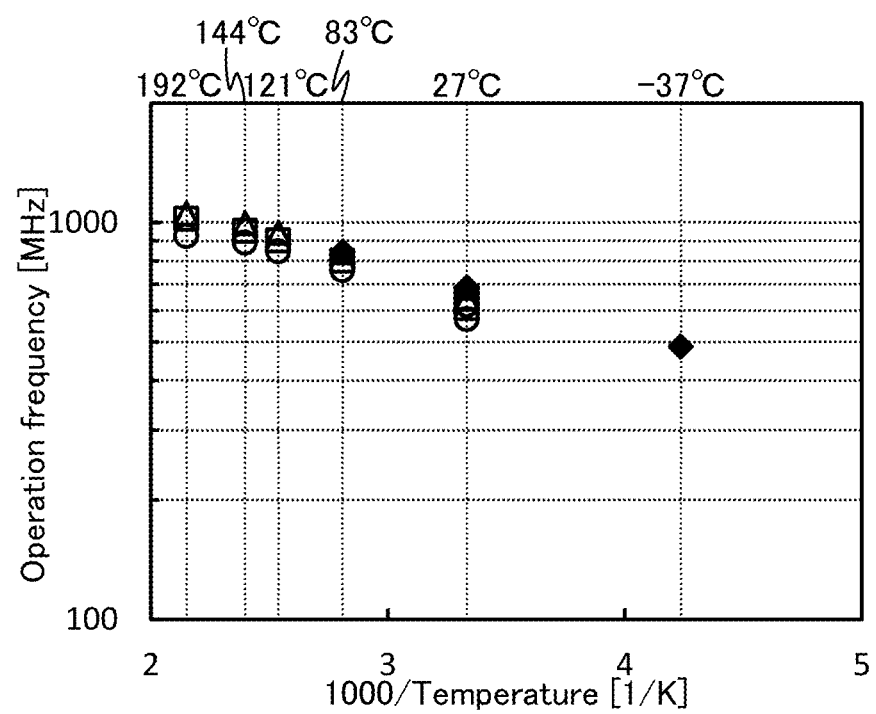
FIG. 26 A diagram showing calculation results of operating frequency.

FIG. 26 shows the operation frequency of the DOSRAM including Sample 1 when the power supply voltage was 3.3 V and the backgate voltage was −7.1 V. In FIG. 26, the horizontal axis represents the inverse of temperature [$K^{-1}$] (denoted by "1000/Temperature [1/K]" in FIG. 26), and the vertical axis represents the operation frequency [MHz]. As shown in FIG. 26, it was confirmed that as the temperature becomes higher, the operation frequency becomes higher. As shown in FIG. 26, the operation frequency at 192° C. was calculated to be 1053 MHz.

From the above, it was found that with the use of a metal oxide in the channel formation region of the transistor included in the DOSRAM, as the temperature becomes higher, the operation frequency of the DOSRAM becomes higher.

At least part of the structure, the method, and the like described in this example can be implemented in appropriate combination with other embodiments described in this specification.

Example 2

In recent years, with the significant development of AI (Deep Learning) and improvement in processing capability of a processor, the increase in capacity of an arithmetic memory and the lower power consumption have been required. For the DOSRAM, the power supply of 3.3 V has been used so far in order to obtain a sufficient off state and on state of a cell transistor.

With the use of actual measured data of a DOSRAM with a memory capacity of 64 kb fabricated using a process obtained by a combination of a 65 nm CAAC-IGZO FET (a transistor containing an In—Ga—Zn oxide having a CAAC structure in a semiconductor layer) and a 60 nm Si CMOS, a reduction in power supply voltage by optimization of a word line potential and a backgate potential was considered.

Figure 27A:
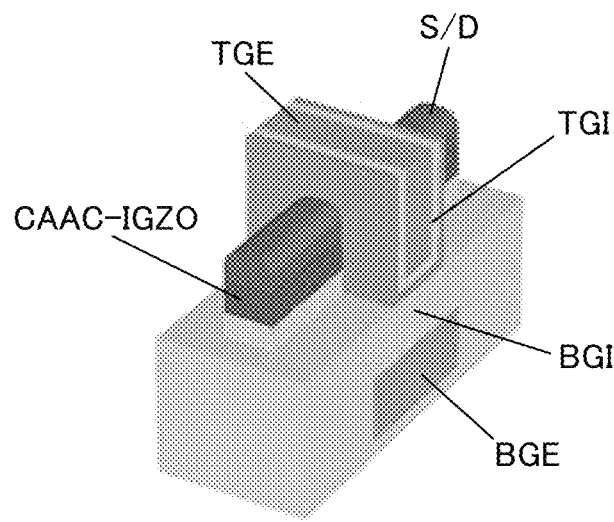
FIG. 27 (A) A perspective view illustrating a transistor structure, and (B) a diagram showing backgate voltage dependence of Id-Vg characteristics.

FIG. 27(A) is a perspective view illustrating a device structure of the CAAC-IGZO FET included in a memory cell. The transistor has a structure similar to that of the transistor 500 described in the above embodiment. Thus, the transistor includes a top gate electrode (TGE), a gate insulating layer on the top gate electrode side (TGI), a back gate electrode (BGE), a gate insulating layer on the back gate electrode side (BGI), and the like. The transistor has an s-channel structure.

Figure 27B:
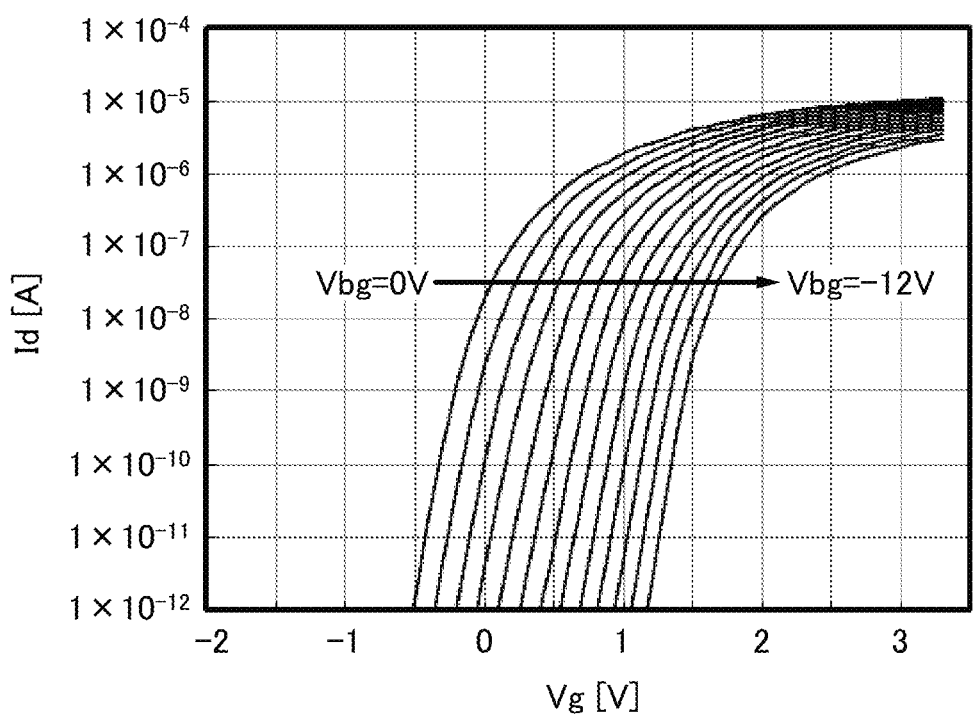
Figure 28A:
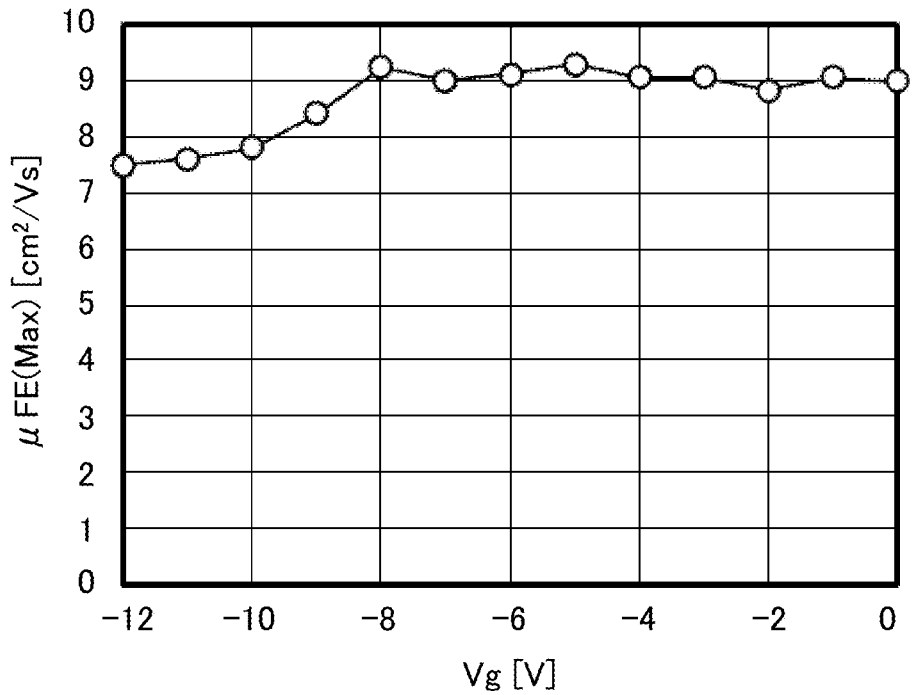
FIG. 28 (A) A diagram showing backgate voltage Vbg dependence of the field-effect mobility μFE, and (B) a diagram showing backgate voltage Vbg dependence of the threshold voltage Vth.
Figure 28B:
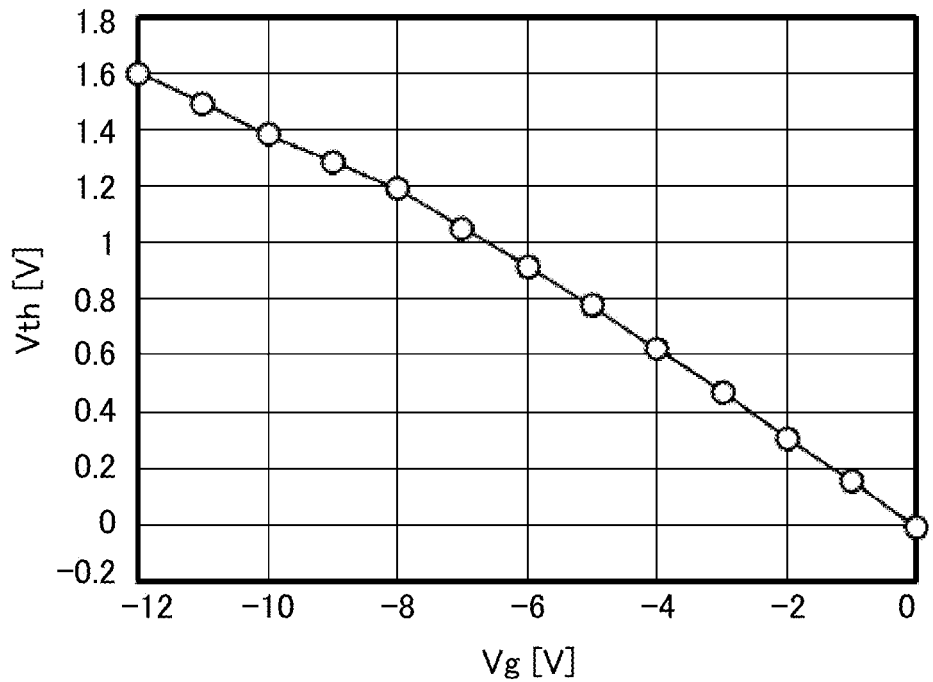

FIG. 27(B) shows actual measured results of the Id-Vg characteristics when the backgate voltage Vbg of the CAAC-IGZO FET was changed from 0 V to −18 V in steps of 2 V. FIG. 28(A) shows the backgate voltage Vbg dependence of the field-effect mobility μFE. FIG. 28(B) shows the backgate voltage Vbg dependence of the threshold voltage Vth.

According to FIG. 27(A), FIG. 27(B), FIG. 28(A), and FIG. 28(B), it is found that in the Si FET, the threshold voltage is controlled by channel doping, whereas in the CAAC-IGZO FET, the threshold voltage Vth can be controlled in a wide range by the backgate voltage Vbg. In contrast, the backgate voltage Vbg is excessively shifted in the negative direction, leading to a decrease in the field-effect mobility. It is found from FIG. 28(A) that when Vbg is lower than −8 V, a decrease in the field-effect mobility μFE becomes large.

Figure 29:
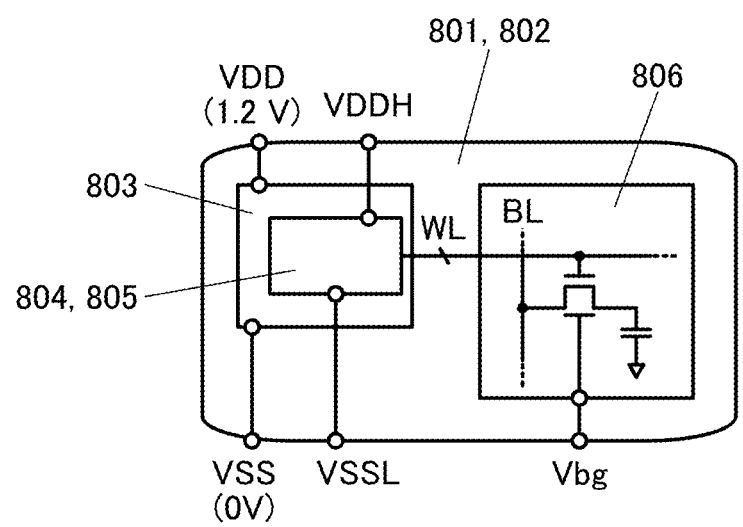
FIG. 29 A block diagram of a 64 kb DOSRAM.

FIG. 29 shows a block diagram of the fabricated 64 kb DOSRAM. The fabricated 64 kb DOSRAM includes a memory cell array 801 and peripheral circuits 802. The peripheral circuits 802 such as a word line driver circuit 803 and a bit line driver circuit are driven at 1.2 V. The word line driver circuit 803 includes a level shifter 804 and a buffer 805. As a low-potential-side power source of each of the two circuits, a negative potential (VSSL) generated in a negative potential generation circuit 811 for a top gate that is to be described later is used. The word line WL is connected to an output of the buffer. A back gate of a CAAC-IGZO FET included in a memory cell 806 forming the memory cell array 801 is connected to an output of a negative potential generation circuit 821 for a back gate that is to be described later, and is supplied with a negative potential (Vbg) supplied by the generation circuit.

The fresh frequency of the memory cell mainly depends on leakage current of a cell transistor. Although the drain current Id in an non-selection state needs to be lower than or equal to 200 zA/FET (z is a prefix of $10^{-21}$) at 85° C., which is very low, in order that the refresh is made to be performed one time per hour, in the case where the drain current Id when Vg is 0 V is set to lower than or equal to 200 zA by adjustment of the backgate voltage Vbg, Vbg needs to be set to lower than or equal to −7 V.

In order to reduce the power supply voltage, composite optimization of a word line potential (top gate potential) and a backgate potential was considered. Three kinds of operation conditions will be described among operation conditions used in the consideration of the optimization of the word line potential and the backgate potential. A first condition is Driving condition A in which a high-potential-side voltage VDDH is set to 3.3 V, the low-potential-side voltage VSSL is set to 0 V, and the backgate voltage Vbg is set to −7 V among voltages supplied as the top gate voltage Vtg (corresponding to a voltage supplied to the word line WL). A second condition is Driving condition B in which the high-potential-side voltage VDDH is set to 2.5 V, the low-potential-side voltage VSSL is set to −0.8 V, and the backgate voltage Vbg is set to −3 V. A third condition is Driving condition C in which the high-potential-side voltage VDDH is set to 1.8 V, the low-potential-side voltage VSSL is set to −1.5 V, and the backgate voltage Vbg is set to 0 V. To obtain the operation frequency of approximately 100 MHz, the on-state current of at least several microamperes is necessary. Therefore, in this consideration, the potential difference between the word lines (VDDH-VSSL) was fixed to 3.3 V.

FIG. 30(A) shows the Id-Vg characteristics of the CAAC-IGZO FET that was driven under Driving condition A, Driving condition B, and Driving condition C. FIG. 30(B) and FIG. 30(C) are diagrams showing operation voltages under Driving condition A, Driving condition B, and Driving condition C.

In the case where data written to the memory cell is retained, the drain current Id needs to be sufficiently reduced. In the case where data is written to the memory cell, the drain current Id needs to be increased to increase the writing speed. The EOT of the gate insulating layer on the back gate electrode side (BGI) is approximately five times as large as the EOT of the gate insulating layer on the top gate electrode side (TGI). Therefore, under Driving condition A, the backgate voltage Vbg needs to set to −7 V in order to achieve the drain current of 1 zA, which is extremely low.

In contrast, under Driving condition B, a negative voltage is applied not only to the back gate electrode but also to the top gate electrode. Under Driving condition B, the backgate voltage Vbg is −3 V, and therefore, the amount of change in the threshold voltage Vth is smaller than that under Driving condition A; however, a negative potential is supplied to the top gate electrode as VSSL, whereby the drain current of the CAAC-IGZO FET can be sufficiently reduced. Furthermore, under Driving condition C, the backgate voltage Vbg can be set to 0 V.

A negative potential is supplied to the top gate electrode as the low-potential-side voltage VSSL, whereby the absolute value of the backgate voltage Vbg can be made small. Consequently, the memory device can have higher reliability.

Figure 31:
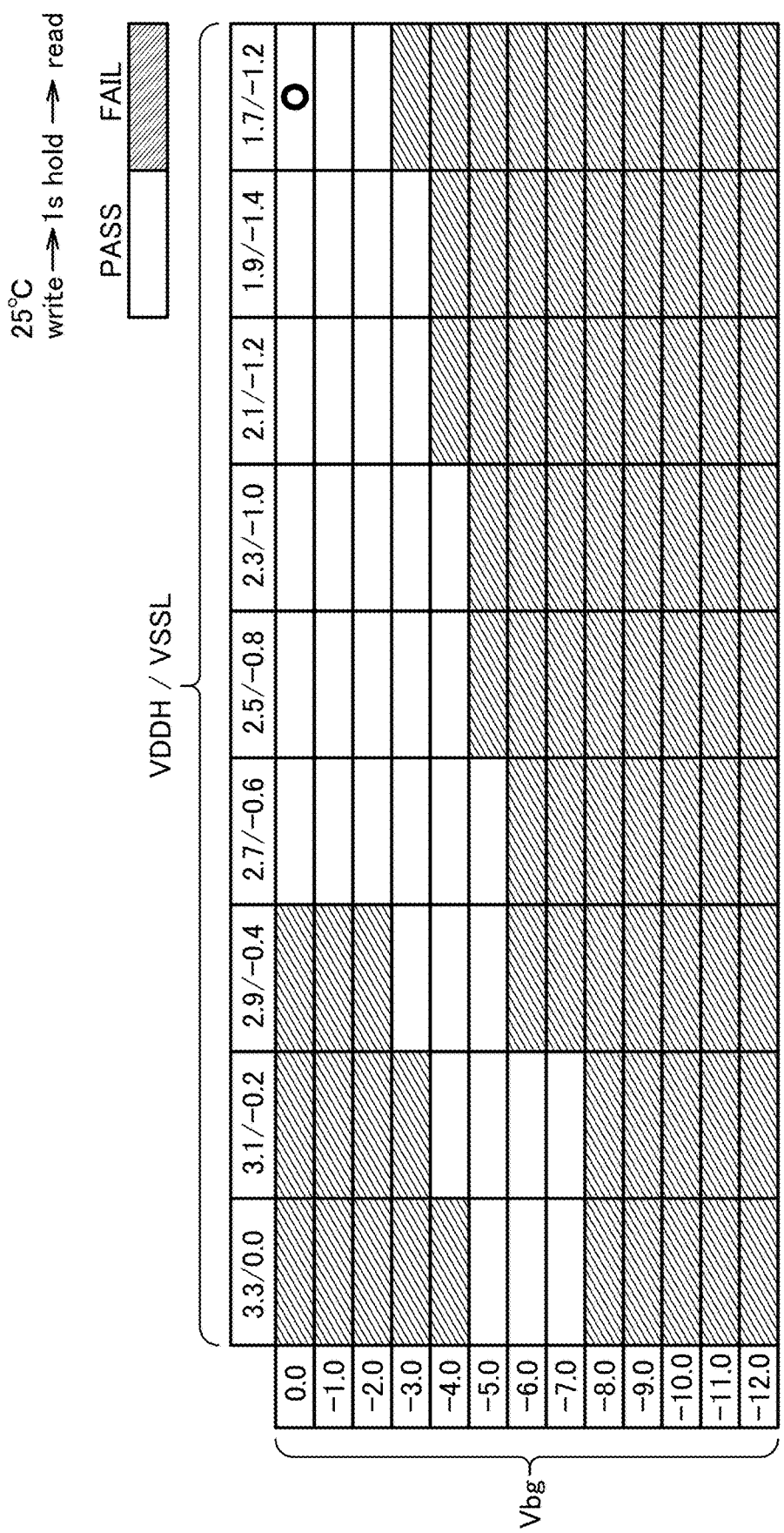
FIG. 31 A diagram showing evaluation results of a data retention state of a DOSRAM.
Figure 37:
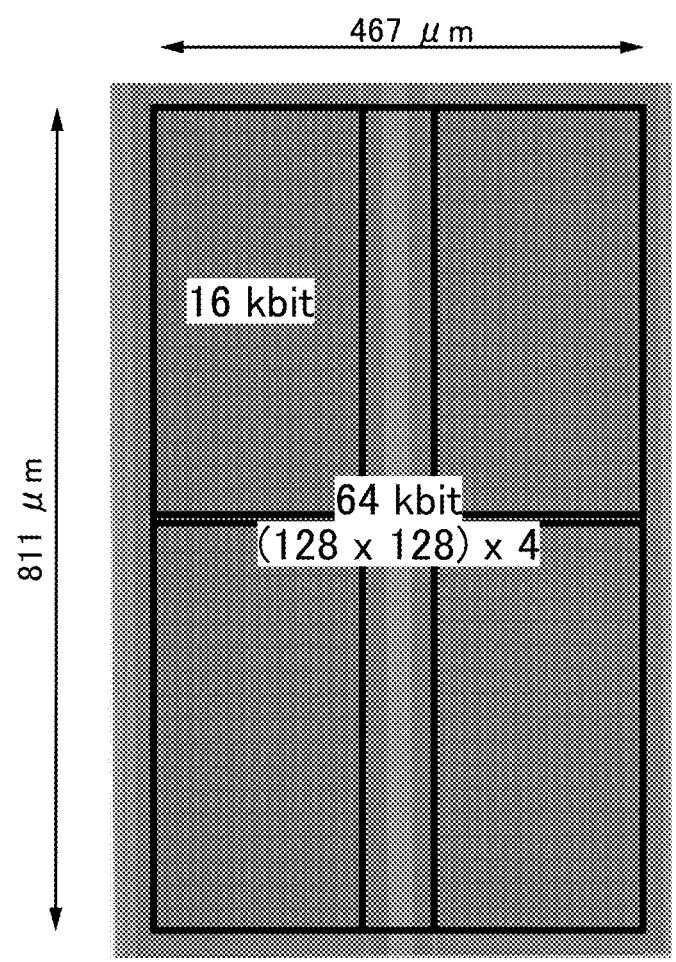
FIG. 37 A photograph of a chip of a fabricated DOSRAM.

FIG. 31 shows VDDH, VSSL, and Vbg of the DOSRAM fabricated using the process obtained by a combination of the 65 nm CAAC-IGZO FET and the 60 nm Si CMOS, and evaluation results of the data retention state. FIG. 37 is a photograph of a chip of the fabricated DOSRAM. The evaluation was performed on a plurality of kinds of combinations of VDDH, VSSL, and Vbg in the following: the environment temperature was 25° C. and the potential difference between VDDH and VSSL was 3.3 V.

Specifically, data was written to the whole memory cell array of the 64 kb DOSRAM, and after retention for one second, the data was read (denoted by "write→is hold→read" in FIG. 31), and whether or not the written data was able to be retained correctly (Pass or Fail) was determined. Note that the writing time (time for charge to the memory cell capacitance) was 200 ns, and the reading time was 150 ns.

Before the evaluation, an error bit under conditions where VDDH=1.7 V, VSSL=−1.2 V, and Vbg=0 V was removed as an initial failure (denoted by "Initial FAILs are removed assuming o region has no error bits." in FIG. 31). Under the conditions, an error bit is likely to be generated. Thus, the error is considered to be derived from a manufacturing process of the DOSRAM.

Figures 32A, 32B:
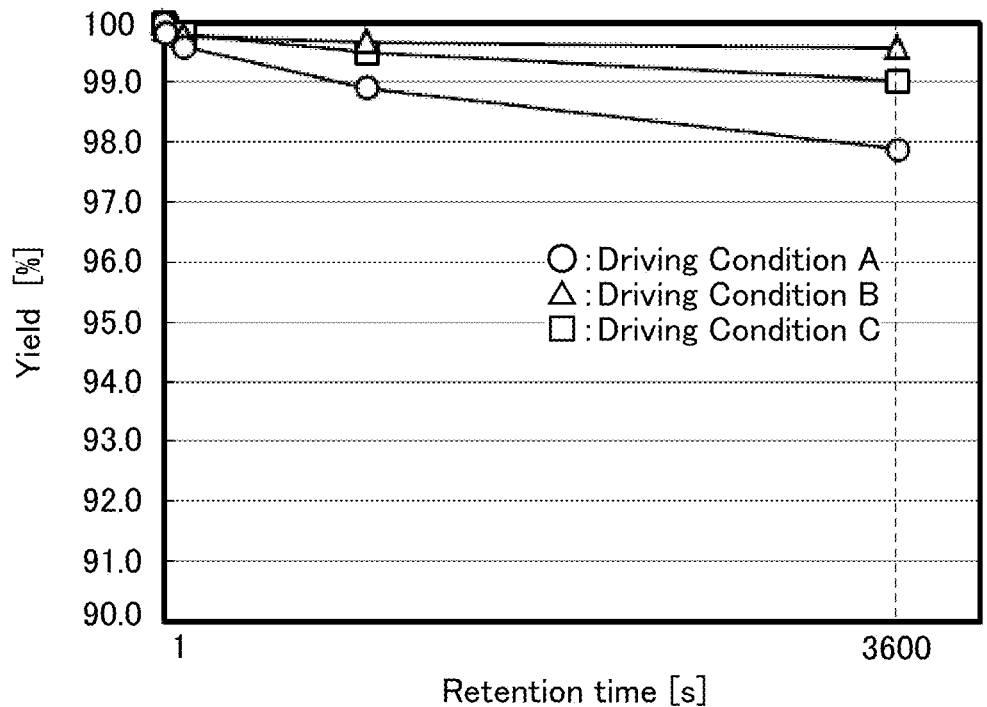
FIG. 32 (A), (B) Evaluation results of the retention time at an environment temperature of 85° C. and yields.

FIGS. 32(A) and 32(B) show evaluation results of retention time at an environment temperature of 85° C. (denoted by "data retention at 85° C." and "write→hold→read" in FIG. 32) and yields. The evaluation was performed as follows: VDDH=1.8 V, VSSL=−1.5 V, and Vbg=0 V. The yield at each retention time was calculated assuming that the yield when the retention time was one second was 100%. It is found from FIG. 31 that even in the case where the retention time is one hour, a high yield can be achieved.

According to FIG. 31 and FIGS. 32(A) and 32(B), by adjustment of Vbg, normal operation and the retention characteristics at 85° C. for one hour are obtained under each of the conditions including Driving condition B (Vbg=−3 V) and Driving condition C (Vbg=0 V). Furthermore, it was demonstrated that the power supply voltage was able to be reduced from 3.3 V to 1.8 V in terms of the operation and retention performance. In that case, Vbg can be changed from −7 V to 0 V. Accordingly, a load on the cell transistor or the Vbg generation circuit is reduced, which is advantageous in reliability.

The influence of a difference in the above operation voltage was estimated on the assumption of a 1 Mb DOSRAM having a cell area of 3.696 um$^2$ (a minimum array was 128×128). In Driving Condition A, due to a large absolute value of the voltage, i.e., Vbg of −7 V, a transistor with high withstand voltage is necessary; therefore, here, Driving condition B and Driving condition C are compared.

Figure 33A:
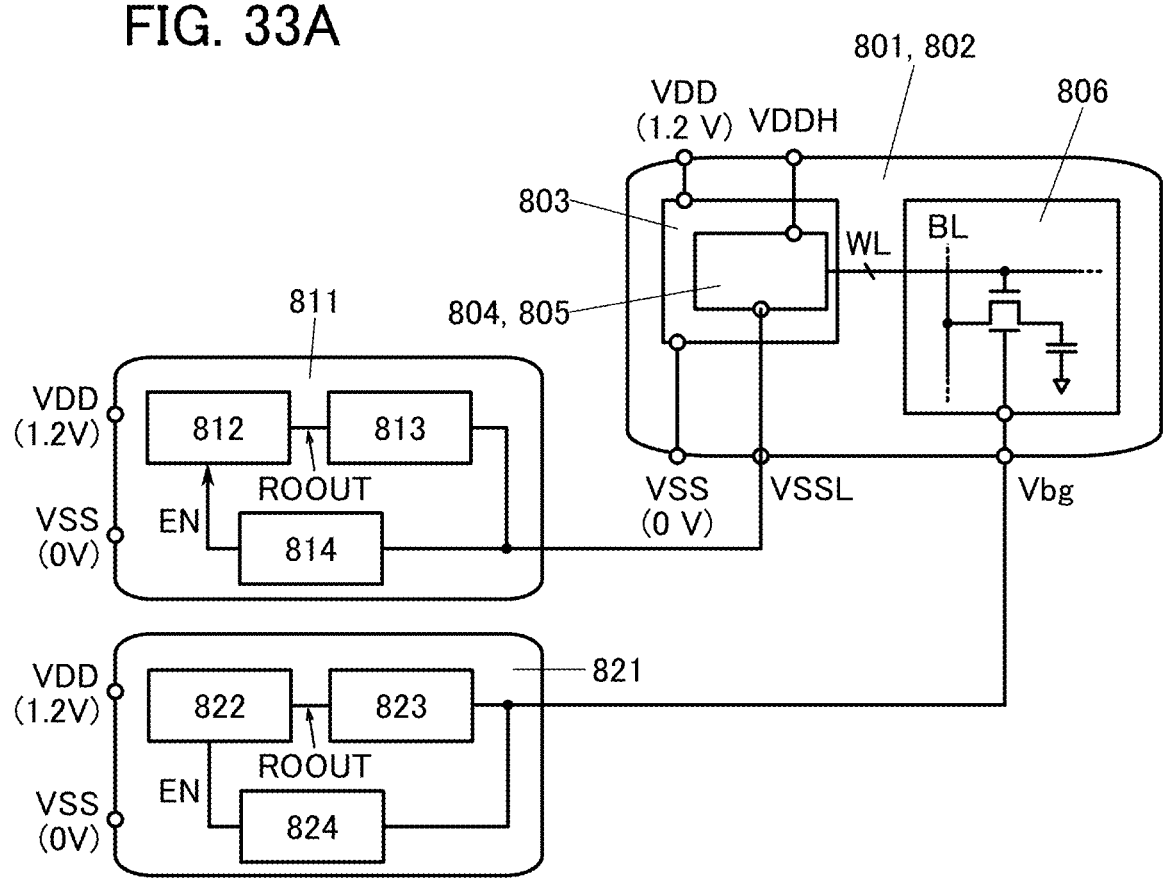
FIG. 33 (A) A block diagram of a negative potential generation circuit, and (B) a diagram showing an operation waveform of the negative potential generation circuit.

FIG. 33(A) shows a block diagram of the negative potential generation circuit (the negative potential generation circuit 811 and/or the negative potential generation circuit 821). The negative potential generation circuit 811 includes a ring oscillator 812, a charge pump 813, and a comparator 814. The negative potential generation circuit 811 has a function of supplying VSSL. The negative potential generation circuit 821 includes a ring oscillator 822, a charge pump 823, and a comparator 824. The negative potential generation circuit 821 has a function of supplying Vbg.

Figure 33B:
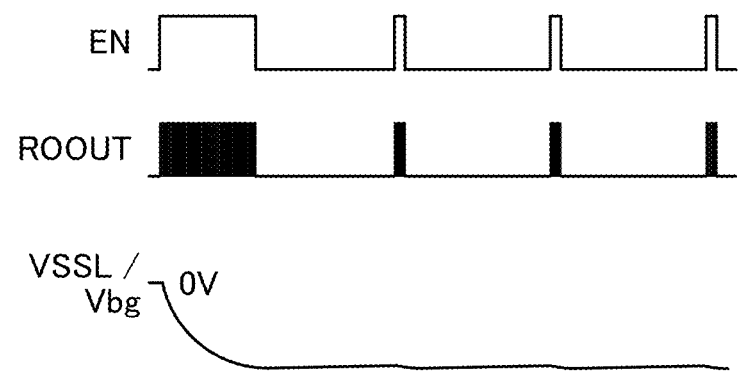

FIG. 33(B) shows operation waveforms of the negative potential generation circuit (the negative potential generation circuit 811 and/or the negative potential generation circuit 821). FIG. 34(A) shows operation verification conditions of the ring oscillator. FIG. 34(B) shows operation verification conditions of the charge pump. In the negative potential generation circuit 811, an intermittent operation of the ring oscillator 812 is controlled with an output signal EN of the comparator 814. An output ROOUT of the ring oscillator 812 is supplied to the charge pump 813. Similarly, in the negative potential generation circuit 821, an intermittent operation of the ring oscillator 822 is controlled with an output signal EN of the comparator 824. An output ROOUT of the ring oscillator 822 is supplied to the charge pump 823.

In other words, when output of the charge pump (the charge pump 813 and/or the charge pump 823) is higher than a predetermined potential, the ring oscillator (the ring oscillator 812 and/or the ring oscillator 822) and the charge pump are operated (also referred to as "Active state"), and when the output is lower than the predetermined potential, the operation is stopped (also referred to as "Sleep state").

In the negative potential generation circuit 811 that generates VSSL, the average load current at the operation (denoted by "load current" in FIG. 34(B)) is 8 uA (denoted by "8 uA (Ave.)" in FIG. 34(B)). The back gate electrode has a floating structure, and thus in the negative potential generation circuit 821 under Driving condition A, the amount of the load current is small (denoted by "less than 1 pA" in FIG. 34(B)). The number of stages of the inverters forming each of the negative potential generation circuit 811 and the negative potential generation circuit 821 (denoted by "# of INV.s" in FIG. 34(A)) is five, and the number of stages of the charge pumps (denoted by "# of stages" in FIG. 34(B)) is six, the minimum output voltage (denoted by "minimum output vol." in FIG. 34(B)) is approximately −5 V (denoted by "approx. −5 V" in FIG. 34(B)).

Figure 35A:
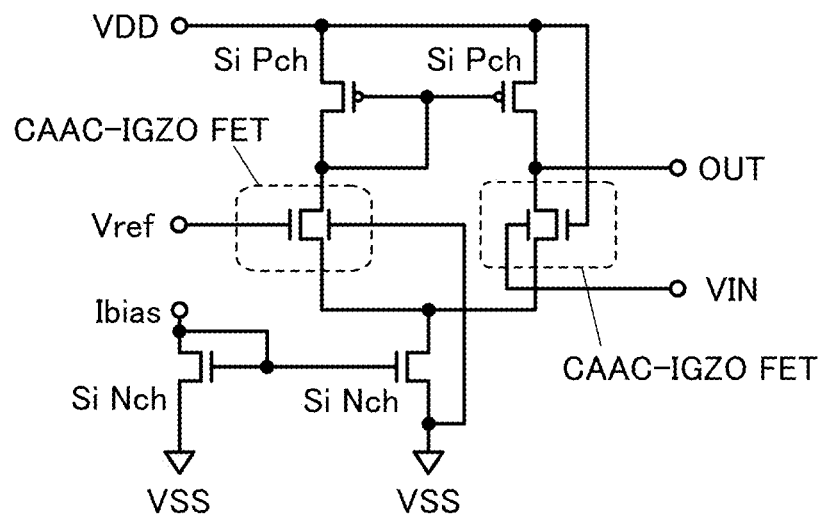
FIG. 35 (A) A circuit diagram of a comparator, and (B) a diagram showing an operation waveform of the comparator.
Figure 35B:
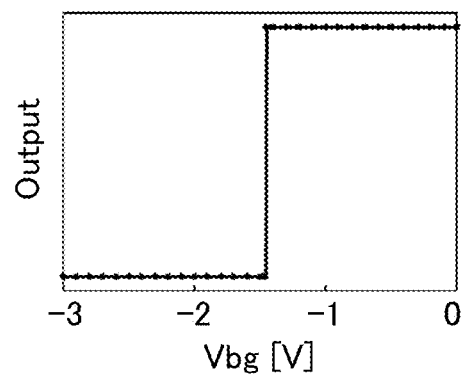

FIG. 35(A) is a circuit diagram of the comparator (the comparator 814 and/or the comparator 824). FIG. 35(B) shows an operation waveform of the comparator. In FIG. 35(A), a structure was employed in which a CAAC-IGZO FET was used as a differential pair for comparison, and a negative potential VIN (VSSL or Vbg) to be compared was applied to the back gate and Vref was applied to the top gate. Although comparison needs to be performed after a negative potential is converted to a positive potential by partial pressure with a resistor string, for example, in the case where a Si FET is used, a negative potential is supplied to the back gate using the CAAC-IGZO FET, whereby comparison of negative potentials can be performed without an excess circuit for conversion into a positive potential or an increase in power consumption. When Vref=1.18 V, it can be determined that VIN=−1.5 V.

FIGS. 36(A) to 36(C) show estimation results of the power consumption and the occupation area of the 1 Mb (storage capacity; denoted by "Density" in FIG. 36(C)) DOSRAM by simulation. The number of memory cells per word line in the 1 Mb DOSRAM (denoted by "Memory Cells per WL" in FIG. 36(C)) is 128. FIG. 36(A) shows estimation results of the power consumption when the 1 Mb DOSRAM operates (also referred to as "operation power" or "Active Power") and the power consumption when the 1 Mb DOSRAM is in a standby state (also referred to as "standby electricity consumption" or "Standby power"). When Driving condition C of a 1.8 V power source is employed, the standby power was reduced by approximately 50% to be 120.2 nW, as compared to when Driving condition B of 2.5 V is employed.

FIG. 36(B) shows estimation results of the power consumption and the operation time of the negative potential generation circuit 811 under Driving condition B. According to FIG. 36(B), the operation time for generating a negative potential (also referred to as "Active Time") is 2.48 μsec, and Sleep time is 28.4 seconds. That is, the generation operation of a negative potential (VSSL=−1.5 V) is performed once in 28.4 seconds, and the influence on the standby power can be substantially ignored (see Average Power in FIG. 36(B)).

In the 1 Mb DOSRAM, a storage portion (also referred to as "Memory") including the memory cell array and the like, and all circuits except the negative potential generation circuit (also referred to as "Neg. Bias") can be turned off (lower than or equal to 1 nW) (Moreover, the storage portion and the negative potential generation circuit are collectively denoted by "Total" in FIG. 36(A)). Accordingly, as for the power consumption of the 1 Mb DOSRAM, the power consumption of the negative potential generation circuit in the sleep state (also referred to as "Sleep Power") occupies approximately 100%.

Note that in the negative potential generation circuit 811, the power consumption under Driving condition C (VSSL=−1.5 V) becomes larger than that under Driving condition B (VSSL=−0.8 V). However, the operation power of the negative potential generation circuit under Driving condition C, i.e., 132 μW (see FIG. 36(A)), is as small as 2.68% of the power consumption of the 1 Mb DOSRAM in operation at 100 MHz, i.e., 4.83 mW.

FIG. 36(C) shows estimation results of the occupation area of the storage portion including the memory cell array (also referred to as "Area A") and the occupation area of the negative potential generation circuit (also referred to as "Area B"). The occupation area of the 1 Mb DOSRAM was estimated on the assumption of the case where 128 memory cells were connected to one word line WL. As shown in FIG. 36(C), the occupation area of the negative potential generation circuit is as small as 0.209% in the ratio to the occupation area of the 1 Mb DOSRAM (denoted by "ratio A/(A+B)" in FIG. 36).

The DOSRAM of a 1.8 V power source is a low-power-consumption embedded memory suitable for IoT or AI edge computing.

REFERENCE NUMERALS

C21: capacitor, C22: capacitor, C24: capacitor, M11: transistor, M12: transistor, M13: transistor, M14: transistor, M15: transistor, M16: transistor, M21: transistor, M24: transistor, M31: transistor, M34: transistor, N11: node, N12: node, N13: node, N14: node, S1: oxide, Tr21: transistor, Tr22: transistor, Tr23: transistor, Tr31: transistor, Tr32: transistor, Tr33: transistor, Tr34: transistor, Tr41: transistor, Tr42: transistor, 13: transistor, 14: transistor, 15: transistor, 16: transistor, 17: transistor, 18: transistor, 19: transistor, 20: transistor, 21: transistor, 33: transistor, 34: transistor, 35: transistor, 36: transistor, 37: transistor, 38: transistor, 39: transistor, 40: transistor, 41: transistor, 54: circuit, 55: circuit

The invention claimed is:

1. A memory device comprising:
a driver circuit; and
a plurality of memory cells,
wherein each memory cell comprises a transistor and a capacitor,
wherein one of a source and a drain of the transistor is electrically connected to one electrode of the capacitor,
wherein the transistor comprises a metal oxide in a channel formation region,
wherein the transistor comprises a first gate and a second gate,
wherein the first gate and the second gate have a region where they overlap each other with the channel formation region therebetween,
wherein the driver circuit has a function of driving the first gate,
wherein in a period during which the memory cell retains data, the driver circuit outputs a first potential lower than a potential applied to the source and the drain of the transistor, to the first gate, and
wherein a second potential lower than the potential applied to the source and the drain of the transistor is applied to the second gate.

2. The memory device according to claim 1,
wherein the second potential is lower than the first potential.

3. A memory device comprising:
a driver circuit; and
a plurality of memory cells,
wherein each memory cell comprises a transistor and a capacitor, wherein one of a source and a drain of the transistor is electrically connected to one electrode of the capacitor, wherein the transistor comprises a metal oxide in a channel formation region, wherein the transistor comprises a first gate and a second gate, wherein the first gate and the second gate have a region where they overlap each other with the channel formation region therebetween, wherein the driver circuit has a function of driving the first gate and the second gate, wherein in a period during which the memory cell retains data, the driver circuit outputs a first potential lower than a potential applied to the source and the drain of the transistor, to the first gate, and wherein in the period during which the memory cell retains data, the driver circuit outputs a second potential lower than the potential applied to the source and the drain of the transistor, to the second gate.

4. The memory device according to claim 1,
wherein the metal oxide contains at least one or both of In (indium) and Zn (zinc).

5. The memory device according to claim 1,
wherein the metal oxide contains Ga (gallium).

6. An electronic device comprising the memory device according to claim 1.

7. A method for driving a semiconductor device,
wherein the semiconductor device comprises a driver circuit and a memory cell,
wherein the memory cell comprises a transistor and a capacitor,
wherein one of a source and a drain of the transistor is electrically connected to one electrode of the capacitor,
wherein the transistor comprises a first gate and a second gate that overlap each other with a channel formation region therebetween,
wherein the driving method comprises:
a first step of applying a first potential to the first gate and applying a second potential to the other of the source and the drain of the transistor; and
a second step of applying a third potential to the first gate,
wherein the third potential is lower than a potential of the source and the drain of the transistor, and
wherein a fourth potential lower than the potential of the source and the drain of the transistor is applied to the second gate through the first and second steps.

8. The memory device according to claim 2,
wherein the metal oxide contains at least one or both of In (indium) and Zn (zinc).

9. The memory device according to claim 2,
wherein the metal oxide contains Ga (gallium).

10. An electronic device comprising the memory device according to claim 2.

11. The memory device according to claim 3,
wherein the metal oxide contains at least one or both of In (indium) and Zn (zinc).

12. The memory device according to claim 3,
wherein the metal oxide contains Ga (gallium).

13. An electronic device comprising the memory device according to claim 3.

* * * * *